(12) United States Patent
Nakashima et al.

(10) Patent No.: US 8,551,676 B2
(45) Date of Patent: Oct. 8, 2013

(54) PIGMENT-DISPERSED COMPOSITION, CURABLE COMPOSITION, AND COLOR FILTER AND PRODUCTION METHOD THEREOF

(75) Inventors: Taeko Nakashima, Ashigarakami-gun (JP); Kazuto Shimada, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 700 days.

(21) Appl. No.: 12/593,894

(22) PCT Filed: Mar. 28, 2008

(86) PCT No.: PCT/JP2008/056734
§ 371 (c)(1),
(2), (4) Date: Sep. 29, 2009

(87) PCT Pub. No.: WO2008/123601
PCT Pub. Date: Oct. 16, 2008

(65) Prior Publication Data
US 2010/0119959 A1    May 13, 2010

(30) Foreign Application Priority Data
Mar. 30, 2007    (JP) .................................. 2007-092042

(51) Int. Cl.
*G02B 5/20*    (2006.01)

(52) U.S. Cl.
USPC .......................................... 430/7; 430/287.1

(58) Field of Classification Search
None
See application file for complete search history.

(56) References Cited

U.S. PATENT DOCUMENTS

| | | | |
|---|---|---|---|
| 3,536,510 A | 10/1970 | Allen et al. | |
| 3,778,287 A | 12/1973 | Stansfield et al. | |
| 6,306,559 B1 | 10/2001 | Tanamura et al. | |
| 2001/0018164 A1* | 8/2001 | Furukawa | 430/287.1 |
| 2005/0053866 A1* | 3/2005 | Matsumura | 430/300 |
| 2006/0166114 A1* | 7/2006 | Lee | 430/7 |
| 2008/0182030 A1* | 7/2008 | Oyanagi et al. | 427/511 |

FOREIGN PATENT DOCUMENTS

| | | |
|---|---|---|
| EP | 0 539 606 A1 | 5/1993 |
| EP | 0 723 167 A2 | 7/1996 |
| EP | 0 780 731 A2 | 6/1997 |
| EP | 1 571 469 A1 | 9/2005 |
| JP | 54-034009 B2 | 10/1979 |
| JP | 05-072943 B2 | 11/1986 |
| JP | 02-245231 A | 10/1990 |
| JP | 08-048890 A | 2/1996 |
| JP | 08-259876 A | 10/1996 |
| JP | 2000-321763 A | 11/2000 |
| JP | 2003-029018 A | 1/2003 |
| JP | 2004-287365 A | 10/2004 |
| JP | 2005-010763 * | 1/2005 |
| JP | 2005-240000 A * | 9/2005 |
| JP | 2006-064952 A | 3/2006 |
| WO | 2008/081996 A2 | 7/2008 |

OTHER PUBLICATIONS

Computer-generated translation of JP 2005-240000 (Sep. 2005).*
Ueki Ozeki, et al., "A color filter for 10.4-inch TFT-LCD of 512-color display"; $7^{th}$ Color Optics Conference, 1990.
"Color filter the newest technology trend", published by Johokiko Co., Ltd., pp. 85-87.
"Advanced Technologies for LCD Color Filters", published by CMC Publishing Co., Ltd. (2006), pp. 129-150.
Hays B G, "Surface Treatment of Organic Pigments for Printing Ink Applications", American Inkmaker, MacNair-Dorland, New York, NY, US, Jun. 1, 1984, pp. 28-50, vol. 62, No. 6.
A. Gothlich et al., "Funktionale Polymere Im Alltag", Chemical Unserer Zeit, 2005, pp. 262-273, vol. 39.
Office Action dated Jul. 3, 2012 in Chinese Application No. 200880010858.9.
Office Action dated Oct. 16, 2012 in Japanese Application No. JP 2007-092042.
Office Action dated May 2, 2013 in Taiwan Application No. 097111264.

* cited by examiner

*Primary Examiner* — John A. McPherson
(74) *Attorney, Agent, or Firm* — Sughrue Mion, PLLC

(57) ABSTRACT

There are provided a pigment-dispersed composition comprising at least a resin having a pendant group containing a nitrogen-containing heterocyclic ring and an ethylenic unsaturated double bond in the main chain skeleton, a pigment, and a solvent, and a curable composition using this, a color filter having a colored pattern formed from the curable composition, and a production method thereof.

10 Claims, No Drawings

PIGMENT-DISPERSED COMPOSITION, CURABLE COMPOSITION, AND COLOR FILTER AND PRODUCTION METHOD THEREOF

TECHNICAL FIELD

The present invention relates to a pigment-dispersed composition which may be used for constructing imaging materials such as color filters or color proofs, or photocurable materials such as inks or coating materials; a curable composition which is suitable for the formation of colored regions such as color filters that are used in liquid crystal display elements (LCD), solid state image pick-up elements (CCD, CMOS, etc.) or the like; a color filter employing the curable composition; and production methods thereof.

BACKGROUND ART

Pigments have been conventionally used in a wide variety of applications, as they exhibit vivid color tones and high tinctorial strength. Among these pigments, those presenting practical importance in general are frequently of minute particles, and thus vivid color tones and high tinctorial strength are obtained by preventing the aggregation of the pigment particles and micronizing the particles. However, further micronization of the pigment results in an increase in the surface area, whereby particle aggregation is promoted, and thus many of such dispersions of pigment exhibit high viscosities. For this reason, when these pigment dispersions are prepared in an industrial scale, there occur problems such as that removal of the pigment dispersion from a dispersing machine becomes difficult, transportation through pipelines is not possible, or the pigment dispersion gelates during storage to become unusable.

Thus, it has been known hitherto that various dispersants are used to obtain pigment dispersions or colored photosensitive compositions having excellent fluidity, dispersibility and the like. These dispersants are roughly classified into polymeric dispersants and low molecular weight compound dispersants.

Examples of the polymeric dispersants include polyacrylic acid salts, sodium maleate olefin copolymers, terminal carboxyl group-containing polyesters (see, for example, Japanese Patent Application Publication (JP-B) No. 54-34009), polyesters having an acid group and/or a basic group, prepared from tetrakis(2-hydroxyalkyl)ethylenediamine as a starting material (see, for example, Japanese Patent Application Laid-Open (JP-A) No. 2-245231), macromonomers (oligomers having an ethylenic unsaturated group at the terminal), monomers having a hydroxyl group, copolymers including a carboxyl group-containing monomer and four species of monomers other than the carboxyl group-containing monomer (see, for example, JP-A No. 8-259876), and the like.

As for the low molecular weight compound dispersants, sorbitan fatty acid esters, polyoxyethylene alkylamines, alkyldiamines, alkanolamine derivatives and the like are known (see, for example, U.S. Pat. No. 3,536,510), and there are also exemplary dispersants having pigment nuclei introduced thereinto (see, for example, JP-B No. 5-72943, and JP-A No. 8-48890).

Meanwhile, a colored photosensitive composition containing a pigment is useful as a material for color filters used in solid state image pick-up elements, liquid crystal displays and the like, and in the case of producing a color filter using the colored photosensitive composition, a pigment dispersion process which is excellent in terms of quality, production stability or the like, is being widely employed.

Inter alia, when a color filter employing a pigment is used as a color filter for liquid crystal displays, it is required that the particle size of the colorant used (organic pigments, etc.) be finer (see, for example, JP-A No. 2000-321763). This is due to the fact that light scattering, birefringence and the like caused by the pigment result in the rotation of the polarization axis. If micronization of the pigment is insufficiently carried out, light scattering and absorption by the pigment bring forth a decrease in the light transmittance, thereby the display contrast being lowered, and the curing sensitivity at the time of patterning by exposure is decreased (see, for example, a color filter for 512-color display for 10.4-inch size TFT-LCD; Ueki, Ozeki, Fukunaga and Yamanaka, the 7$^{th}$ Color Optical Conference, 1990). For this reason, it is required for a colored photosensitive composition containing a dispersed pigment, that the pigment is dispersed in a micronized state.

As the pigment is micronized as described above, the surface area of the pigment is increased, and thus there is a tendency that the use of micronized pigment leads to an increase in the amount of dispersant to be added, which is needed to disperse the pigment in a curable composition. Furthermore, in a curable composition for the color filter application, the content of colorant (organic pigment) occupying among the solids is required to be higher for an improvement of color purity. However, if a dispersant or colorant is incorporated into a curable composition at a high concentration, the contents of photopolymerization initiator and photopolymerizable monomer occupying in the curable composition are relatively decreased. Thus, low energy curability is desired for an improvement in the yield rate through shortening of the exposure time for a curable composition, and on the other hand, there is a problem that it is difficult to obtain the curability in exposed parts.

Also for a curable composition for the use in color filters for solid state image pick-up element, low energy curing is desirable. With regard to a color filter for solid state image pick-up element, since film thickness reduction for colored patterns is in progress under the purpose of image quality improvement through high light harvesting property and high photo color separation property, the pigment concentration in the composition tends to increase along with this film thickness reduction.

Moreover, for a pigment-based color filter, color unevenness is likely to occur because the pigment consists of relatively coarse particles. Therefore, as the micronization of pigment is achieved to reduce this color unevenness, the content of pigment dispersant in the curable composition tends to increase. Accordingly, there is a problem concerning the difficulties in obtaining curability.

In order to cope with the problems such as color unevenness in a colored pattern formed, there has been suggested a technology of using an organic solvent-soluble dye as the colorant, in place of pigment (see, for example, JP-A No. 2003-029018). For such dye-based color filters, an increase in the concentration of dye is accompanied by significant problems such as a polymerization inhibitory effect originating from the dyes, or decreased stability over time as shown through dye precipitation.

As discussed above, with regard to a curable composition for the use in color filters, the contents of the photopolymerization initiator and the photopolymerizable monomer, which are necessary components for curing the curable composition, are limited, and the concentration of colorant has been increased, for both the applications in liquid crystal displays and solid state image pick-up elements. Thus, there have been problems of low sensitivity, unsatisfactory curing, insufficient adhesiveness to substrate, and the like.

In regard to these problems, a technology of improving the sensitivity by imparting polymerizability to a resin which has been introduced mainly to impart film forming property or developability, is being conventionally investigated (see, for example, JP-A Nos. 2000-321763 and 2003-029018, Non-Patent Documents "Color Filter the newest technology trend" pp. 85 to 87, published by Information Organization and "Advanced Technologies for LCD Color Filters" pp. 129 to 150, published by CMC Publishing Co., Ltd. (2006)).

However, even such resins as described above still cannot give satisfactory photosensitivity. Also, in fact, problems such as the generation of development residue in the unexposed parts, the image forming properties in the exposed parts, or a decrease in the color density (decoloration) due to the diffusion of fine pigment particles from the cured parts into the developer solution, still remain unsolved.

Furthermore, since the exposure sensitivity is insufficient, there also is a problem that curing occurs insufficiently in the deeper parts, such as the vicinity of the interface with a substrate, of a membrane prepared using a curable composition, thereby the adhesiveness to the substrate being poor, and the shape of the pattern becoming inversely tapered. Moreover, for the applications of color filters having a plurality of color patterns, there are also unresolved problems such as that when a pattern of a first color is formed, and then a coating solution for forming a pattern of a second color is applied, the pigment of the first color is diffused into the coating solution of the second color, or the color density is decreased (decolorized).

DISCLOSURE OF THE INVENTION

Problem to be Solved by the Invention

Accordingly, there is a demand for a pigment-dispersed composition having excellent microdispersibility of pigment achieved by suppressing aggregation of pigment, excellent storage stability, and high tinctorial strength.

There is also a demand for a curable composition which has high photosensitivity as well as excellent storage stability, tinctorial strength and adhesiveness to support, has the decrease in the color density (decoloration) at cured parts suppressed, and has good developability and reduced development residue, and which is capable of forming a colored pattern with a tapered or rectangular-shaped cross-section.

Furthermore, there is a demand for a color filter having excellent adhesiveness to support and having a colored pattern with a tapered or rectangular-shaped cross-section, and a method for producing a color filter with excellent productivity for the color filter.

Means to Solve the Problem

According to a first aspect of the present invention, there is provided a pigment-dispersed composition containing at least (A) a resin having a pendant group containing a nitrogen-containing heterocyclic ring and an ethylenic unsaturated double bond in the main chain skeleton, (B) a pigment, and (C) a solvent.

According to a second aspect of the invention, there is provided a curable composition including the pigment-dispersed composition of the first aspect, and (D) a photopolymerization initiator.

According to a third aspect of the invention, there is provided a color filter having a colored pattern formed from the curable composition of the second aspect, on a support.

According to a fourth aspect of the invention, there is provided a method for producing a color filter, the method comprises preparing a curable composition using a pigment-dispersed composition containing at least (A) a resin having a pendant group containing a nitrogen-containing heterocyclic ring and an ethylenic unsaturated double bond in the main chain skeleton, (B) a pigment, and (C) a solvent; applying the curable composition on a support to form a colored layer formed from the curable composition; subjecting the colored layer to patternwise exposure through a mask; and developing the exposed colored layer to form a colored pattern.

BEST MODE FOR CARRYING OUT THE INVENTION

Hereinafter, the pigment-dispersed composition, a curable composition, and a color filter of the present invention produced using the curable composition and a production method thereof will be described in detail. Additionally, herein, "to" represents a range which includes the values described before and after the numeric value as the minimum value and the maximum value, respectively.

The invention has been achieved on the basis of the following mechanism which is assumed to make use of a (A) specific compound as the dispersant of pigment. However, the following mechanism of the invention is not necessarily clear, and is assumed as follows.

Specifically, when a specific resin having a pendant group containing a nitrogen-containing heterocyclic ring and an ethylenic unsaturated double bond is added at the time of dispersing a pigment, the nitrogen-containing heterocyclic ring pendant from the resin interacts with the pigment, and thus the pigment is efficiently dispersed. Furthermore, in the case of using the pigment-dispersed composition as a curable composition, since the (A) specific resin having a pendant group containing a nitrogen-containing heterocyclic ring and an ethylenic unsaturated double bond of the invention exhibits very high sensitivity at exposed parts, because of the unsaturated double bond. Thus, a film formed from the curable composition of the invention on a substrate undergoes curing favorably even in the deep parts of the film, such as the vicinity of the interface between the film and the substrate, thereby resulting in excellent adhesiveness to support, and the shape of the pattern may be suppressed from becoming inversely tapered.

Also, at the exposed parts, since the (A) specific resin having a pendant group containing a nitrogen-containing heterocyclic ring and an ethylenic unsaturated double bond, is cured while including the pigment, by a cross-linking reaction of the unsaturated double bond moieties, the pigment is suppressed from diffusing into a developer solution or into a coating solution. Meanwhile, in the unexposed parts, since the (A) specific resin having a pendant group containing a nitrogen-containing heterocyclic ring and an ethylenic unsaturated double bond may suppress the aggregation of pigment, the developer solution infiltrates rapidly. Furthermore, since the (A) specific resin having a pendant group containing a nitrogen-containing heterocyclic ring and an ethylenic unsaturated double bond, has a nitrogen-containing heterocyclic ring with a large dipole moment, the resin has high affinity with a highly polar developer solution, and thus promotes infiltration of the developer solution. Consequently, excellent removability may be exhibited at the unexposed parts.

<Pigment-Dispersed Composition>

The pigment-dispersed composition of the invention contains at least (A) a resin having a pendant group containing a nitrogen-containing heterocyclic ring and an ethylenic unsaturated double bond in the main chain skeleton, (B) a pigment, and (C) a solvent, and if necessary, may be constructed using other components. Additionally, according to the invention, the "nitrogen-containing heterocyclic ring" has a nitrogen atom in the ring, and the ring may be a saturated ring or an unsaturated ring, may be a single ring or a fused ring, and may be unsubstituted or substituted. Hereinafter, each of the components constituting the pigment-dispersed composition of the invention will be described in detail.

(A) Resin Having a Pendant Group Containing Nitrogen-Containing Heterocyclic Ring and an Ethylenic Unsaturated Double Bond in the Main Chain Skeleton The pigment-dispersed composition of the invention contains (A) a resin having a pendant group containing a nitrogen-containing heterocyclic ring and an ethylenic unsaturated double bond in the main chain skeleton (hereinafter, may also be referred to as "specific resin"). This specific resin preferably includes a structural unit having a pendant group containing a nitrogen-containing heterocyclic ring, and a structural unit having a pendant group containing an ethylenic unsaturated double bond, as copolymer components. Hereinafter, the respective structural units will be described.

The above-described specific resin preferably includes, as a copolymer component, at least one of the structural units represented by the following formula (1), as the structural unit having a pendant group containing a nitrogen-containing heterocyclic ring (hereinafter, may also be referred to as "nitrogen-containing heterocyclic ring structural unit").

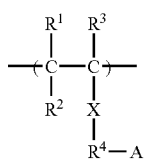

Formula (1)

In the formula (1), $R^1$ and $R^2$ each independently represent a hydrogen atom or a monovalent organic group. $R^3$ represents a hydrogen atom, a hydrocarbon group having 1 to 6 carbon atoms, —COOH, —CN, —CF$_3$, —CH$_2$OH, —CH$_2$COOH, —CH$_2$COOR$^a$ or —COOR$^b$, wherein R$^a$ and R$^b$ each independently represent a hydrocarbon group having 1 to 6 carbon atoms. X represents —O—, —CO—, —COO—, OCO—, —CONH—, —NHCO— or phenylene. $R^4$ represents a divalent organic group or a single bond. A represents a nitrogen-containing heterocyclic ring.

In the formula (1), the monovalent organic group represented by $R^1$ or $R^2$ may be a hydrocarbon group having 1 to 6 carbon atoms, and among them, a methyl group, an ethyl group and a phenyl group are preferred.

$R^3$ is preferably a hydrogen atom, a methyl group, —COOH, —CN, —CF$_3$, —CH$_2$OH, —CH$_2$COOH, —CH$_2$COOR$^a$ or —COOR$^b$, and a hydrogen atom and a methyl group are most preferred.

The divalent organic group represented by $R^4$ is preferably an alkylene group or arylene group having 2 to 60 carbon atoms, which may have, within its structure, any partial structure selected from the group consisting of an oxygen atom, a nitrogen atom, a sulfur atom, a hydrocarbon ring structure having 3 to 20 carbon atoms, a heterocyclic ring (details will be described later), an ester bond, a sulfonic acid ester bond, a phosphoric acid ester bond, a urethane bond, a thiourethane bond, an amide bond, a urea bond and a thiourea bond; more preferably a straight-chained or branched alkylene group having 1 to 40 carbon atoms, which may have, within its structure, any partial structure selected from the group consisting of an oxygen atom, a nitrogen atom, a sulfur atom, a hydrocarbon ring structure having 3 to 20 carbon atoms, an ester bond, a urethane bond, a thiourethane bond, an amide bond, a urea bond and a thiourea bond; and even more preferably a straight-chained or branched alkyl group having 1 to 40 carbon atoms, which may have, within its structure, an oxygen atom, a nitrogen atom, a hydrocarbon ring structure having 3 to 12 carbon atoms, an ester bond, a urethane bond, an amide bond and a urea bond.

The divalent organic group represented by $R^4$ may be further substituted, if introduction of substituents is possible. Examples of the substituents that may be introduced include a straight-chained, branched or cyclic alkyl group having 1 to 20 carbon atoms, a straight-chained, branched or cyclic alkenyl group having 2 to 20 carbon atoms, an alkynyl group having 2 to 20 carbon atoms, an aryl group having 6 to 20 carbon atoms, an acyloxy group having 1 to 20 carbon atoms, an alkoxycarbonyloxy group having 2 to 20 carbon atoms, an aryloxycarbonyloxy group having 7 to 20 carbon atoms, a carbamoyloxy group having 1 to 20 carbon atoms, a carbonamide group having 1 to 20 carbon atoms, a sulfonamide group having 1 to 20 carbon atoms, a carbamoyl group having 1 to 20 carbon atoms, a sulfamoyl group having 0 to 20 carbon atoms, an alkoxy group having 1 to 20 carbon atoms, an aryloxy group having 6 to 20 carbon atoms, an aryloxycarbonyl group having 7 to 20 carbon atoms, an alkoxycarbonyl group having 2 to 20 carbon atoms, an N-acylsulfamoyl group having 1 to 20 carbon atoms, an N-sulfamoylcarbamoyl group having 1 to 20 carbon atoms, an alkylsulfonyl group having 1 to 20 carbon atoms, an arylsulfonyl group having 6 to 20 carbon atoms, an alkoxycarbonylamino group having 2 to 20 carbon atoms, an aryloxycarbonylamino group having 7 to 20 carbon atoms, an amino group having 0 to 20 carbon atoms, an imino group having 1 to 20 carbon atoms, an ammonio group having 3 to 20 carbon atoms, a heterocyclic group, a hydroxyl group, a mercapto group, an alkylsulfinyl group having 1 to 20 carbon atoms, an arylsulfinyl group having 6 to 20 carbon atoms, an alkylthio group having 1 to 20 carbon atoms, an arylthio group having 6 to 20 carbon atoms, a ureido group having 1 to 20 carbon atoms, a heterocyclic group having 2 to 20 carbon atoms, an acyl group having 1 to 20 carbon atoms, a sulfamoylamino group having 0 to 2 carbon atoms, a silyl group having 2 to 20 carbon atoms, an isocyanate group, an isocyanide group, a halogen atom (for example, a fluorine atom, a chlorine atom, a bromine atom, etc.), a cyano group, a nitro group, an onium group, and the like.

Among these substituents that may be introduced, a straight-chained, branched or cyclic alkyl group having 1 to 10 carbon atoms is preferred from the viewpoint of the high availability of raw materials, while a hydroxyl group and a mercapto group are preferred from the viewpoints of sensitivity and developability. Further, a hydroxyl group is most preferred from the viewpoint of balance between sensitivity and developability.

The heterocyclic ring as the divalent organic group represented by $R^4$ has a heteroatom (for example, a nitrogen atom, a sulfur atom or an oxygen atom) in the ring, and the ring may be a saturated ring or an unsaturated ring, may be a single ring or a fused ring, and may be unsubstituted or substituted.

Examples of such heterocyclic ring include ethylene oxide, trimethylene oxide, tetrahydrofuran, dihydrofuran, tetrahydropyran, dihydropyran, oxocane, dioxolane, dioxane, trioxane, tetrahydrothiophene, dithiane, pentamethylenesulfide, trithiane, pyrrolidine, pyrroline, tetrahydropyridine, piperazine, homopiperazine, piperidine, triazine, morpholine, hexamethylenetetramine, diazabicycloundecene, decahydroquinoline, diazabicyclooctane, γ-butyrolactone, γ-thiobutyrolactone, δ-valerolactone, thiazolidine, thiomorpholine, pyrrolidinone, δ-valerolactam, succinimide, glutarimide, imidazolidone, tetrahydropyrimidone, urazole, dihydrouracil, barbituric acid, indole, carbazole, julolidine, phenoxazine, phenothiazine, oxindole, phenanthridinone, isatine, phthalimide, diiminoisoindoline, iminoisoindolinone, diiminobenzisoindoline, naphthalimide, quinazolindione, pyrrole, porphyrin, porphyrine-metal complexes, phthalocyanine, phthalocyanine-metal complexes, naphthalocyanine, naphthalocyanine-metal complexes, furan, thiophene, pyrazole, imidazole, triazole, tetrazole, isoxazole, oxazole, isothiazole, thiazole, thiadiazole, thiatriazole, iminostilbene, azaindole, benzofuran, dibenzofuran, dibenzothiophene, thianaphthene, indazole, benzimidazole, benzotriazole, azabenzimidazole, anthranil, benzisoxazole, benzoxazole, benzothiazole, benzofurazan, benzothiadiazole, triazole-pyrimidine, triazole-pyridine, purine, xanthine, pyridine, pyridazine, pyrimidine, pyrimidone, uracil, pyrazine, quinoline, acridine, cinnoline, benzocinnoline, quinoxaline, quinazoline, quinoxaline, phenazine, phenanthroline, and the like, and these may unsubstituted or substituted.

The nitrogen-containing heterocyclic ring represented by A has, as previously described, a nitrogen atom in the ring, and the ring may be a saturated ring or an unsaturated ring, may be a single ring or a fused ring, and may be unsubstituted or substituted.

Specific examples of the nitrogen-containing heterocyclic ring include pyrrolidine, pyrroline, tetrahydropyridine, piperazine, homopiperazine, piperidine, triazine, morpholine, hexamethylenetetramine, diazabicycloundecene, decahydroquinoline, diazabicyclooctane, pyrrolidinone, δ-valerolactam, succinimide, glutarimide, imidazolidone, tetrahydropyrimidone, urazole, dihydrouracil, barbituric acid, indole, carbazole, julolidine, phenoxazine, phenothiazine, oxindole, phentanthridinone, isatine, phthalimide, diiminoisoindoline, iminoisoindolinone, diiminobenzisoindoline, naphthalimide, quinazolinedione, pyrrole, porphyrin, porphyrin-metal complexes, phthalocyanine, phthalocyanine-metal complexes, naphthalocyanine, naphthalocyanine-metal complexes, pyrazole, imidazole, triazole, tetrazole, isoxazole, oxazole, isothiazole, thiazole, thiadiazole, thiatriazole, iminostilbene, azaindole, indazole, benzimidazole, benzotriazole, azabenzimidazole, anthranil, benzisoxazole, benzoxazole, benzothiazole, benzofurazan, benzothiadiazole, triazole-pyrimidine, triazole-pyridine, purine, xanthine, pyridine, pyridazine, pyrimidine, pyrimidone, uracil, pyrazine, quinoline, acridine, cinnoline, benzocinnoline, quinoxaline, quinazoline, quinoxaline, phenazine, phenanthroline, perimidine and the like, and these may be unsubstituted or substituted.

More preferred examples include indole, carbazole, phenoxazine, phenothiazine, oxindole, phenanthridinone, isatine, phthalimide, diiminoisoindoline, iminoisoindolinone, diiminobenzisoindoline, naphthalimide, quinazolinedione, pyrrole, pyrazole, imidazole, triazole, tetrazole, isoxazole, oxazole, isothiazole, thiazole, thiadiazole, thiatriazole, iminostilbene, azaindole, indazole, benzimidazole, benzotriazole, azabenzimidazole, anthranil, benzisoxazole, benzoxazole, benzothiazole, benzofurazan, benzothiadiazole, triazole-pyrimidine, triazole-pyridine, purine, xanthine, pyridine, pyridazine, pyrimidine, pyrimidone, uracil, pyrazine, quinoline, acridine, cinnoline, benzocinnoline, quinoxaline, quinazoline, quinoxaline, phenazine, phenanthroline and the like.

The nitrogen-containing heterocyclic ring represented by A may be substituted, and as the substituents, the aforementioned substituents that may be introduced for the $R^4$ may be mentioned.

Examples of the hydrocarbon group having 1 to 6 carbon atoms represented by $R^a$ or $R^b$ include a methyl group, an ethyl group, a butyl group, a propyl group and a hexyl group, and among them, a methyl group and an ethyl group are preferred, with a methyl group being more preferred.

The structural unit represented by formula (1) is preferably a structural unit represented by the following formula (2) or a structural unit represented by the following formula (3).

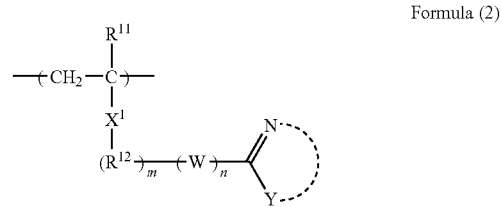

Formula (2)

In formula (2), $R^{11}$ represents a hydrogen atom, or a substituted or unsubstituted alkyl group. $R^{12}$ represents an alkylene group. $X^1$ represents —CO—, —C(=O)O—, —CONH—, —OC(=O)—, or a phenylene group. W represents —O—, —S—, —C(=O)O—, —CONH—, —C(=O)S—, —NHCONH—, —NHC(=O)O—, —NHC(=O)S—, —OC(=O)—, —OCONH— or —NHCO—. Y represents —NR$^{13}$—, —O—, —S— or —N=, and Y is connected to an N atom through an atomic group adjacent thereto to form a cyclic structure. $R^{13}$ represents a hydrogen atom, an alkyl group, or aryl group. m and n each independently represents 0 or 1.

Hereinafter, the structural unit represented by formula (2) will be described in detail.

In formula (2), $R^{11}$ represents a hydrogen atom or a substituted or unsubstituted alkyl group. The alkyl group represented by $R^{11}$ is preferably an alkyl group having 1 to 12 carbon atoms, more preferably an alkyl group having 1 to 8 carbon atoms, and particularly preferably an alkyl group having 1 to 4 carbon atoms. If the alkyl group represented by $R^{11}$ is a substituted alkyl group, examples of the substituents that may be introduced include a hydroxyl group, an alkoxy group, an aryloxy group, an acyloxy group, a halogen group and the like.

Specific examples of the preferred alkyl group represented by $R^{11}$ include a methyl group, an ethyl group, a propyl group, an n-butyl group, an i-butyl group, a t-butyl group, an n-hexyl group, a cyclohexyl group, a 2-hydroxyethyl group, a 3-hydroxypropyl group, a 2-hydroxypropyl group, a 2-methoxyethyl group and the like.

$R^{12}$ represents an alkylene group.

The alkylene group represented by $R^{12}$ is preferably an alkylene group having 1 to 12 carbon atoms, more preferably an alkylene group having 1 to 8 carbon atoms, and particularly preferably an alkylene group having 1 to 4 carbon atoms.

The alkylene group represented by $R^{12}$ may be substituted if substituents may be introduced, and examples of the substituents include a hydroxyl group, an alkoxy group, an aryloxy group, an acyloxy group and the like.

Specific examples of the preferred alkylene group represented by $R^{12}$ include a methylene group, an ethylene group, a propylene group, a trimethylene group, a tetramethylene group and the like.

$X^1$ represents —CO—, —C(=O)O—, —CONH—, —OC(=O)— or a phenylene group, and —C(=O)O— or —CONH— is preferred.

Y represents —$NR^{13}$—, —O—, —S— or —N=, and Y is connected to an N atom through an atomic group adjacent thereto to form a cyclic structure. Here, $R^{13}$ represents a hydrogen atom, an alkyl group or an aryl group, and a hydrogen atom or a methyl group is preferred.

Y is particularly preferably —S—, —NH— or —N=.

The cyclic structures formed by Y being connected to an N atom through an adjacent atomic group thereto, may include monocyclic structures such as an imidazole ring, a pyrimidine ring, a triazole ring, a tetrazole ring, a thiazole ring and an oxazole ring, and fused ring structures such as a benzimidazole ring, a benzothiazole ring, a benzoxazole ring, a purine ring, a quinazoline ring or a perimidine ring, and the cyclic structure is preferably a fused ring structure from the viewpoint of the affinity to pigment. Among the fused ring structures, a benzimidazole ring, a benzothiazole ring and a benzoxazole ring are particularly preferred.

W represents —O—, —S—, —C(=O)O—, —CONH—, —C(=O)S—, —NHCONH—, —NHC(=O)O—, —NHC(=O)S—, —OC(=O)—, —OCONH— or —NHCO—. W is particularly preferably —O—, —S—, —CONH—, —NHCONH— or —NHC(=O)S—.

m and n each independently represent 0 or 1, and it is particularly preferable if m and n are both 1.

Specific preferred examples of the structural unit represented by formula (1) (M-1 to M-18) will be presented in the following, however the invention is not intended to be limited to these.

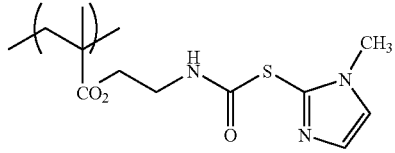

M-1

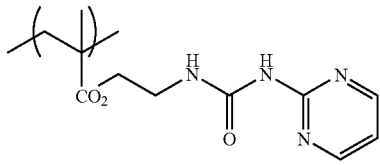

M-2

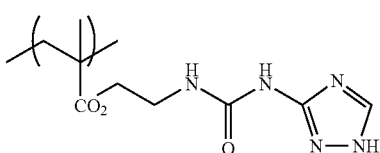

M-3

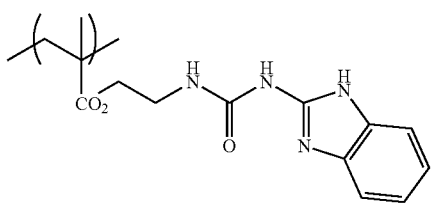

M-4

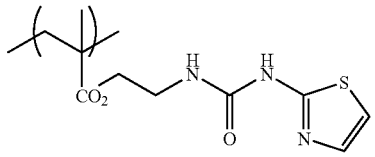

M-5

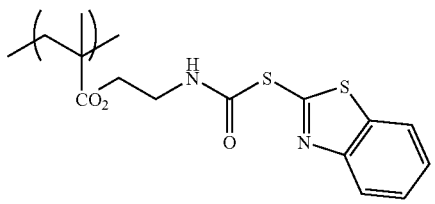

M-6

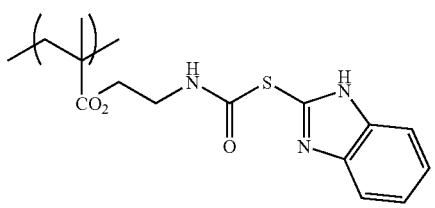

M-7

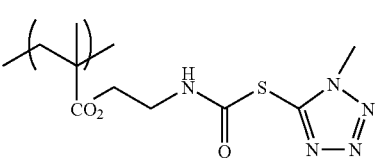

M-8

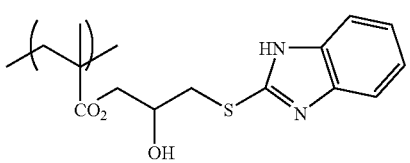

M-9

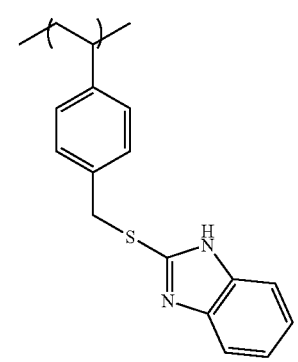

M-10

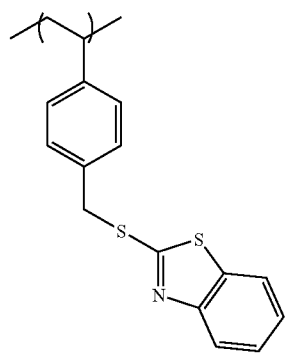

M-11

M-12

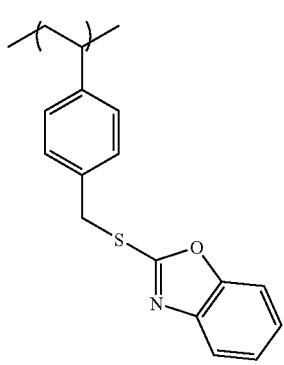

M-13

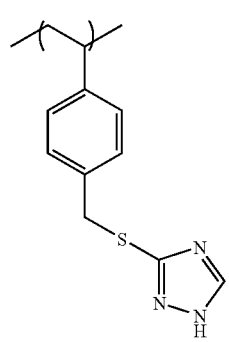

M-14

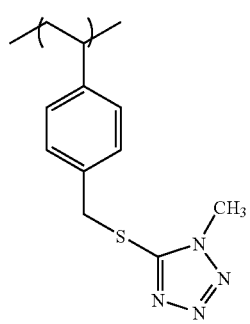

M-15

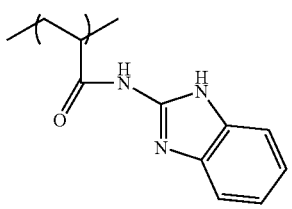

M-16

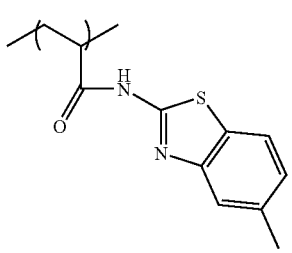

M-17

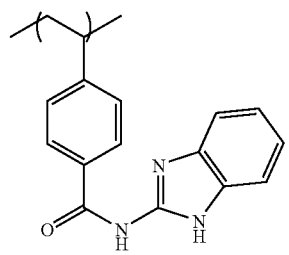

M-18

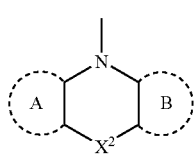

Formula (3)

$$-(CH_2-CR^{21})-$$

(with phenyl group bearing $R^{22}-Z$)

In formula (3), $R^{21}$ represents a hydrogen atom or a methyl group; $R^{22}$ represents an alkylene group; and Z represents a nitrogen-containing heterocyclic ring.

The alkylene group represented by $R^{22}$ may be substituted if substituents may be introduced, and examples of the substituents include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, a methylenethio group and the like, with a methylene group, a methyleneoxy group, a methyleneoxycarbonyl group and a methylenethio group being preferred.

In the above-described formula (3), Z represents a nitrogen-containing heterocyclic ring, and specific examples include those having a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, an phenoxazine ring, an acridone ring, an anthraquinone ring, a benzimidazole structure, a benztriazole structure, a benzthiazole structure, a cyclic amide structure, a cyclic urea structure, and a cyclic imide structure.

Among these, a heterocyclic structure represented by Z is preferably a structure represented by the following formula (4) or (5).

Formula (4)

(ring structure with N, A, B, $X^2$)

Formula (5)

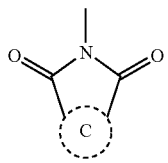

In the above-described formula (4), $X^2$ is any one selected from the group consisting of a single bond, an alkylene group (for example, a methylene group, an ethylene group, a propylene group, a trimethylene group, a tetramethylene group, etc.), —O—, —S—, —NR— and —C(=O)—. In addition, R here represents a hydrogen atom or an alkyl group, and if R represents an alkyl group, examples of the alkyl group include a methyl group, an ethyl group, an n-propyl group, an i-propyl group, an n-butyl group, a t-butyl group, an n-hexyl group, an n-octyl group, a 2-ethylhexyl group, an n-octadecyl group and the like.

Among these, $X^2$ is preferably a single bond, a methylene group, —O— or —C(=O)—, and particularly preferably —C(=O)—.

In the above-described formula (4) and formula (5), ring A, ring B and ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, an anthraquinone ring and the like. Among them, a benzene ring, a naphthalene ring, an anthracene ring, a pyridine ring, a phenoxazine ring, an acridine ring, a phenothiazine ring, a phenoxazine ring, an acridone ring and an anthraquinone ring are preferred, with a benzene ring, a naphthalene ring and a pyridine ring being particularly preferred.

For the pigment dispersant according to the invention, specific preferred examples of the structural unit represented by the formula (3) [illustrated monomers (M-21) to (M-27)] will be presented in the following, however the invention is not intended to be limited to these.

M-21

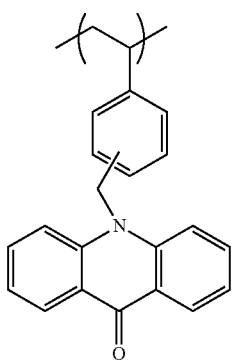

M-22

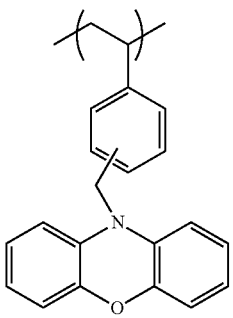

M-23

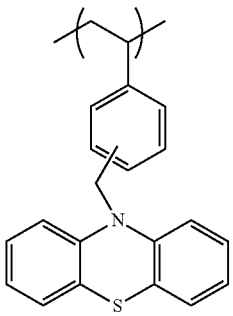

M-24

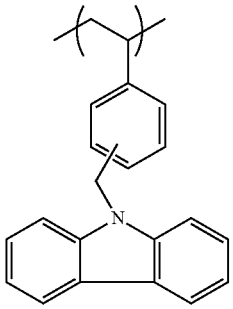

M-25

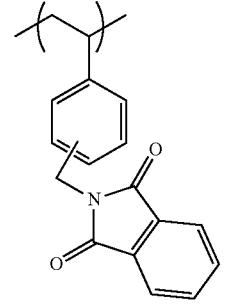

M-26

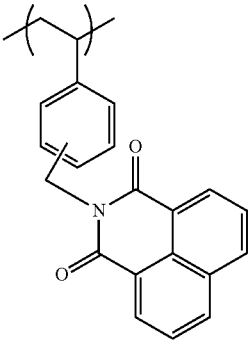

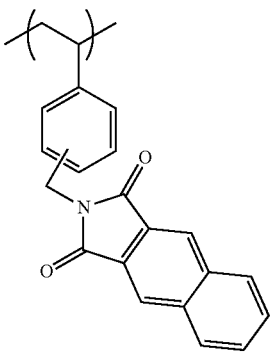

M-27

The structural unit having a pendant group containing a nitrogen-containing heterocyclic ring according to the invention is preferably M-2, M-4, M-11, M-13, M-14, M-21, M-24, M-25 or M-26.

The proportion of the structural unit having a pendant group containing a nitrogen-containing heterocyclic ring in the specific resin is preferably 0.1 to 80% by mass, more preferably 1.0 to 70% by mass, and most preferably 2.0 to 60% by mass.

It is preferable for the above-described specific resin to include, as a copolymer component, at least one of the structural units represented by the following formulas (6) to (8) as the structural unit having a pendant group containing an ethylenic unsaturated double bond.

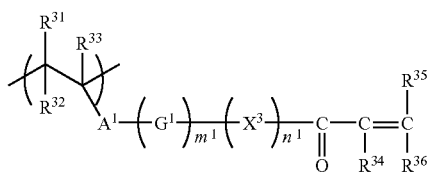

Formula (6)

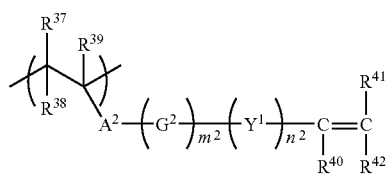

Formula (7)

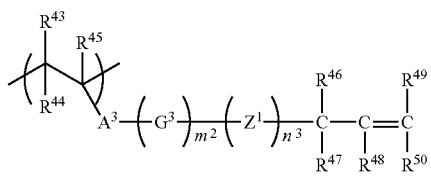

Formula (8)

In the above-described formulas (6) to (8), $A^1$, $A^2$ and $A^3$ each independently represent —CO—, —C(=O)O—, —CONH—, —OC(=O)— or a phenylene group. $G^1$, $G^2$ and $G^3$ each independently represent a divalent organic group. $X^3$ and $Z^1$ each independently represent an oxygen atom, a sulfur atom or —N($R^{52}$)—, while $R^{52}$ represents an alkyl group which may be substituted. $Y^1$ represents an oxygen atom, a sulfur atom, a phenylene group which may be substituted, or —N($R^{53}$)—, while $R^{53}$ represents an alkyl group which may be substituted. $m^1$, $m^2$, $m^3$, $n^1$, $n^2$ and $n^3$ each independently represent 0 or 1. $R^{31}$ to $R^{50}$ each independently represent a hydrogen atom or a monovalent substituent.

In the above-described formula (6), $R^{31}$ to $R^{33}$ each independently represent a hydrogen atom or a monovalent substituent, and a hydrogen atom and an alkyl group which may be further substituted, are preferred. Among them, $R^{31}$ and $R^{32}$ are particularly preferably each a hydrogen atom, while $R^{33}$ is particularly preferably a hydrogen atom or a methyl group.

$R^{34}$ to $R^{36}$ each independently represent a hydrogen atom or a monovalent substituent, and $R^{34}$ is preferably a hydrogen atom or an alkyl group which may be further substituted. Among them, a hydrogen atom, a methyl group and an ethyl group are particularly preferred. Furthermore, $R^{35}$ and $R^{36}$ may be each independently a hydrogen atom, a halogen atom, an alkoxycarbonyl group, a sulfo group, a nitro group, a cyano group, an alkyl group which may be further substituted, an aryl group which may be further substituted, an alkoxy group which may be further substituted, an aryloxy group which may be further substituted, an alkylsulfonyl group which may be further substituted, or an arylsulfonyl group which may be further substituted. Among them, a hydrogen atom, an alkoxycarbonyl group, an alkyl group which may be further substituted, and an aryl group which may be further substituted are preferred.

Here, examples of the substituent that may be introduced include a methoxycarbonyl group, an ethoxycarbonyl group, an isopropyloxycarbonyl group, a methyl group, an ethyl group, a phenyl group and the like.

$A^1$ represents —CO—, —C(=O)O—, —CONH—, —OC(=O)— or a phenylene group, and among them, —C(=O)O—, —CONH— and a phenylene group are preferred. $X^3$ represents an oxygen atom, a sulfur atom or —N($R^{52}$)—. Here, $R^{52}$ may be an alkyl group which may be substituted.

$G^1$ represents a divalent organic group, and is preferably an alkylene group having 2 to 60 carbon atoms which may have, within the structure, any partial structure selected from the group consisting of an oxygen atom, a nitrogen atom, a sulfur atom, a hydrocarbon ring structure having 3 to 20 carbon atoms, an ester bond, a sulfonic acid ester bond, a phosphoric acid ester bond, a urethane bond, a thiourethane bond, an amide bond, a urea bond and a thiourea bond, and which may be substituted, in view of strength, developability and the like. The divalent organic group is more preferably a straight-chained or branched alkylene group having 1 to 40 carbon atoms, which may have, within the structure, any partial structure selected from the group consisting of an oxygen atom, a nitrogen atom, a sulfur atom, a hydrocarbon ring structure having 3 to 20 carbon atoms, an ester bond, a urethane bond, a thiourethane bond, an amide bond, a urea bond and a thiourea bond, and is even more preferably a straight-chained or branched alkyl group having 1 to 40 carbon atoms, which may have, within the structure, any partial structure selected from the group consisting of an oxygen atom, a nitrogen atom, a hydrocarbon ring structure having 3 to 12 carbon atoms, an ester bond, a urethane bond, an amide bond and a urea bond.

Here, the substituent for $G^1$ is preferably a hydroxyl group.

In the above-described formula (7), $R^{37}$ to $R^{39}$ each independently represent a hydrogen atom or a monovalent substituent, and a hydrogen atom and an alkyl group which may be further substituted, are preferred. Among them, $R^{37}$ and $R^{38}$ are particularly preferably each a hydrogen atom, while $R^{39}$ is particularly preferably a hydrogen atom or a methyl group.

$R^{40}$ to $R^{42}$ each independently represent a hydrogen atom or a monovalent substituent. Specific examples include a hydrogen atom, a halogen atom, a dialkylamino group, an alkoxycarbonyl group, a sulfo group, a nitro group, a cyano group, an alkyl group which may be further substituted, an aryl group which may be further substituted, an alkoxy group which may be further substituted, an aryloxy group which may be further substituted, an alkylsulfonyl group which may be further substituted, an arylsulfonyl group which may be further substituted, and the like. Among them, a hydrogen atom, an alkoxycarbonyl group, an alkyl group which may be further substituted, and an aryl group which may be further substituted are preferred.

Here, as the substituents that may be introduced, the same substituents as those listed for formula (6) may be mentioned.

$A^2$ each independently represent —CO—, —C(=O)O—, —CONH—, —OC(=O)— or a phenylene group, and among them, —C(=O)O—, —CONH— and a phenylene group are preferred.

$G^2$ represents a divalent organic group, and is preferably an alkylene group having 2 to 60 carbon atoms which may have, within the structure, any partial structure selected from the group consisting of an oxygen atom, a nitrogen atom, a sulfur atom, a hydrocarbon ring structure having 3 to 20 carbon atoms, an ester bond, a sulfonic acid ester bond, a phosphoric acid ester bond, a urethane bond, a thiourethane bond, an amide bond, a urea bond and a thiourea bond, and which may be substituted, in view of strength, developability and the like. The divalent organic group is more preferably a straight-chained or branched alkylene group having 1 to 40 carbon atoms, which may have, within the structure, any partial structure selected from the group consisting of an oxygen atom, a nitrogen atom, a sulfur atom, a hydrocarbon ring structure having 3 to 20 carbon atoms, an ester bond, a urethane bond, a thiourethane bond, an amide bond, a urea bond and a thiourea bond, and is even more preferably a straight-chained or branched alkyl group having 1 to 40 carbon atoms, which may have, within the structure, any partial structure selected from the group consisting of an oxygen atom, a nitrogen atom, a hydrocarbon ring structure having 3 to 12 carbon atoms, an ester bond, a urethane bond, an amide bond and a urea bond.

Here, the substituent for $G^2$ is preferably a hydroxyl group.

$Y^1$ represents an oxygen atom, a sulfur atom, —N($R^{53}$)— or a phenylene group which may be substituted. Here, $R^{53}$ may be a hydrogen atom, an alkyl group which may be substituted, or the like.

In the above-described formula (8), $R^{43}$ to $R^{45}$ each independently represent a hydrogen atom or a monovalent substituent, and a hydrogen atom and an alkyl group which may be substituted, are preferred. Among them, $R^{43}$ and $R^{44}$ are particularly preferably each a hydrogen atom, while $R^{45}$ is particularly preferably a hydrogen atom or a methyl group.

$R^{46}$ to $R^{50}$ each independently represent a hydrogen atom or a monovalent substituent, and examples thereof include a hydrogen atom, a halogen atom, a dialkylamino group, an alkoxycarbonyl group, a sulfo group, a nitro group, a cyano group, an alkyl group which may be further substituted, an aryl group which may be further substituted, an alkoxy group which may be further substituted, an aryloxy group which may be further substituted, an alkylsulfonyl group which may be further substituted, an arylsulfonyl group which may be further substituted. Among them, a hydrogen atom, an alkoxycarbonyl group, an alkyl group which may be further substituted, and an aryl group which may be further substituted are preferred. As the substituents that may be introduced, those listed for formula (6) may be mentioned.

$A^3$ each independently represents —CO—, —C(=O)O—, —CONH—, —OC(=O)— or a phenylene group, and among them, —C(=O)O—, —CONH—, and a phenylene group are preferred. $Z^1$ represents an oxygen atom, a sulfur atom or —N($R^{52}$)—. As $R^{52}$, the same substituents as those listed for formula (6) may be mentioned.

$G^3$ represents a divalent organic group, and is preferably an alkylene group having 2 to 60 carbon atoms which may have, within the structure, any partial structure selected from the group consisting of an oxygen atom, a nitrogen atom, a sulfur atom, a hydrocarbon ring structure having 3 to 20 carbon atoms, an ester bond, a sulfonic acid ester bond, a phosphoric acid ester bond, a urethane bond, a thiourethane bond, an amide bond, a urea bond and a thiourea bond, and which may be substituted, in view of strength, developability and the like. The divalent organic group is more preferably a straight-chained or branched alkylene group having 1 to 40 carbon atoms, which may have, within the structure, any partial structure selected from the group consisting of an oxygen atom, a nitrogen atom, a sulfur atom, a hydrocarbon ring structure having 3 to 20 carbon atoms, an ester bond, a urethane bond, a thiourethane bond, an amide bond, a urea bond and a thiourea bond, and is even more preferably a straight-chained or branched alkyl group having 1 to 40 carbon atoms, which may have, within the structure, any partial structure selected from the group consisting of an oxygen atom, a nitrogen atom, a hydrocarbon ring structure having 3 to 12 carbon atoms, an ester bond, a urethane bond, an amide bond and a urea bond.

Here, the substituent for $G^3$ is preferably a hydroxyl group.

As for the method of synthesizing the specific resin according to the invention, for example, (a) a method synthesizing in advance a resin having a pendant group containing a nitrogen-containing heterocylic ring and a carboxyl group, and then reacting the carboxyl group of the resin with a glycidyl group-containing unsaturated compound such as glycidyl (meth) acrylate or allyl glycidyl ether, or with an unsaturated alcohol such as allyl alcohol, 2-hydroxyacrylate or 2-hydroxymethacrylate; (b) a method of synthesizing in advance a resin having a pendant group containing a nitrogen-containing heterocyclic ring and a hydroxyl group, and then reacting the hydroxyl group of the resin with a free isocyanato group-containing unsaturated compound, an unsaturated acid anhydride or an unsaturated acid halide; (c) a method of synthesizing in advance a resin having a pendant group containing a nitrogen-containing heterocyclic ring and an epoxy group, and then reacting the epoxy group of the resin with an unsaturated carboxylic acid; (d) a method of synthesizing in advance a resin having a pendant group containing a specific functional group which undergoes an elimination reaction when treated with a base to yield an unsaturated group, and a nitrogen-containing heterocyclic ring, and then treating the resin with a base to generate an unsaturated group, may be mentioned as representative examples. Among them, from the viewpoints of the stability in synthesis and general-purpose use, it is preferable to perform the synthesis according to the method of (a), (b) or (d), and it is more preferable to perform the synthesis according to the method of (d).

Here, as for the monomer which is used in the case of performing the synthesis according to the method of (d), and which becomes a structural unit having a pendant group containing an ethylenic unsaturated double bond through an elimination reaction, monomers having the same structure as a "structure in which an acid has been added to the ethylenic unsaturated bond moiety of a (meth)acryloyl group or a styryl group" may be used, and among them, monomers having a partial structure of the following formula (9) to formula (12) are preferred.

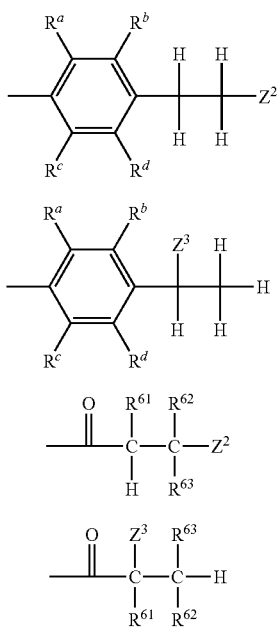

Formula (9)

Formula (10)

Formula (11)

Formula (12)

In the above-described formula (9) and formula (10), $R^a$ to $R^d$ each independently represent a hydrogen atom or a monovalent substituent.

The "monovalent substituent" represented by $R^a$ to $R^d$ may be a group which may substitute the benzene ring in the formula (9) and formula (10), and for example, an aliphatic group, an aromatic group, a heterocyclic group, a halogen atom, a hydroxyl group, a thiol group, a cyano group, a nitro group, a (meth)acrylate group, a carboxyl group, an amino group, an aliphatic amino group, an aromatic amino group, a heterocyclic amino group, an aliphatic oxy group, an aromatic oxy group, a heterocyclic oxy group, an aliphatic thio group, an aromatic thio group, a heterocyclic thio group, an aliphatic sulfonamide group, an aromatic sulfonamide group, a heterocyclic sulfonamide group, an acyl group, an acyloxy group, an acylamino group, an aliphatic oxycarbonyl group, an aromatic oxycarbonyl group, a heterocyclic oxycarbonyl group, an aliphatic oxycarbonylamino group, an aromatic oxyarbonylamino group, a heterocyclic oxycarbonylamino group, an aliphatic thiocarbonylamino group, an aromatic thiocarbonylamino group, a heterocyclic thiocarbonylamino group, an aliphatic aminocarbonylamino group, an aromatic aminocarbonylamino group, a heterocyclic aminocarbonylamino group, a carbamoyl group, a carbamoyloxy group, a carbamoylamino group, an aliphatic sulfonyl group, an aromatic sulfonyl group, a heterocyclic sulfonyl group, an aliphatic oxyamino group, an aromatic oxyamino group, a heterocyclic oxyamino group, a silyl group, an aliphatic oxysilyl group, a silyloxy group, an aliphatic oxycarbonyloxy group, an aromatic oxycarbonyloxy group, a heterocyclic oxycarbonyloxy group, a sulfamoyloxy group, an aliphatic sulfonyloxy group, an aromatic sulfonyloxy group, an anilino group, an aliphatic azo group, an aromatic azo group, a heterocyclic azo group, an aliphatic sulfinyl group, an aromatic sulfinyl group, a heterocyclic sulfinyl group, an aliphatic sulfonyloxy group, an aromatic sulfonyloxy group, a heterocyclic sulfonyloxy group, a sulfamoyl group, a sulfo group, a phosphonyl group, a phosphonic acid group, or a phosphinoylamino group may be mentioned.

Among them, preferred monovalent substituents include an aliphatic group, an aromatic group, a heterocyclic group, a halogen atom, a hydroxyl group, a thiol group, a cyano group, a nitro group, a (meth)acryloyl group, a carboxyl group, an amino group, an aliphatic amino group, an aromatic amino group, a heterocyclic amino group, an aliphatic oxy group, an aromatic oxy group, a heterocyclic oxy group, an aliphatic thio group, an aromatic thio group, an aliphatic sulfonamide group, an aromatic sulfonamide group, an acyl group, an aliphatic oxycarbonyl group, an aliphatic oxycarbonylamino group, an aromatic oxycarbonylamino group, an aliphatic thiocarbonylamino group, an aromatic thiocarbonylamino group, an aliphatic aminocarbonylamino group, an aromatic aminocarbonylamino group, a carbamoyl group, an aliphatic sulfonyl group, an aromatic sulfonyl group, a silyl group, an aliphatic oxysilyl group, a silyloxy group, an aliphatic carbonyloxy group, an aromatic carbonyloxy group, a heterocyclic carbonyloxy group, an aliphatic oxycarbonyloxy group, an aliphatic sulfonyloxy group, a sulfamoyl group, a sulfo group, a phosphonyl group, or a phosphonic acid group.

In particular, from the viewpoints of sensitivity and solubility, an aliphatic group, an aromatic group, a heterocyclic group, a halogen atom, a hydroxyl group, a thiol group, a (meth)acryloyl group, a carboxyl group, an amino group, an aliphatic amino group, an aromatic amino group, an aliphatic oxy group, an aromatic oxy group, a heterocyclic oxy group, an aliphatic thio group, an aliphatic sulfonamide group, an aliphatic oxycarbonyl group, an aliphatic oxycarbonylamino group, a silyl group, an aliphatic oxysilyl group, an aliphatic carbonyloxy group, an aliphatic oxycarbonyloxy group, an aliphatic sulfonyloxy group, a sulfo group or a phosphonic acid group is preferred.

The aforementioned aliphatic group represented by $R^a$ to $R^d$ means an alkyl group, an alkenyl group or an alkynyl group. The aliphatic group may be branched, or may form a ring. Also, the aliphatic group may be unsubstituted or substituted. If the aliphatic group is substituted, the aliphatic group may have the various substituents listed in the description for the "monovalent substituents," and if the aliphatic group has two or more substituents, those substituents may be identical with or different from each other. If the aliphatic group is an alkyl group, the alkyl group may be straight-chained or branched, or may form a ring. Among them, an alkyl group having 1 to 21 carbon atoms is preferred, an alkyl group having 1 to 16 carbon atoms is more preferred, and an alkyl group having 1 to 12 carbon atoms is particularly preferred.

Suitable examples of the alkyl group having 1 to 21 carbon atoms include a methyl group, an ethyl group, an n-propyl group, an n-butyl group, an n-amyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosanyl group, an i-propyl group, a sec-butyl group, an i-butyl group, a t-butyl group, a 1-methylbutyl group, a 1-ethylpropyl group, a 2-methylbutyl group, an i-amyl group, a neopentyl group, a 1,2-dimethylpropyl group, a 1,1-dimethylpropyl group, a t-amyl group, a 1,3-dimethylbutyl group, a 3,3-dimethylbutyl group, a 2-ethylbutyl group, a 2-ethyl-2-methylpropyl group, a straight-chained or branched heptyl group, a 1-methylheptyl group, a 2-ethylhexyl group, a 1,5-dimethylhexyl group, a t-octyl group, a branched nonyl group, a branched decyl group, a branched undecyl group, a branched dodecyl group, a branched tridecyl group, a branched tetradecyl group, a branched pentadecyl group, a branched hexadecyl group, a branched heptadecyl group, a branched octadecyl group, a straight-chained or branched nonadecyl group, a straight-chained or branched eicosanyl group, a cyclopropyl group, a cyclopropylmethyl group, a cyclobutyl group, a cyclobutylmethyl group, a cyclopentyl group, a cyclohexyl group, a cyclohexylmethyl group, a cycloheptyl group, a cyclooctyl group, a cyclohexylpropyl group, a cyclododecyl group, a norbornyl group, a bornyl group, a cis-miltanyl group, an isopinocamphenyl group, a noradamantyl group, an adamantyl group, an adamantylmethyl group, a 1-(1-adamantyl)ethyl group, a 3,5-dimethyladamantyl group, a quinuclidinyl group, a cyclopentylethyl group, and a bicyclooctyl group.

Among the above-described groups, a methyl group, an ethyl group, an n-propyl group, an n-butyl group, an n-amyl group, an n-hexyl group, an n-heptyl group, an n-octyl group, an n-nonyl group, an n-decyl group, an n-undecyl group, an n-dodecyl group, an n-tridecyl group, an n-tetradecyl group, an i-propyl group, a sec-butyl group, an i-butyl group, a t-butyl group, a 1-methylbutyl group, a 1-ethylpropyl group, a 2-methylbutyl group, an i-amyl group, a neopentyl group, a 1,2-dimethylpropyl group, a 1,1-dimethylpropyl group, a t-amyl group, a 1,3-dimethylbutyl group, a 3,3-dimethylbutyl group, a 2-ethylbutyl group, a 2-ethyl-2-methylpropyl group, a straight-chained or branched heptyl group, a 1-methylheptyl group, a 2-ethylhexyl group, a 1,5-dimethylhexyl group, a t-octyl group, a branched nonyl group, a branched decyl group, a branched undecyl group, a branched dodecyl group, a branched tridecyl group, a branched tetradecyl group, a cyclopropyl group, a cyclopropylmethyl group, a cyclobutyl group, a cyclobutylmethyl group, a cyclopentyl group, a cyclohexyl group, a cyclohexylmethyl group, a cycloheptyl group, a cyclooctyl group, a cyclohexylpropyl group, a cyclododecyl group, a norbornyl group, a bornyl group, a cis-miltanyl group, an isopinocamphenyl group, a noradamantyl group, an adamantyl group, an adamantylmethyl group, a 1-(1-adamantyl)ethyl group, a 3,5-dimethyladamantyl group, a quinuclidinyl group, a cyclopentylethyl group and a bicyclooctyl group are more preferred, and a methyl group, an ethyl group, an n-propyl group, an n-butyl group, an n-amyl group, an n-hexyl group, an n-heptyl group, an n-octyl group, an n-nonyl group, an n-decyl group, an i-propyl group, a sec-butyl group, an i-butyl group, a t-butyl group, a 1-methylbutyl group, a 1-ethylpropyl group, a 2-methylbutyl group, an i-amyl group, a neopentyl group, a 1,2-dimethylpropyl group, a 1,1-dimethylpropyl group, a t-amyl group, a 1,3-dimethylbutyl group, a 3,3-dimethylbutyl group, a 2-ethylbutyl group, a 2-ethyl-2-methylpropyl group, a straight-chained or branched heptyl group, a 1-methylheptyl group, a 2-ethylhexyl group, a 1,5-dimethylhexyl group, a t-octyl group, a branched nonyl group, a branched decyl group, a cyclopropyl group, a cyclopropylmethyl group, a cyclobutyl group, a cyclobutylmethyl group, a cyclopentyl group, a cyclohexyl group, a cyclohexylmethyl group, a cycloheptyl group, a cyclooctyl group, a cyclohexylpropyl group, a cyclododecyl group, a norbornyl group, a bornyl group, a noradamantyl group, an adamantyl group, an adamantylmethyl group, a 1-(1-adamantyl)ethyl group, a 3,5-dimethyladamantyl group, a cyclopentylethyl group and a bicyclooctyl group are particularly preferred.

For the alkyl group mentioned in the above, particularly an alkyl group substituted with fluorine is suitable, and as the fluorine-substituted alkyl group, a trifluoromethyl group, a trifluoroethyl group, a pentafluoroethyl group, a heptafluoropropyl group, a nonafluorobutyl group, a tridecafluorohexyl group, a pentadecafluoroheptyl group, a heptadecafluorooctyl group, a tridecafluorooctyl group, a nonadecafluorononyl group, a heptadecafluorodecyl group or a perfluorodecyl group is suitable. Among these, a trifluoromethyl group, a pentafluoroethyl group, a heptafluoropropyl group, a nonafluorobutyl group, a tridecafluorohexyl group and a pentadecafluoroheptyl group are more preferred, and a trifluoromethyl group, a pentafluoroethyl group, a heptafluoropropyl group, a nonafluorobutyl group and a tridecafluorohexyl group are particularly preferred.

In the case where the aliphatic group is an alkenyl group, the alkenyl group may be unsubstituted or substituted, and is preferably an alkenyl group having 2 to 21 carbon atoms. An alkenyl group having 2 to 16 carbon atoms is more preferred, and an alkenyl group having 2 to 10 carbon atoms is even more preferred. Suitable examples of the alkenyl group having 2 to 21 carbon atoms include a vinyl group, an isopropenyl group, a 2-propenyl group, a 2-methyl-propenyl group, a 1-methyl-1-propenyl group, a 1-butenyl group, a 3-butenyl group, a 1-methyl-1-butenyl group, a 1,1-dimethyl-3-butenyl group, a 1-pentenyl group, a 2-pentenyl group, a 1-ethyl-1-pentenyl group, a 1-hexenyl group, a 1-heptenyl group, a 2-,6-dimethyl-5-heptenyl group, a 9-decenyl group, a 1-cyclopentenyl group, a 2-cyclopentenylmethyl group, a cyclohexenyl group, a 1-methyl-2-cyclohexenyl group, a 1,4-dihydro-2-methylphenyl group, an octenyl group, a citronellyl group, an oleyl group, a geranyl group, a farnesyl group, a 2-(1-cyclohexenyl)ethyl group and the like.

Among the above-described groups, a vinyl group, an isopropenyl group, a 2-propenyl group, a 2-methyl-propenyl group, a 1-methyl-1-propenyl group, a 1-butenyl group, a 3-butenyl group, a 1-methyl-1-butenyl group, a 1,1-dimethyl-3-butenyl group, a 1-pentenyl group, a 2-pentenyl group, a 1-ethyl-1-pentenyl group, a 1-hexenyl group, a 1-heptenyl group, a 1-cyclopentenyl group, a 2-cyclopentenylmethyl group, a cyclohexenyl group, a 1-methyl-2-cyclohexenyl group and a 1,4-dihydro-2-methylphenyl group are more preferred, and a vinyl group, an isopropenyl group, a 2-propenyl group, a 2-methylpropenyl group, a 1-methyl-1-propenyl group, a 1-butenyl group, a 3-butenyl group, a 1-methyl-1-butenyl group, a 1,1-dimethyl-3-butenyl group, a 1-pentenyl group, a 2-pentenyl group, a 1-ethyl-1-pentenyl group, a 1-hexenyl group, a 1-cyclopentenyl group, a 2-cyclopentenylmethyl group, a cyclohexenyl group, a 1-methyl-2-cycleohexenyl group and a 1,4-dihydro-2-methylphenyl group are particularly preferred.

The aromatic group represented by $R^a$ to $R^d$ means an aryl group. An aryl group may be unsubstituted or substituted, and preferably has 6 to 21 carbon atoms. Among them, an aryl group having 6 to 15 carbon atoms is preferred, and an aryl group having 6 to 10 carbon atoms is more preferred.

Suitable examples of the aryl group having 6 to 21 carbon atoms include a phenyl group, a naphthyl group, a biphenylenyl group, an acenaphthenyl group, a fluorenyl group, an anthracenyl group, an anthraquinonyl group, a pyrenyl group and the like. Among these, a phenyl group, a naphthyl group, a biphenylenyl group, an acenaphthenyl group, a fluorenyl group and an anthracenyl group are more preferred, and a phenyl group, a naphthyl group, a biphenylenyl group and a fluorenyl group are particularly preferred.

The aryl group is preferably a phenyl group or a naphthyl group, and particularly preferably a phenyl group.

The heterocyclic ring represented by $R^a$ to $R^d$ has a heteroatom (for example, a nitrogen atom, a sulfur atom, an oxygen atom) in the ring, and the ring may be saturated or unsaturated, may be a single ring or a fused ring, or may be unsubstituted or substituted. The number of carbon atoms in the heterocyclic ring is preferably 1 to 32, and more preferably 2 to 16. For example, an isocyanuric ring, an epoxy ring, an oxetane ring, a furan ring, a tetrahydrofuran ring, a pyran ring, a tetrahydropyran ring, a dioxane ring, a trioxane ring, a tetrahydrothiophene ring, a thiophene ring, a dithiane ring, a trithiane ring, a pyrrolidine ring, a piperidine ring, a piperazine ring, a triazine ring, a triazacyclononane ring, a morpholine ring, a thiomorpholine ring, a pyrrole ring, a pyrazole ring, an imidazole ring, a triazole ring, a tetrazole ring, an oxazole ring, an isoxazole ring, a thiazole ring, a thiadiazole ring, an indole ring, a carbazole ring, a benzofuran ring, a pyridine ring, a quinoline ring, a pyrimidine ring, a pyridazine ring, a pyrazine ring, a phenanthroline ring, a quinazoline ring, an acridine ring, a uracil ring, a lactone ring and the like.

Among them, an isocyanuric ring, an epoxy ring, a furan ring, a tetrahydrofuran ring, a pyran ring, a tetrahydropyran ring, a tetrahydrothiophene ring, a thiophene ring, a pyrrolidine ring, a piperidine ring, a piperazine ring, a morpholine ring, a thiomorpholine ring, a pyrrole ring, a pyrazole ring, an imidazole ring, a triazole ring, an oxazole ring, a thiazole ring, a thiadiazole ring, an indole ring, a carbazole ring, a benzofuran ring, a pyridine ring, a quinoline ring, a pyrimidine ring, a pyridazine ring, a pyrazine ring, a uracil ring and a lactone ring are preferred, and particularly, an isocyanuric ring, an epoxy ring, a tetrahydrofuran ring, a tetrahydropyran ring, a tetrahydrothiophene ring, a pyrrolidine ring, a piperidine ring, a morpholine ring, a pyrrole ring, a pyrazole ring, an imidazole ring, a triazole ring, an oxazole ring, a thiazole ring, a pyridine ring, a pyrimidine ring, a pyridazine ring, a pyrazine ring and a lactone ring are preferred.

Furthermore, $Z^2$ in the formula (9) and formula (11) and $Z^3$ in the formula (10) and formula (12) represent an anionic leaving group.

In the formula (10) and formula (12), $R^{61}$ to $R^{63}$ each independently represent a hydrogen atom and a monovalent organic group. Preferred examples thereof are the same as those for $R^{61}$ to $R^{63}$ in the following formula (13) and formula (14).

Furthermore, according to the invention, among the monomers having a structure which generates an ethylenic unsaturated double bond through an elimination reaction, the most preferred examples of the monomer include radical-polymerizable compounds represented by the following formula (13), formula (14) or formula (15).

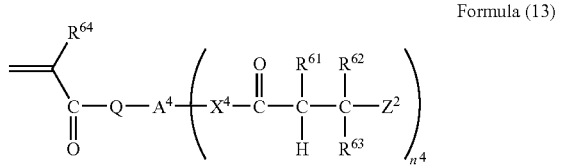

Formula (13)

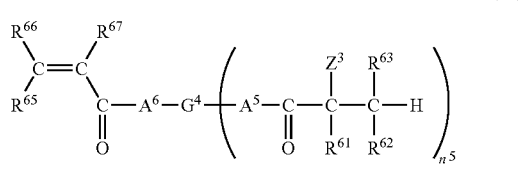

Formula (14)

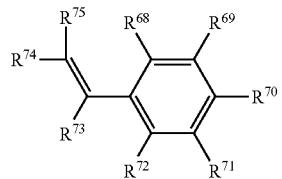

Formula (15)

In the above-described formula (13) and formula (14), $R^{61}$ to $R^{63}$ each independently represent a hydrogen atom or a monovalent substituent. $R^{61}$ may be a hydrogen atom or an alkyl group which may be substituted, and among them, a hydrogen atom, a methyl group, a methylalkoxy group and a methyl ester group are preferred.

Also, $R^{62}$ and $R^{63}$ may be each independently a hydrogen atom, a halogen atom, an amino group, a dialkylamino group, a carboxyl group, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylamino group which may be substituted, an arylamino group which may be substituted, an alkylsulfonyl group which may be substituted, an arylsulfonyl group which may be substituted, or the like. Among them, a hydrogen atom, a carboxyl group, an alkoxycarbonyl group, an alkyl group which may be substituted, and aryl group which may be substituted are preferred.

Here, examples of the substituent that may be introduced include a methoxycarbonyl group, an ethoxycarbonyl group, an isopropyloxycarbonyl group, a methyl group, an ethyl group, a phenyl group, and the like.

In the formula (13), $R^{64}$ represents a hydrogen atom, a hydrocarbon group having 1 to 6 carbon atoms, —COOH, —CN, —CF$_3$, —CH$_2$OH, —CH$_2$COOH, —CH$_2$COOR', or —COOR". The hydrocarbon group having 1 to 6 carbon atoms represented by R' or R" may be a methyl group, an ethyl group, a butyl group, a propyl group or a hexyl group, and among them, a methyl group and an ethyl group are preferred. Among them, R' or R" is preferably a hydrogen atom, a methyl group, —COOH, —CN, —CF$_3$, —CH$_2$OH or —CH$_2$COOH, and a hydrogen atom or a methyl group is more preferred.

Q represents an oxygen atom, —NH— or —NR$^{O1}$— (here, R$^{O1}$ represents an alkyl group which may be substituted).

$A^4$ represents a linking group having a valency of $n^4+1$. Although not particularly limited, $A^4$ is preferably an alkyl group or aryl group having 2 to 60 carbon atoms which may preferably have, within the structure, an atom or a partial structure selected from the group consisting of an oxygen atom, a nitrogen atom, a sulfur atom, a hydrocarbon ring structure having 3 to 20 carbon atoms, a heterocyclic ring, an ester bond, a sulfonic acid ester bond, a phosphoric acid ester bond, a urethane bond, a thiourethane bond, an amide bond, a urea bond and a thiourea bond; more preferably a straight-chained or branched alkyl group having 1 to 40 carbon atoms which may have, within the structure, an atom or a partial structure selected from an oxygen atom, a nitrogen atom, a sulfur atom, a hydrocarbon ring structure having 3 to 20 carbon atoms, an ester bond, a urethane bond, a thiourethane bond, an amide bond, a urea bond and a thiourea bond; and even more preferably a straight-chained or branched alkyl group having 1 to 40 carbon atoms which may have, within the structure, an atom or a partial structure selected from the group consisting of an oxygen atom, a nitrogen atom, a hydrocarbon ring structure having 3 to 12 carbon atoms, an ester bond, a urethane bond and an amide bond.

The linking group having a valency of $n^4+1$ represented by $A^4$ may be further substituted if substituents may be introduced. Examples of the substituents that may be introduced include a straight-chained, branched or cyclic alkyl group having 1 to 20 carbon atoms, a straight-chained, branched or cyclic alkenyl group having 2 to 20 carbon atoms, an alkynyl group having 2 to 20 carbon atoms, an aryl group having 6 to 20 carbon atoms, an acyloxy group having 1 to 20 carbon atoms, an alkoxycarbonyloxy group having 2 to 20 carbon atoms, an aryloxycarbonyloxy group having 7 to 20 carbon atoms, a carbamoyloxy group having 1 to 20 carbon atoms, a carbonamide group having 1 to 20 carbon atoms, a sulfonamide group having 1 to 20 carbon atoms, a carbamoyl group having 1 to 20 carbon atoms, a sulfamoyl group having 0 to 20 carbon atoms, an alkoxy group having 1 to 20 carbon atoms, an aryloxy group having 6 to 20 carbon atoms, an aryloxycarbonyl group having 7 to 20 carbon atoms, an alkoxycarbonyl group having 2 to 20 carbon atoms, an N-acylsulfamoyl group having 1 to 20 carbon atoms, an N-sulfamoylcarbamoyl group having 1 to 20 carbon atoms, an alkylsulfonyl group having 1 to 20 carbon atoms, an arylsulfonyl group having 6 to 20 carbon atoms, an alkoxycarbonylamino group having 2 to 20 carbon atoms, an aryloxycarbonylamino group having 7 to 20 carbon atoms, an amino group having 0 to 20 carbon atoms, an imino group having 1 to 20 carbon atoms, an ammonio group having 3 to 20 carbon atoms, a hydroxyl group, a mercapto group, an alkylsulfinyl group having 1 to 20 carbon atoms, an arylsulfinyl group having 6 to 20 carbon atoms, an alkylthio group having 1 to 20 carbon atoms, an arylthio group having 6 to 20 carbon atoms, a ureido group having 1 to 20 carbon atoms, a heterocyclic group having 2 to 20 carbon atoms, an acyl group having 1 to 20 carbon atoms, a sulfamoylamino group having 0 to 2 carbon atoms, a silyl group having 2 to 20 carbon atoms, an isocyanate group, an isocyanide group, a halogen atom (for example, a fluorine atom, a chorine atom, a bromine atom, etc.), a cyano group, a nitro group, an onium group, a group having an ethylenic unsaturated double bond, and the like. Among them, from the viewpoint of high availability of the raw materials, a straight-chained, branched or cyclic alkyl group having 1 to 10 carbon atoms is preferred, and from the viewpoints of sensitivity and developability, a hydroxyl group, a mercapto group, and a group having an ethylenic unsaturated bond are preferred. Also, from the viewpoint of the balance between sensitivity and developability, a hydroxyl group is most preferred. $n^4$ represents an integer from 1 to 10.

Also, $X^4$ represents $-G^1-X^5-$, wherein $G^1$ represents a divalent organic group linked to $A^4$, while $X^5$ represents an oxygen atom, a sulfur atom or $-NR^{03}-$ (here, $R^{03}$ represents a hydrogen atom or an alkyl group which may be substituted, and the substituents which may be introduced herein are the same as the examples presented in the description for the "monovalent substituent" of formula (13), while the preferred examples are also the same).

In addition, $Z^2$ represents an anionic leaving group.

In the formula (14), $R^{65}$ and $R^{66}$ each independently represent a hydrogen atom or a monovalent organic group.

Here, the monovalent organic group represented by $R^{65}$ and $R^{66}$ may be a hydrocarbon group having 1 to 6 carbon atoms, and among them, a methyl group, an ethyl group and a phenyl group are preferred.

In the formula (14), $R^{67}$ has the same meaning as defined for $R^{64}$ in the formula (13), and the preferred examples are also the same.

$A^5$ represents $-G^2-X^6-$, wherein $G^2$ represents a divalent organic group linked to $G^4$, and $X^6$ represents an oxygen atom, a sulfur atom or $-NR^{03}-$ (here, $R^{03}$ represents a hydrogen atom or an alkyl group which may be substituted, and the substituents which may be introduced herein are the same as the examples presented in the description for the above-described "monovalent substituent," of formula (13), while the preferred examples are also the same).

$A^6$ represents an oxygen atom, a sulfur atom or $-NR^{04}-$ (here, $R^{04}$ represents a hydrogen atom or an alkyl group which may be substituted, and the substituents which may be introduced herein are the same as the examples presented in the description for the above-described "monovalent substituent," while the preferred examples are also the same).

In addition, $G^4$ represents a linking group having a valency of $n^5+1$. Although not particularly limited, $G^4$ is preferably an alkyl group or aryl group having 2 to 60 carbon atoms which may preferably have, within the structure, an atom or a partial structure selected from the group consisting of an oxygen atom, a nitrogen atom, a sulfur atom, a hydrocarbon ring structure having 3 to 20 carbon atoms, a heterocyclic ring, an ester bond, a sulfonic acid ester bond, a phosphoric acid ester bond, a urethane bond, a thiourethane bond, an amide bond, a urea bond and a thiourea bond; more preferably a straight-chained or branched alkyl group having 1 to 40 carbon atoms which may have, within the structure, an atom or a partial structure selected from an oxygen atom, a nitrogen atom, a sulfur atom, a hydrocarbon ring structure having 3 to 20 carbon atoms, an ester bond, a urethane bond, a thiourethane bond, an amide bond, a urea bond and a thiourea bond; and even more preferably a straight-chained or branched alkyl group having 1 to 40 carbon atoms which may have, within the structure, an atom or a partial structure selected from the group consisting of an oxygen atom, a nitrogen atom, a hydrocarbon ring structure having 3 to 12 carbon atoms, an ester bond, a urethane bond and an amide bond.

The linking group having a valency of $n^5+1$ represented by $G^4$ may be further substituted if substituents may be introduced. Examples of the substituents that may be introduced include a straight-chained, branched or cyclic alkyl group having 1 to 20 carbon atoms, a straight-chained branched or cyclic alkenyl group having 2 to 20 carbon atoms, an alkynyl group having 2 to 20 carbon atoms, an aryl group having 6 to 20 carbon atoms, an acyloxy group having 1 to 20 carbon atoms, an alkoxycarbonyloxy group having 2 to 20 carbon atoms, an aryloxycarbonyloxy group having 7 to 20 carbon atoms, a carbamoyloxy group having 1 to 20 carbon atoms, a carbonamide group having 1 to 20 carbon atoms, a sulfonamide group having 1 to 20 carbon atoms, a carbamoyl group having 1 to 20 carbon atoms, a sulfamoyl group having 0 to 20 carbon atoms, an alkoxy group having 1 to 20 carbon atoms, an aryloxy group having 6 to 20 carbon atoms, an aryloxycarbonyl group having 7 to 20 carbon atoms, an alkoxycarbonyl group having 2 to 20 carbon atoms, an N-acylsulfamoyl group having 1 to 20 carbon atoms, an N-sulfamoylcarbamoyl group having 1 to 20 carbon atoms, an alkylsulfonyl group having 1 to 20 carbon atoms, an arylsulfonyl group having 6 to 20 carbon atoms, an alkoxycarbonylamino group having 2 to 20 carbon atoms, an aryloxycarbonylamino group having 7 to 20 carbon atoms, an amino group having 0 to 20 carbon atoms, an imino group having 1 to 20 carbon atoms, an ammonio group having 3 to 20 carbon atoms, a hydroxyl group, a mercapto group, an alkylsulfinyl group having 1 to 20 carbon atoms, an arylsulfinyl group having 6 to 20 carbon atoms, an alkylthio group having 1 to 20 carbon atoms, an arylthio group having 6 to 20 carbon atoms, an ureido group having 1 to 20 carbon atoms, a heterocyclic group having 2 to 20 carbon atoms, an acyl group having 1 to 20 carbon atoms, a sulfamoylamino group having 0 to 2 carbon atoms, a silyl group having 2 to 20 carbon atoms, an isocyanate group, an isocyanide group, a halogen atom (for example, a fluorine atom, a chlorine atom, a bromine atom, etc.), a cyano group, a nitro group, an onium group, a group having an ethylenic unsaturated double bond, and the like. Among them, from the viewpoint of high availability of the raw materials, a straight-chained, branched or cyclic alkyl group having 1 to 10 carbon atoms is preferred, and from the viewpoints of sensitivity and developability, a hydroxyl group, a mercapto group and a group having an ethylenic unsaturated bond are preferred.

Furthermore, from the viewpoint of the balance between sensitivity and developability, a hydroxyl group is most preferred. $n^5$ represents an integer from 1 to 10.

$Z^3$ represents an anionic leaving group.

In the formula (15), $R^{68}$ to $R^{72}$ each independently represent a hydrogen atom or a monovalent substituent, however at least one of them is a group represented by the following formula (16) or formula (17).

Here, as the monovalent substituent represented by $R^{68}$ to $R^{72}$, the substituents mentioned in the description of the "monovalent substituent" for formula (13) may be mentioned, and preferred examples are also the same.

Also, $R^{73}$ to $R^{75}$ each independently represent a hydrogen atom or a monovalent organic group. Here, the monovalent organic group represented by $R^{73}$ to $R^{75}$ may be hydrocarbon groups having 1 to 6 carbon atoms, and among them, a methyl group, an ethyl group and a phenyl group are preferred.

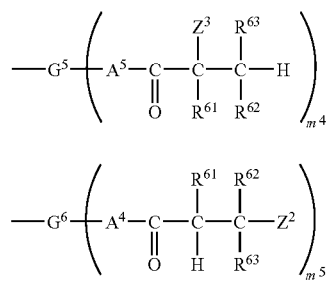

Formula (16)

Formula (17)

In the formula (16), $G^5$ represents a linking group having a valency of $m^4+1$, and examples thereof include the exemplary linking groups mentioned for $G^4$ in the formula (14), with the preferred examples also being the same as those defined for $G^4$. $m^4$ represents an integer from 1 to 10.

Furthermore, $R^{61}$ to $R^{63}$, $Z^3$ and $A^5$ in the formula (16) have the same meaning as defined for $R^{61}$ to $R^{63}$, $Z^3$ and $A^5$ in the formula (14).

In the formula (17), $G^6$ represents a linking group having a valency of $m^5+1$, and examples include the exemplary linking groups mentioned for $A^4$ in the formula (13), with the preferred examples also being the same as those defined for $A^4$. $m^5$ represents an integer from 1 to 10.

Also, $R^{61}$ to $R^{63}$, $Z^2$ and $A^4$ in the formula (17) have the same meaning as defined for $R^{61}$ to $R^{63}$, $Z^2$ and $A^4$ in the formula (13).

Hereinafter, specific examples of the radical polymerizable compound represented by the formula (13), (M-31) to (M-42), will be presented, however the invention is not intended to be limited to these.

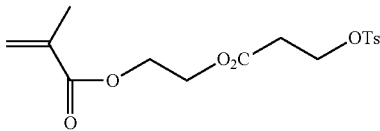

(M-31)

(M-32)

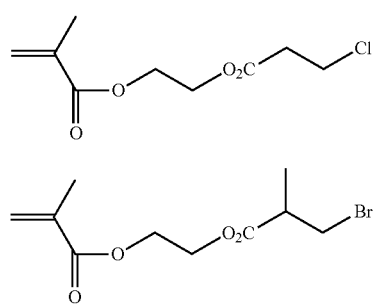

(M-33)

(M-34)

(M-35)

(M-36)

(M-37)

(M-38)

(M-39)

(M-40)

(M-41)

(M-42)

Specific examples of the radical polymerizable compound represented by formula (14) and the radical polymerizable compound represented by formula (15) [i-1 to i-60] will be presented, however the invention is not intended to be limited to these.

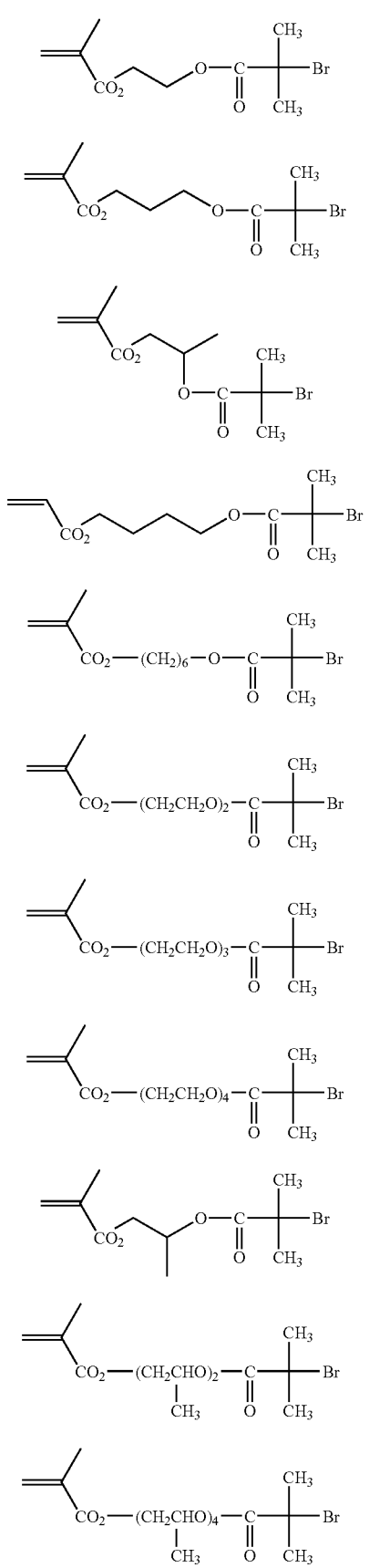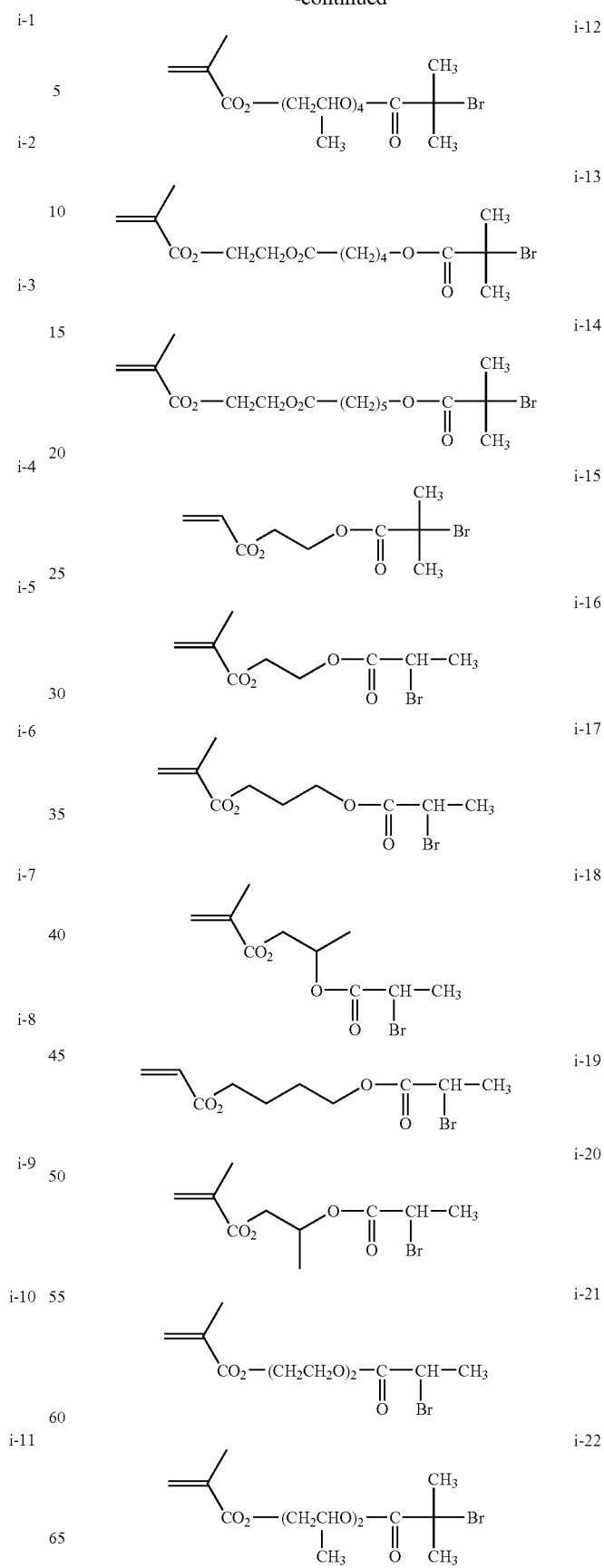

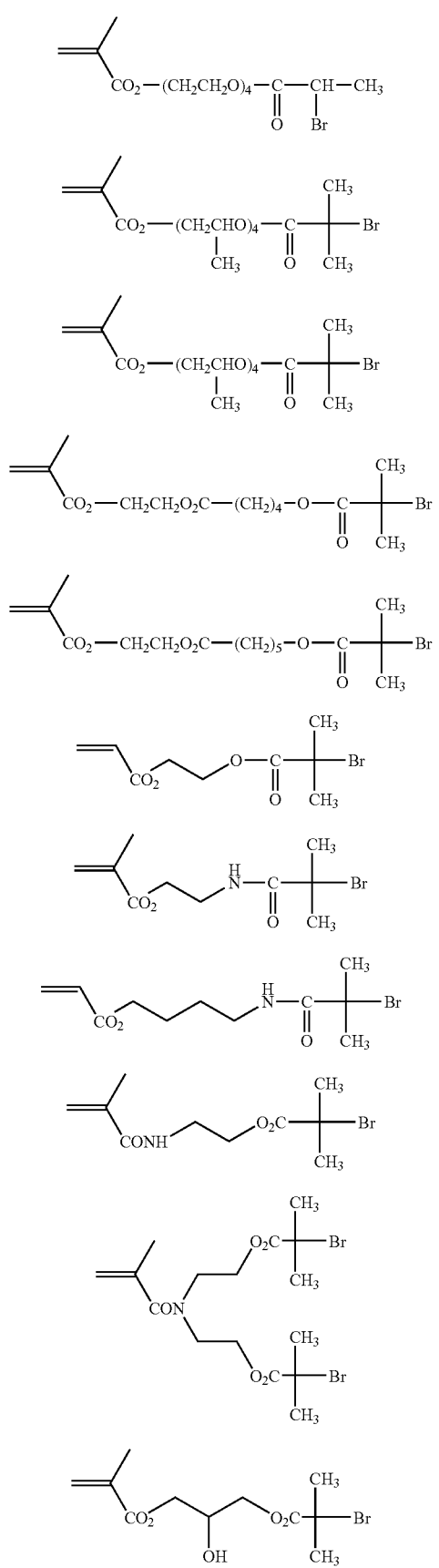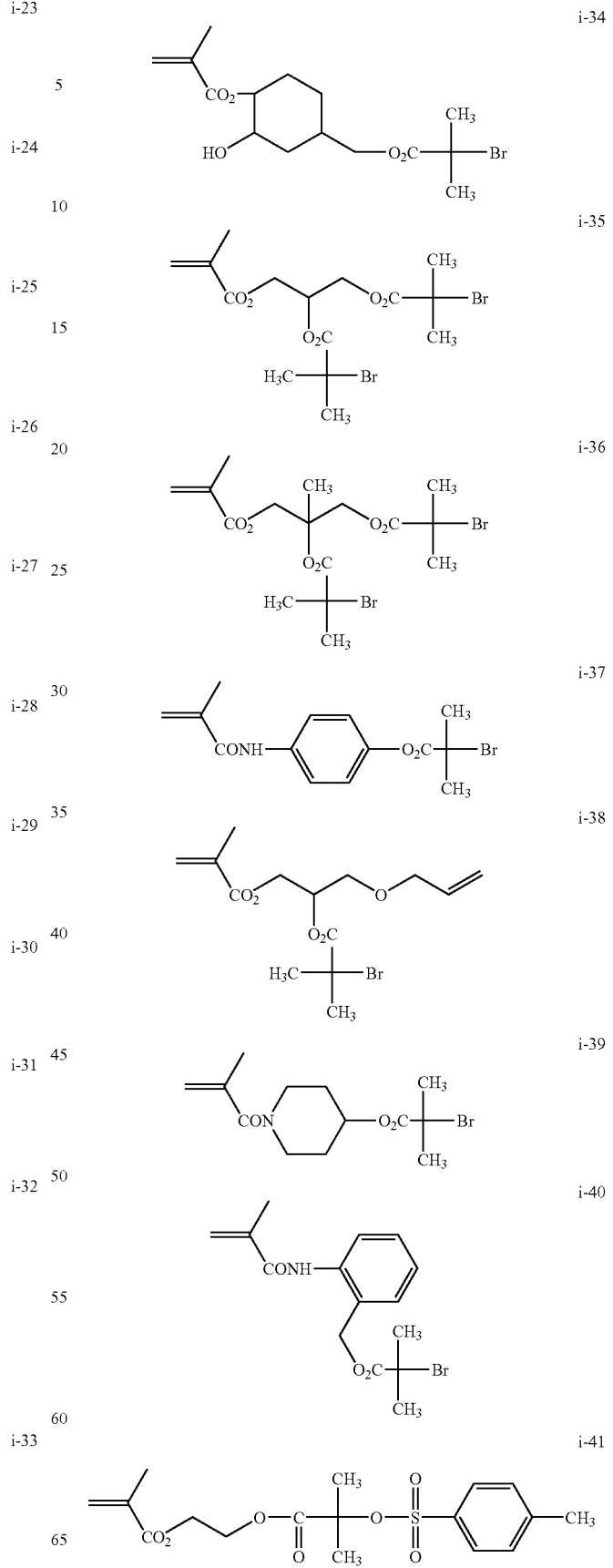

i-42
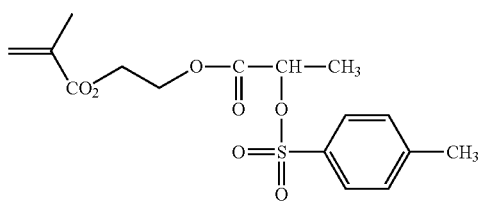
i-43
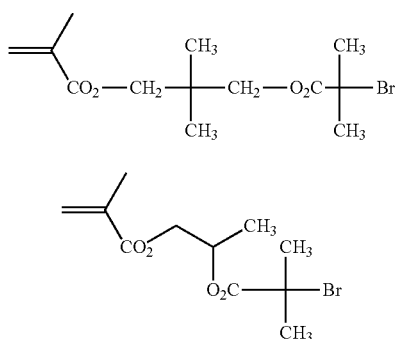
i-44
i-45
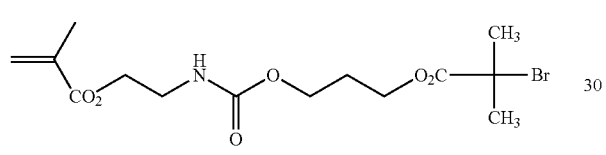
i-46
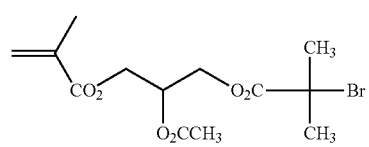
i47
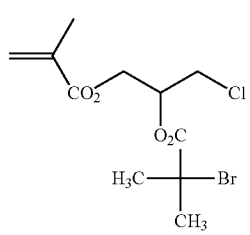
i-48
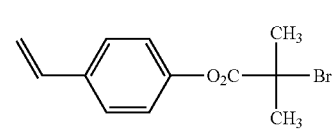
i-49
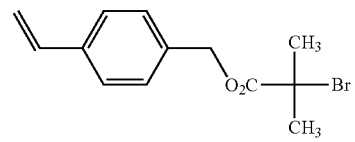
i-50
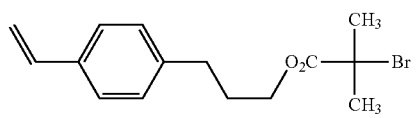
i-51
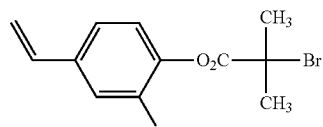
i-52
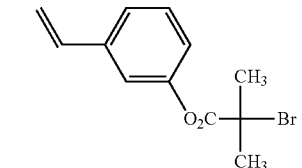
i-53
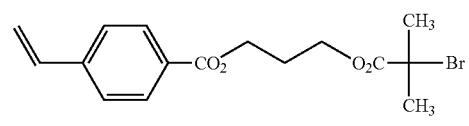
i-54
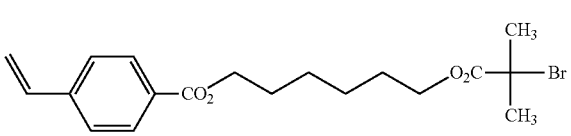
i-55
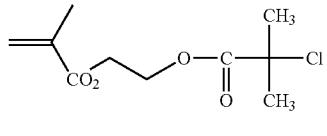
i-56
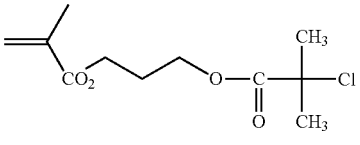
i-57
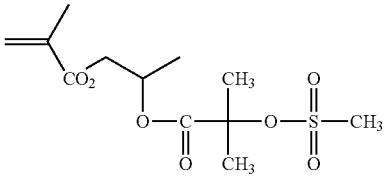
i-58
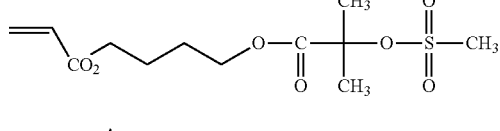
i-59
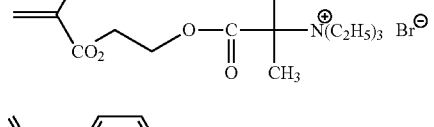
i-60
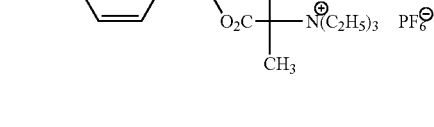
The structural unit having a pendant group containing an ethylenic unsaturated double bond according to the invention is preferably (M-31), (M-37), (M-38), i-1, i-2, i-6, i-10, i-15, i-31, i-33, i-48 or i-49.

The proportion of the structural unit having a pendant group containing an ethylenic unsaturated double bond in the specific resin is preferably 1.0% by mass to 80% by mass, more preferably 5.0 to 70% by mass, and most preferably 10 to 60% by mass.

The specific resin may also have other monomers copolymerized therein. For the other monomers, the following monomers of (1) to (11) are suitably used.

(1) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate and propargyl acrylate.

(2) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate and propargyl methacrylate.

(3) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide and allylmethacrylamide.

(4) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(5) Vinyl esters such as vinyl acetate, vinyl chloroacetate, vinyl butyrate and vinyl benzoate.

(6) Styrenes such as styrene, α-methylstyrene, methylstyrene, chloromethylstyrene and p-acetoxystyrene.

(7) Vinyl ketones such as methyl vinyl ketone, ethyl vinyl ketone, propyl vinyl ketone and phenyl vinyl ketone.

(8) Olefins such as ethylene, propylene, isobutylene, butadiene and isoprene.

(9) N-vinylpyrrolidone, acrylonitrile, methacrylonitrile and the like.

(10) Unsaturated imides such as maleimide, N-acryloylacrylamide, N-acetylmethacrylamide, N-propionylmethacrylamide and N-(p-chlorobenzoyl)methacrylamide.

(11) Methacrylic acid monomers having a heteroatom bound to the α-position. For example, the compounds described in JP-A-2002-309057, JP-A-2002-311569 and the like.

Furthermore, as the other monomers, monomers having a carboxy group and monomers having a hydroxyl group may be mentioned. Examples of the monomers having a carboxy group include acrylic acid, methacrylic acid, itaconic acid, crotonic acid, maleic acid, fumaric acid, 4-carboxylstyrene and the like, and acidic cellulose derivatives having a carboxyl group in the side chain may also be used. In addition to these, products formed by adding a cyclic acid anhydride to a polymer having a hydroxyl group, and the like are useful.

As the monomers having a hydroxyl group, acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate, and ethyleneoxy-modified products thereof, hydroxystyrene, and the like are useful.

The weight average molecular weight of the specific resin is, from the viewpoints of sensitivity, developability and storage stability, preferably from 3,000 to 300,000, more preferably from 4,000 to 100,000, even more preferably from 5,000 to 50,000, and most preferably from 6,000 to 25,000.

The specific resin preferably has an ethylenic unsaturated bond equivalent per 1 g of the resin (unit: mol/g) of 0.00001 mol/g or more, more preferably 0.0001 mol/g or more and 0.01 mol/g or less, and most preferably 0.001 mol/g or more and 0.008 mol/g or less, from the viewpoints of sensitivity and storage stability.

It is preferable that the specific resin further has an acidic group, and the acidic value is preferably 10 to 700 mg KOH/g, more preferably 30 to 500 mg KOH/g, and most preferably 50 to 300 mg KOH/g. Preferred monomers having an acidic group in this case include (meth)acrylic acid, p-vinylbenzoic acid, maleic acid, fumaric acid, itaconic acid, succinic anhydride adduct of 2-hydroxyethyl (meth)acrylate, phthalic anhydride adduct of 2-hydroxyethyl (meth)acrylate, and the like.

The specific resin preferably has a graft structure having further branches, and it is preferable to use polymerizable oligomers (macromonomers) to form the graft structure. Preferred examples of the polymerizable oligomers include polymethyl (meth)acrylate, poly-n-butyl (meth)acrylate and poly-1-butyl (meth)acrylate, and a polymer produced by attaching a (meth)acryloyl group at one end of the molecule of polystyrene. As such polymerizable oligomers that are commercially available, there may be mentioned a polystyrene oligomer having a methacryloyl group at one end (Mn=6000, trade name: AS-6, manufactured by Toagosei Co., Ltd.), a polymethyl methacrylate oligomer having a methacryloyl group at one end (Mn=6000, trade name: AA-6, manufactured by Toagosei Co., Ltd.) and poly-n-butyl acrylate oligomer having a methacryloyl group at one end (Mn=6000, trade name: AB-6, manufactured by Toagosei Co., Ltd.), and products manufactured by Toagosei Co., Ltd. including UM-9001, XM-9053, WM-9054, UC-3000, UC-3900, UC-3910, UC-3920, UF-5022 (all containing a —COOH group), AA-714, AX-714, AY-707, AY-714, UH-2000, UH-2032, UH-2041, UH-2170, UHE-2012 (all containing a —OH group), and the like.

Specific compound examples of the polymer compound having a structural unit represented by the formulas (13) to (15) include the following polymer compounds (1) to (24). The composition ratio is expressed in percentage by mass. Mw indicates the weight average molecular weight.

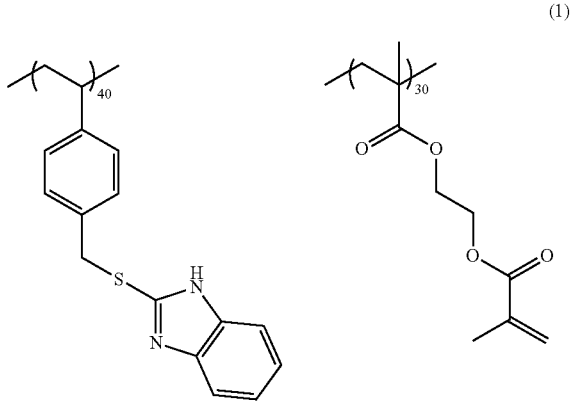

(1)

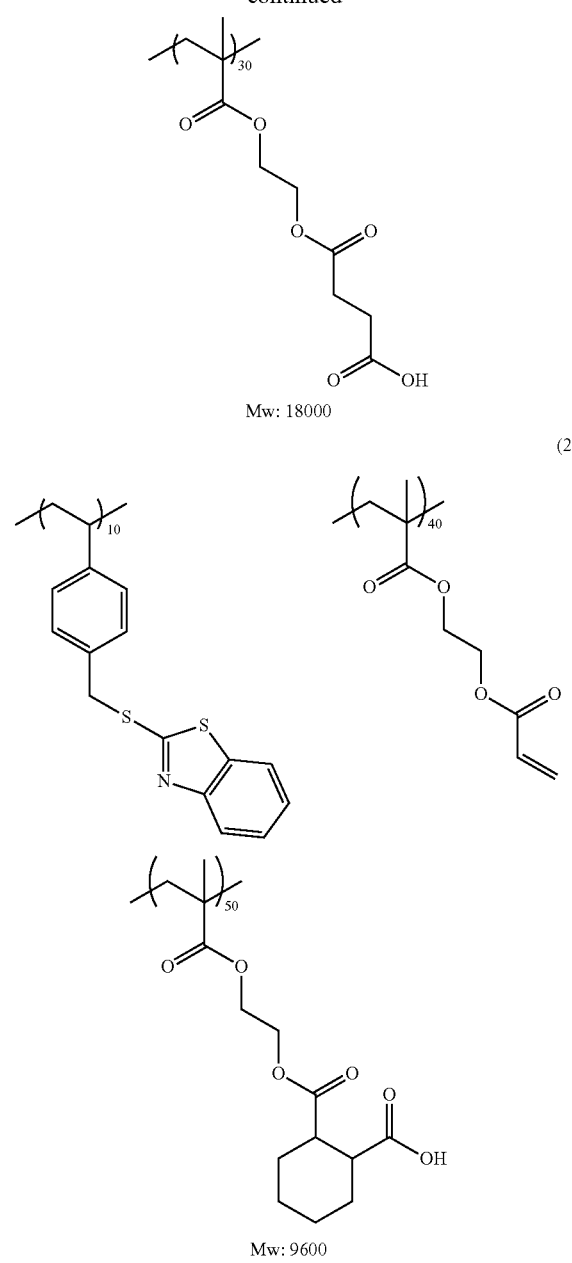
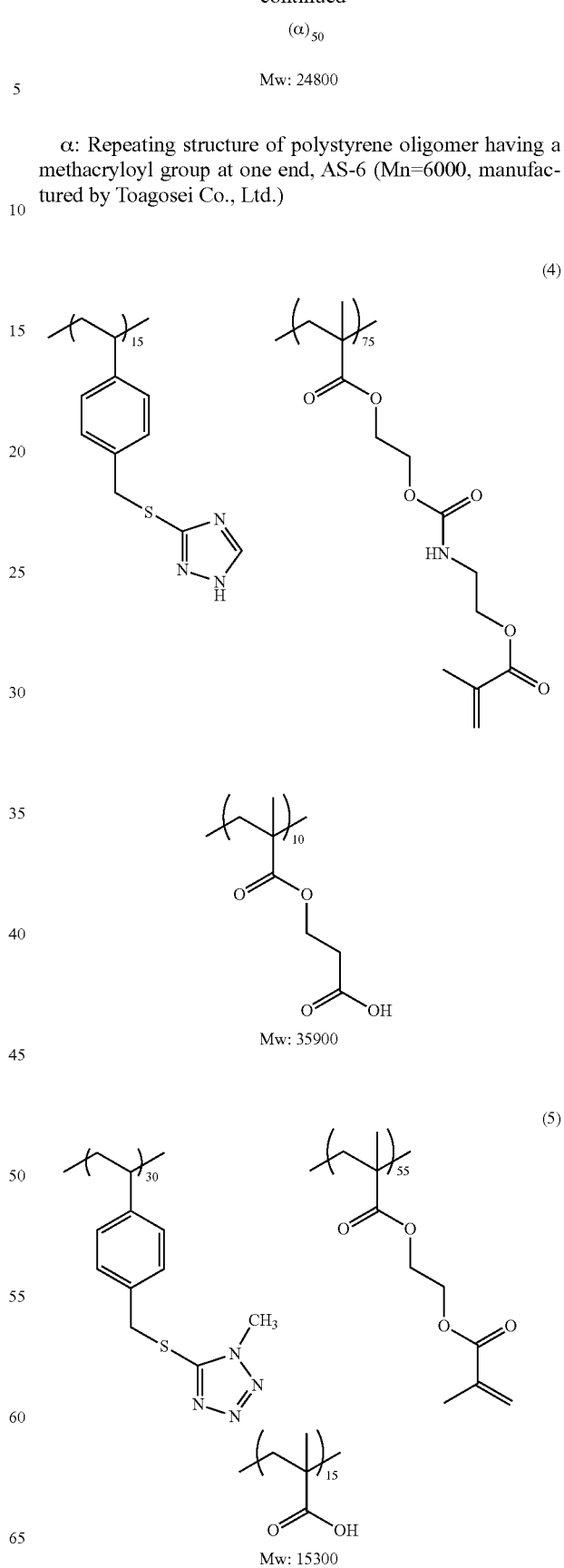
α: Repeating structure of polystyrene oligomer having a methacryloyl group at one end, AS-6 (Mn=6000, manufactured by Toagosei Co., Ltd.)

(6)
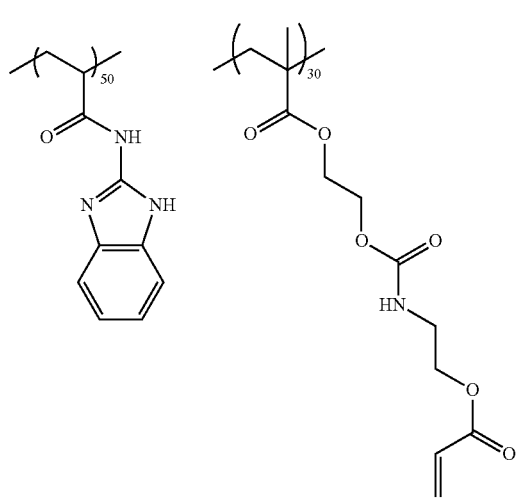
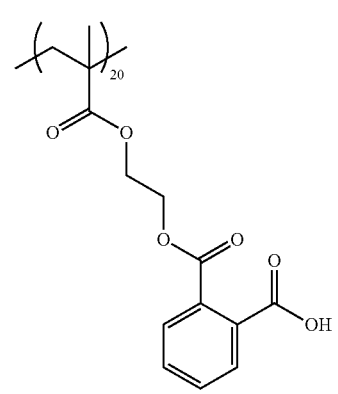
Mw: 28000
(7)
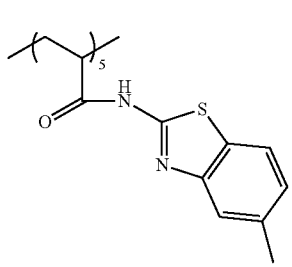
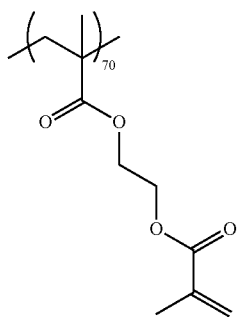
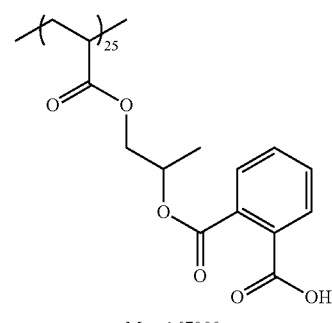
Mw: 167000
(8)
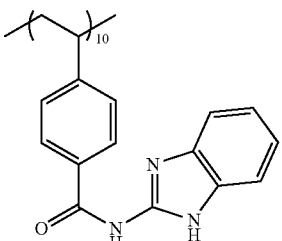
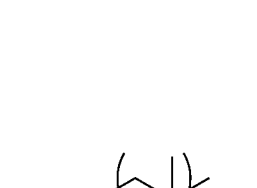
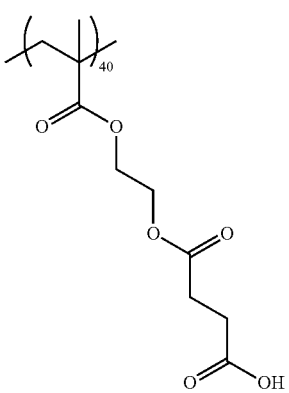
Mw: 105000
(9)
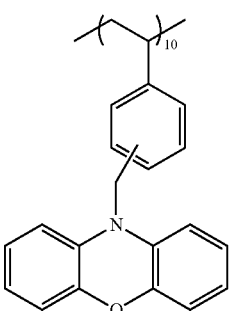
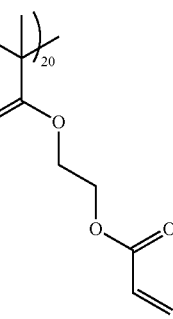
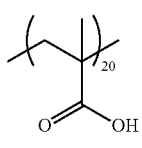
Mw: 16400
β: Repeating structure of polymethyl methacrylate oligomer having a methacryloyl group at one end, AA-6 (Mn-6000, manufactured by Toagosei Co., Ltd.)

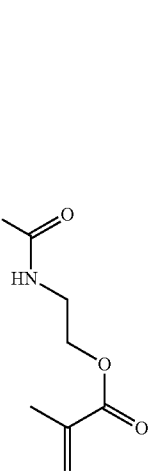
(10)
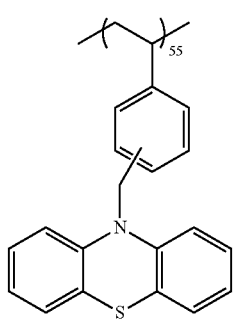
Mw: 75600
(11)
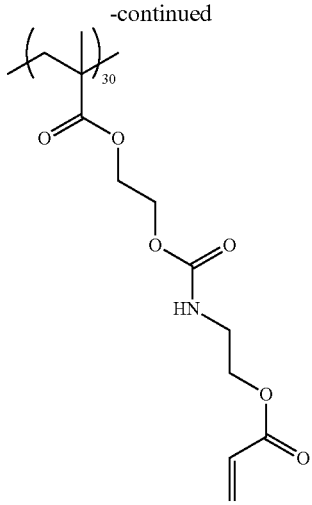
Mw: 24300
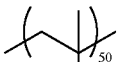
Mw: 11000
(12)
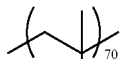
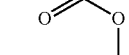
(13)
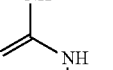
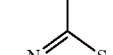
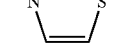
Mw: 2100

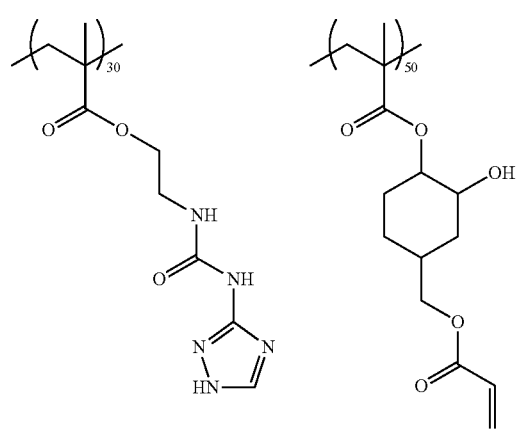
(14)
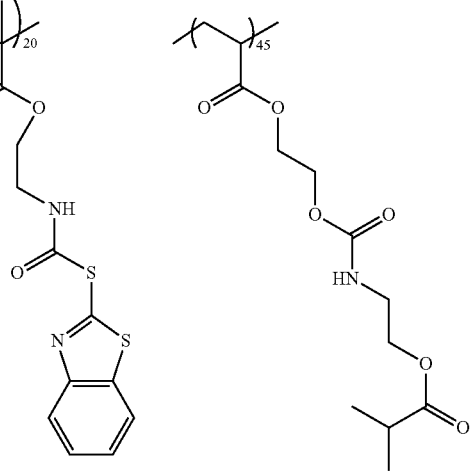
(16)
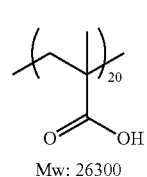
Mw: 26300
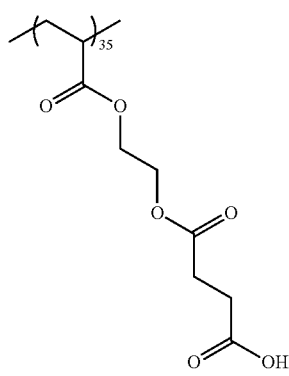
Mw: 30100
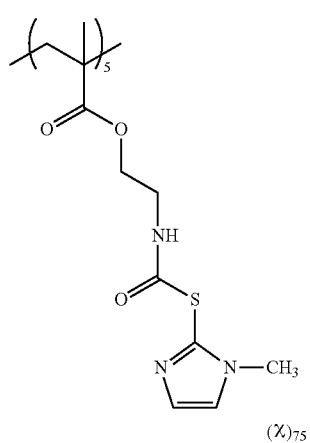
Mw: 251000
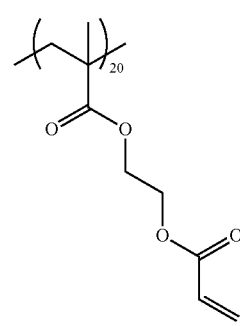
(15)
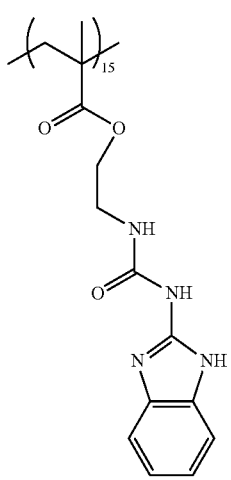
(17)
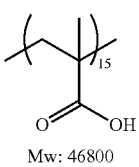
Mw: 46800
χ: Repeating structure of UM-9001 manufactured by Toa-gosei Co., Ltd.

(18)
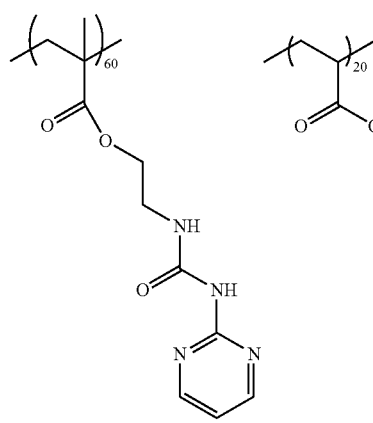
(20)
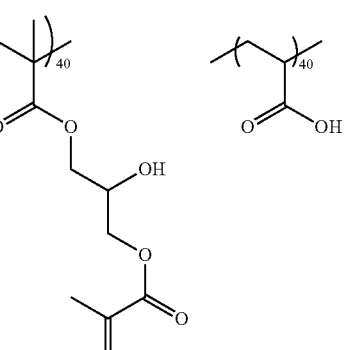
Mw: 17500
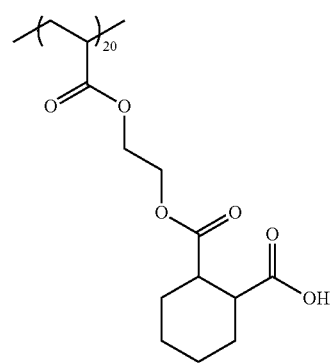
Mw: 8600
(21)
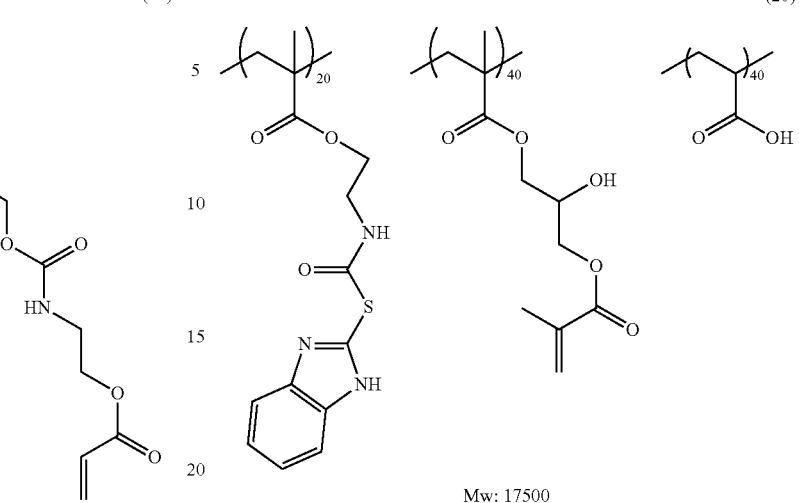
Mw: 36200
δ: Repeating structure of UC-3920 manufactured by Toagosei Co., Ltd.
(19)
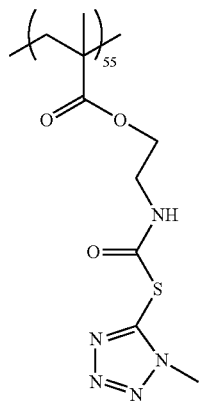
Mw: 46200
(22)
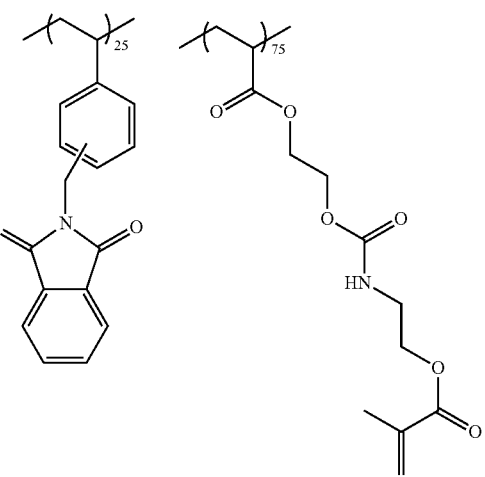
Mw: 27900
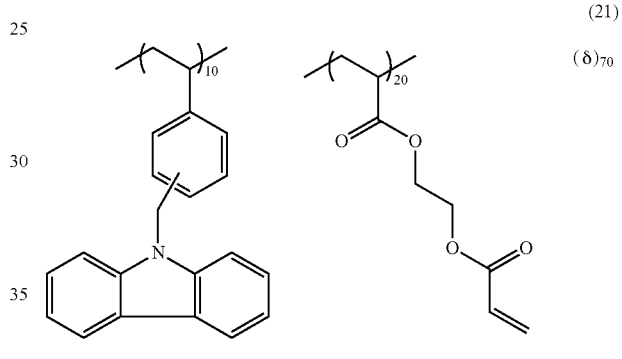

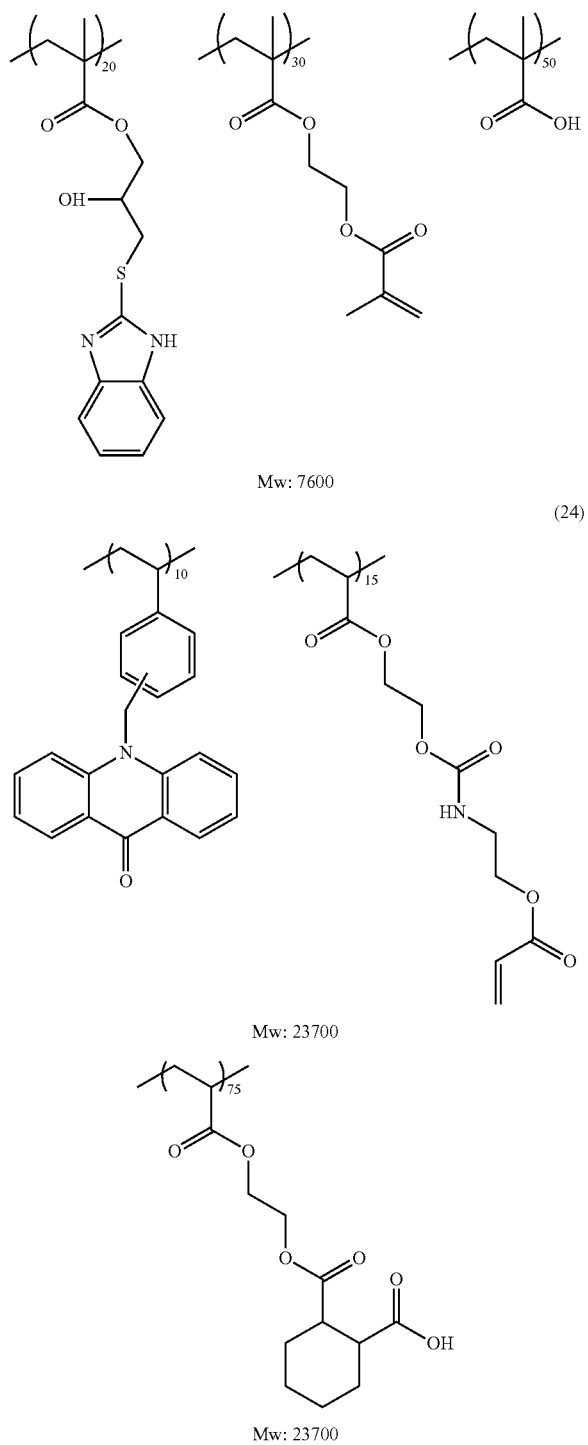

According to the invention, the content of the specific compound in the pigment-dispersed composition is preferably 0.001 to 10 times, more preferably 0.01 to 8 times, even more preferably 0.1 parts to 10 times, and most preferably 0.3 parts to 2 times, based on the mass of the pigment. When the content is within the above-described range, the pigment may be dispersed more efficiently, and prevention of decoloration, exposure sensitivity, adhesiveness to support and pattern forming properties (properties for forming a desired tapered or rectangular-shaped cross-section) may be effectively improved.

(B) Pigment

The pigment-dispersed composition of the invention contains at least one pigment. It is preferable to use pigment as a colorant, from the viewpoints of thermal fastness, light fastness and the like.

As the pigment that may be contained in the curable composition of the invention, a variety of conventionally known inorganic pigments and organic pigments may be used, and those of high transmittance are preferred.

Examples of the inorganic pigments include metallic compounds represented by metal oxides, metal complex salts or the like, and specifically, there may be mentioned oxides of metals such as iron, cobalt, aluminum, cadmium, lead, copper, titanium, magnesium, chromium, zinc, and antimony, and complex oxides of the aforementioned metals.

Examples of the organic pigments include:
C.I. Pigment Yellow 11, 24, 31, 53, 83, 93, 99, 108, 109, 110, 138, 139, 147, 150, 151, 154, 155, 167, 180, 185, 199;
C.I. Pigment Orange 36, 38, 43, 71;
C.I. Pigment Red 81, 105, 122, 149, 150, 155, 171, 175, 176, 177, 209, 220, 224, 242, 254, 255, 264, 270;
C.I. Pigment Violet 19, 23, 32, 39;
C.I. Pigment Blue 1, 2, 15, 15:1, 15:3, 15:6, 16, 22, 60, 66;
C.I. Pigment Green 7, 36, 37;
C.I. Pigment Brown 25, 28;
C.I. Pigment Black 1, 7; and
carbon black and the like mentioned.

According to the invention, those having a basic N atom in the structural formula of the pigment may be particularly preferably used. These pigments having a basic N atom exhibit good dispersibility in the curable composition of the invention. The reason has not been sufficiently clarified, however it is suspected that good affinity of the polymer component with the pigment exerts influence.

As the pigment that may be preferably used in the invention, the following may be mentioned. However, the invention is not intended to be limited to these.

C.I. Pigment Yellow 11, 24, 108, 109, 110, 138, 139, 150, 151, 154, 167, 180, 185,
C.I. Pigment Orange 36, 71,
C.I. Pigment Red 122, 150, 171, 175, 177, 209, 224, 242, 254, 255, 264,
C.I. Pigment Violet 19, 23, 32,
C.I. Pigment Blue 15:1, 15:3, 15:6, 16, 22, 60, 66,
C.I. Pigment Black 1

These organic pigments may be used alone, or in various combinations so as to increase the color purity. For example, in the case of using the curable composition of the invention for the formation of colored pattern of a color filter, it is preferable to use the pigments in combination so as to increase the color purity of the colored pattern.

Specific examples of pigment combinations will be presented below. For example, as the red pigment, an anthraquinone pigment, a perylene pigment or a diketopyrrolopyrrole pigment may be used alone, or a mixture of at least one of them with a disazo yellow pigment, an isoindoline yellow pigment, a quinophthalone yellow pigment or a perylene red pigment may be mentioned. For example, as the anthraquinone pigment, C.I. pigment Red 177 may be mentioned; as the perylene pigment, C.I. Pigment Red 155 and C.I. Pigment Red 224 may be mentioned; and as the diketopyrrolopyrrole pigment, C.I. Pigment Red 254 may be mentioned. From the viewpoint of color reproducibility, mixtures with C.I. Pigment Yellow 139 are preferred. The mass ratio of the red pigment and the yellow pigment is preferably 100/100 to 100/5. If the ratio is set to 100:5 or less, it is easy to suppress the light transmittance at 400 nm to 500 nm, and thus the color purity may be further enhanced. Also, if the ratio is set to 100/100 or less, the main wavelength is suppressed from being a short wavelength, and the difference from the NTSC target colors may be decreased. In particular, an optimal range of the above-described mass ratio is from 100/50 to 100/10. In addition, in the case of a combination of red pigments, the chromaticity may also be adjusted.

As the green pigment, a halogenated phthalocyanine pigment may be used alone, or a mixture of this with a disazo yellow pigment, a quinophthalone yellow pigment, an azomethine yellow pigment or an isoindoline yellow pigment may be used. For example, preferred examples of such mixture include mixtures of C.I. Pigment Green 7, 36 or 37 with C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185. The mass ratio of the green pigment and the yellow pigment is preferably 100/150 to 100/5. A particularly preferable range of the mass ratio is from 100/120 to 100/30.

As the blue pigment, a phthalocyanine pigment may be used alone, or a mixture of this with a dioxazine purple pigment may be used. For example, mixtures of C.I. Pigment Blue 15:6 with C.I. Pigment Violet 23 or 37 are preferred. The mass ratio of the blue pigment and the purple pigment is preferably 100/30 to 100/0, and more preferably 100/10 or greater.

Furthermore, as the pigment used in the case of using the curable composition of the invention in the formation of the black matrix of a color filter, carbon, titanium-carbon, iron oxide and titanium oxide are used alone or as mixtures, and a combination of carbon and titanium-carbon is preferred. The mass ratio of carbon and titanium-carbon is preferably in the range of 100/60 to 100/0.

The primary particle size of the pigment is, in the case of using the pigment for color filter, preferably 100 nm or less from the viewpoint of color irregularities or contrast, and is preferably 5 nm or more from the viewpoint of dispersion stability. The primary particle size of the pigment is more preferably 5 to 75 nm, more preferably 5 to 55 nm, and particularly preferably 5 to 35 nm.

The primary particle size of the pigment may be measured by a known method such as electron microscopy.

Inter alia, the pigment is preferably a pigment selected from anthraquinone pigments, azomethine pigments, benzylidene pigments, cyanine pigments, diketopyrrolopyrrole pigments and phthalocyanine pigments.

The content of the pigment in the pigment-dispersed composition is preferably 30% by mass or more, and more preferably in the range of 40 to 95% by mass, based on the total solids fraction of the composition, from the viewpoint of securing high tinctorial strength, for example, from the viewpoints of securing high color density and contrast in the case of producing a color filter.

In addition, for the pigment-dispersed composition of the invention, a dye may be used in combination within the scope of not impairing the effect of the invention. The dye is not particularly limited, and dyes that are conventionally known for the use in color filters may be used. For example, the colorants disclosed in JP-A Nos. 64-90403, 64-91102, 1-94301 and 6-11614, Japanese Patent No. 2592207, U.S. Pat. Nos. 4,808,501, 5,667,920 and 5,059,500, JP-A Nos. 5-333207, 6-35183, 6-51115, 6-194828, 8-211599, 4-249549, 10-123316, 11-302283, 7-286107, 2001-4823, 8-15522, 8-29771, 8-146215, 11-343437, 8-62416, 2002-14220, 2002-14221, 2002-14222, 2002-14223, 8-302224, 8-73758, 8-179120 and 8-151531, may be used.

As for the chemical structure of the dye, pyrazolazo dyes, anilinoazo dyes, triphenylmethane dyes, antraquinone dyes, anthrapyridone dyes, benzylidene dyes, oxonol dyes, pyrazolotriazolazo dyes, pyridonazo dyes, cyanine dyes, phenothiazine dyes, pyrrolopyrazolazomethine dyes, xanthene dyes, phthalocyanine dyes, penzopyran dyes, indigo dyes and the like may be used.

(C) Solvent

The pigment-dispersed composition of the invention contains at least one solvent. When a solvent is used together with the (A) resin having a pendant group containing a nitrogen-containing heterocyclic ring and an ethylenic unsaturated double bond in the main chain skeleton, and the (B) pigment, a pigment-dispersed composition having the pigment well dispersed may be produced.

The solvent to be used is not particularly limited as long as the solvent satisfies the solubility for the respective components of the composition, or the coating properties of the curable composition, however it is preferable that the solvent is selected in consideration of safety.

As specific examples of the solvent, esters such as ethyl acetate, n-butyl acetate, isobutyl acetate, amyl formate, isoamyl acetate, butyl propionate, isopropyl butyrate, ethyl butyrate, butyl butyrate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate and ethyl 2-oxobutanoate;

ethers such as diethylene glycol dimethyl ether, tetrahydrofuran, ethylene glycol monomethyl ether, ethylene glycol monoethyl ether, methyl cellosolve acetate (ethylene glycol monomethyl ether acetate), ethyl cellosolve acetate (ethylene glycol monoethyl ether acetate), diethylene glycol monomethyl ether, diethylene glycol monoethyl ether, diethylene glycol monobutyl ether, diethylene glycol monoethyl ether acetate, diethylene glycol monobutyl ether acetate, propylene glycol methyl ether, propylene glycol methyl ether acetate, propylene glycol ethyl ether acetate and propylene glycol propyl ether acetate;

ketones such as methyl ethyl ketone, cyclohexanone, 2-heptanon and 3-heptanone; and aromatic hydrocarbons such as toluene and xylene; are preferred.

Among these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, propylene glycol monomethyl ether acetate (PGMEA) and the like are more preferred.

The content of solvent in the pigment-dispersed composition of the invention is preferably 10 to 98% by mass, more preferably 30 to 95% by mass, and most preferably 50 to 90% by mass. When the content of the solvent is within the above-described range, dispersion of the pigment may be performed more uniformly, and it is also advantageous from the viewpoint of the dispersion stability after dispersion.

The pigment-dispersed composition of the invention is preferably prepared through a mixing/dispersion process of mixing (A) a resin having a pendant group containing a nitrogen-containing heterocyclic ring and an ethylenic unsaturated double bond in the main chain skeleton, (B) a pigment, and optionally other components such as dispersant, with (C) a solvent, and mixing and dispersing the components using various mixers or dispersing machines. In addition, the mixing/dispersion process preferably includes kneading and dispersion, and a microdispersion treatment performed subsequently thereto, however it is also possible to omit the kneading and dispersion process.

<Curable Composition>

The curable composition of the invention is composed using a pigment-dispersed composition containing at least (A) a resin having a pendant group containing a nitrogen-containing heterocyclic ring and an ethylenic unsaturated double bond in the main chain skeleton, (B) a pigment, and (C) a solvent, and (D) a photopolymerization initiator. The curable composition of the invention is preferably composed further using (E) a photopolymerizable compound, and if necessary, may be composed using other components.

As for the curable composition of the invention, when the curable composition contains the specific compounds according to the invention, the pigment is efficiently dispersed, and regardless of the amount of pigment, good storage stability is obtained, as anticipated in the above. Thus, diffusion of the pigment into the developer solution or coating solution may be suppressed, and decoloration is prevented. At the same time, the density of unsaturated bonds is increased, and the amount of double bonds in the film which is formed from the curable composition is also increased. Also, the exposure sensitivity is enhanced to a large extent, whereas the infiltration of the developer solution at unexposed, uncured parts is improved, and thus removability by developer may be increased. It is therefore conceived that a good pattern yielding a desired cross-sectional shape (particularly, tapered or rectangular-shaped) is obtained, and favorable adhesiveness to support is obtained.

Among the components constituting the curable composition of the invention, details of the (A) resin having a pendant group containing a nitrogen-containing heterocyclic ring and an ethylenic unsaturated double bond in the main chain skeleton, (B) pigment, and (C) solvent, are the same as in the case of the pigment-dispersed composition described above, and preferred embodiments are also the same.

The content of the (A) resin having a pendant group containing a nitrogen-containing heterocyclic ring and an ethylenic unsaturated double bond in the main chain skeleton in the curable composition is preferably 1 to 300% by mass, more preferably 3 to 100% by mass, and even more preferably 5 to 50% by mass, based on the pigment. If the content is within the above-described range, the pigment may be dispersed with good efficiency, and the prevention of decoloration, exposure sensitivity, adhesiveness to support and pattern forming properties (the properties of forming a desired tapered or rectangular-shaped cross-section) may be improved effectively.

The content of the pigment in the curable composition is preferably 20% by mass or more, more preferably 30 to 95% by mass, and most preferably 40 to 90% by mass, based on the total solids fraction of the composition. When the content of the pigment is within the above-described range, it is effective in securing high tinctorial strength, for example, in the case of producing a color filter.

Furthermore, the proportion occupied by the solvent in the curable composition is preferably 20 to 90% by mass, more preferably 30 to 85% by mass, and most preferably 40 to 80% by mass. When the amount of solvent is within the above-described range, it is advantageous from the viewpoints of coating properties and storage stability.

Hereinafter, the components other than the constituents (A) to (C) of the curable composition of the invention will be respectively described in detail.

(D) Photopolymerization Initiator

The curable composition of the invention contains at least one photopolymerization initiator. The photopolymerization initiator is a compound which is decomposed by light, and initiates and promotes the polymerization of the (A) resin having a pendant group containing a nitrogen-containing heterocyclic ring and an ethylenic unsaturated double bond in the main chain skeleton according to the invention, and (E) a photopolymerizable compound that will be described later. The photopolymerization initiator is preferably a compound having an absorption in the wavelength region of 300 to 500 nm.

Also, the photopolymerization initiator may be used individually, or may be used in combination of two or more species.

Examples of the photopolymerization initiator include an organic halogenated compound, an oxydiazole compound, a carbonyl compound, a ketal compound, a benzoin compound, an acridine compound, an organic peroxide compound, an azo compound, a coumarin compound, an azide compound, a metallocene compound, a hexaarylbiimidazole compound, an organic borate compound, a disulfone compound, an oxime compound, an onium salt compound, an acylphosphine compound, an alkylamino compound, and the like.

Hereinafter, these compounds will be respectively described in detail.

Specific examples of the organic halogenated compound include the compounds described in Wakabayashi et al., "Bull. Chem. Soc. Japan" 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339, M. P. Hutt, "Journal of Heterocyclic Chemistry" 1 (No. 3), (1970)", and the like. In particularly, an oxazole compound substituted with a trihalomethyl group, and an s-triazine compound may be mentioned.

The s-triazine compound is suitably an s-triazine derivative in which at least one mono-, di- or trihalogen-substituted methyl group is bound to an s-triazine ring, and specific examples include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like.

Examples of the oxydiazole compound include 2-trichloromethyl-5-styryl-1,3,4-oxodiazole, 2-trichloromethyl-5-(cyanostyryl)-1,3,4-oxodiazole, 2-trichloromethyl-5-(naphtho-1-yl)-1,3,4-oxodiazole, 2-trichloromethyl-5-(4-styryl)styryl-1,3,4-oxodiazole, and the like.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexyl phenyl ketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl)ketone and 2-benzyl-2-dimethylamino-4-morpholinobutyrophenone; thioxantone derivatives such as thioxantone, 2-ethylthioxantone, 2-isopropylthioxantone, 2-chlorothioxantone, 2,4-dimethylthioxantone, 2,4-diethylthioxantone and 2,4-diisopropylthioxantone; benzoic acid ester derivatives such as ethyl p-dimethylaminobenzoate and ethyl p-diethylaminobenzoate; and the like.

Examples of the ketal compound include a benzyl methyl ketal, benzyl-β-methoxyethyl ethyl acetal, and the like.

Examples of the benzoin compound include m-benzoin isopropyl ether, benzoin isobutyl ether, benzoin methyl ether, methyl-o-benzoyl benzoate, and the like.

Examples of the acridine compound include 9-phenylacridine, 1,7-bis(9-acridinyl)heptane, and the like.

Examples of the organic peroxide compound include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroxyperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-bis(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, bis(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, 3,3',4,4'-tetrakis(t-butylperoxycarbonyl)benzophenone, 3,3',4,4'-tetrakis(t-hexylperoxycarbonyl)benzophenone, 3,3',4,4'-tetrakis(p-isopropylcumylperoxycarbonyl)benzophenone, carbonylbis(t-butylperoxy dihydrogen diphthalate), carbonylbis(t-hexylperoxy dihydrogen diphthalate), and the like.

Examples of the azo compound include the azo compounds described in JP-A No. 8-108621, and the like.

Examples of the coumarin compound include 3-methyl-5-amino-((s-triazin-2-yl)amino)-3-phenylcoumarin, 3-chloro-5-diethylamino-((s-triazin-2-yl)amino)-3-phenylcoumarin, 3-butyl-5-dimethylamino-((s-triazin-2-yl)amino)-3-phenylcoumarin, and the like.

Examples of the azide compound include the organic azide compounds described in U.S. Pat. Nos. 2,848,328, 2,852,379 and 2,940,853, 2,6-bis(4-azidobenzylidene)-4-ethylcyclohexanone (BAC-E), and the like.

Examples of the metallocene compound include the various titanocene compounds described in JP-A Nos. 59-152396, 61-151197, 63-41484, 2-249, 2-4705 and 5-83588, for example, di-cyclopentadienyl-Ti-di-phenyl, di-cyclopentadienyl-Ti-bis-2,6-dilfluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl, the iron-arene complexes described in JP-A No. 1-304453 and 1-152109, and the like.

Examples of the hexaarylbiimidazole compound include various compounds described in JP-B No. 6-29285, U.S. Pat. Nos. 3,479,185, 4,311,783, 4,622,286 and the like, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetrakis(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and the like.

For the organic borate compound, specific examples include the organic boric acid salts described in JP-A Nos. 62-143044, 62-150242, 9-188685, 9-188686, 9-188710, 2000-131837 and 2002-107916, Japanese Patent No. 2764769, Japanese Patent Application No. 2000-310808, and the like, and in Kunz, Martin, "Rad Tech' 98. Proceeding Apr. 19-22, 1998, Chicago"; the organic boron-sulfonium complexes or organic boron-oxosulfonium complexes described in JP-A Nos. 6-157623, 6-175564 and 6-175561; the organic boron-iodonium complexes described in JP-A Nos. 6-175554 and 6-175553; the organic boron-phosphonium complexes described in JP-A No. 9-188710; the organic boron-transition metal coordinate complexes described in JP-A Nos. 6-348011, 7-128785, 7-140589, 7-306527 and 7-292014; and the like.

Examples of the disulfone compound include the compounds described in JP-A No. 61-166544, Japanese Patent Application No. 2001-132318, and the like.

Examples of the oxime compound include the compounds described in J. C. S. Perkin II (1979) 1653-1660, J. C. S. Perkin II (1979) 156-162, Journal of Photopolymer Science and Technology (1995) 202-232 and in JP-A No. 2000-66385; the compounds described in JP-A No. 2000-80068 and Japanese Patent Application National Publication (Laid-Open) No. 2004-534797; and the like.

Examples of the onium salt compound include the diazonium salts described in S. I. Schlesinger, Photogr. Sci. Eng., 18, 387 (1974) and T. S. Bal et al., Polymer, 21, 423 (1980); the ammonium salts described in U.S. Pat. No. 4,069,055, JP-A No. 4-365049 and the like; the phosphonium salts described in U.S. Pat. Nos. 4,069,055 and 4,069,056; the iodonium salts described in European Patent (EP) No. 104, 143, U.S. Pat. Nos. 339,049 and 410,201, JP-A Nos. 2-150848 and 2-296514; and the like.

An iodonium salt that may be suitably used in the invention is a diaryliodonium salt, and from the viewpoint of stability, a diaryliodonium salt substituted with two or more electron-donating groups such as an alkyl group, an alkoxy group or an aryloxy group, is preferred. As another preferred form of the sulfonium salt, an iodonium salt in which one of the substituents of a triarylsulfonium salt has a coumarin or anthraquinone structure, and which has absorption at 300 nm or greater, and the like are preferred.

As the sulfonium salt that may be suitably used in the invention, there may be mentioned the sulfonium salts described in European Patent Nos. 370,693, 390,214, 233, 567, 297,443 and 297,442, U.S. Pat. Nos. 4,933,377, 161, 811, 410,201, 339,049, 4,760,013, 4,734,444 and 2,833,827, German Patent Nos. 2,904,626, 3,604,580 and 3,604,581. From the viewpoint of stability and sensitivity, a sulfonium salt substituted with an electron-withdrawing group is preferred. The electron-withdrawing group is preferably a group having a Hammett equation greater than 0. Preferred electron-withdrawing groups include a halogen atom, carboxylic acid and the like.

Furthermore, as another preferable sulfonium salt, there may be mentioned a sulfonium salt in which one of the substituents of a triarylsulfonium salt has a coumarin or anthraquinone structure, and which has absorption at 300 nm or greater. As still another preferable sulfonium salt, there may be mentioned a sulfonium salt in which a triarylsulfonium salt is substituted with an aryloxy group or an arylthio group, and which has absorption at 300 nm or greater.

Furthermore, as the onium salt compound, onium salts such as the celenonium salts described in J. V. Crivello et al., Macromolecules, 10(6), 1307 (1977) and J. V. Crivello et al., J. Polymer Sci., Polymer Chem. Ed., 17, 1047 (1979), and the arsonium salts as described in C. S. Wen et al., Teh, Proc. Conf. Rad. Curing ASIA, p 478, Tokyo, October (1988) may also be used.

Examples of the acylphosphine compound include Irgacure 819, Darocur 4265 and Darocur TPO manufactured by Ciba Specialty Chemicals, Inc., and the like.

Examples of the alkylamino compound include the compounds having a dialkylaminophenyl group or the alkylamine compounds described in Paragraph number 0047 of JP-A No. 9-281698, in JP-A Nos. 6-19240 and 6-19249, and the like. Specifically, the compounds having a dialkylaminophenyl group include compounds such as ethyl p-dimethylaminobenzoate, and dialkylaminophenyl carbaldehyde such as p-diethylaminobenzcarbaldehyde or 9-julolidylcarbaldehyde. The alkylamine compounds include triethanolamine, diethanolamine, triethylamine and the like.

The (D) photopolymerization initiator used in the invention is preferably at least one compound selected from the group consisting of triazine compounds, alkylamino compounds, benzyl dimethyl ketal compounds, α-hydroxyketone compounds, α-aminoketone compounds, acylphosphine compounds, phosphine oxide compounds, metallocene compounds, oxime compounds, biimidazole compounds, onium compounds, benzothiazole compounds, benzophenone compounds, acetophenone compounds and derivatives thereof, cyclopentadiene-benzene-iron complexes and salts thereof, halomethyloxadiazole compounds and 3-aryl-substituted coumarin compounds, from the viewpoint of exposure sensitivity.

More preferably, at least one compound selected from the group consisting of triazine compounds, alkylamino compounds, α-aminoketone compounds, acylphosphine compounds, phosphine oxide compounds, oxime compounds, biimidazole compounds, onium compounds, benzophenone compounds and acetophenone compounds is more preferred, and at least one compound selected from the group consisting of triazine compounds, alkylamino compounds, oxime compounds and biimidazole compounds is even more preferred.

The content of the (D) photopolymerization initiator in the curable composition is preferably 0.1 to 50% by mass, more preferably 0.5 to 30% by mass, and particularly preferably 1 to 20% by mass, based on the total solids fraction of the composition. In particular, in the case of using the curable composition of the invention for forming the colored pattern of a color filter, the content of the (D) photopolymerization initiator is preferably 1 to 40% by mass, more preferably 2 to 30% by mass, and even more preferably 3 to 20% by mass, based on the total solids fraction contained in the curable composition, from the viewpoints of photosensitivity, adhesiveness to support and the degree of curing.

(E) Photopolymerizable Compound

The curable composition of the invention preferably contains a compound having an ethylenic unsaturated double bond as a photopolymerizable compound.

The "compound having an ethylenic unsaturated double bond" that may be used in the invention is an addition polymerizable compound having at least one ethylenic unsaturated double bond, and is selected from compounds having at least one, preferably two or more, terminal ethylenic unsaturated bonds. The family of such compounds is widely known in the pertinent industrial field, and these may be used for the invention without any particular limitation. Details of these compounds are the same as those for the (A) resin having a pendant group containing a nitrogen-containing heterocyclic ring and an ethylenic unsaturated double bond in the main chain skeleton, except that there are no limits in the molecular weight, and preferred embodiments also are the same.

Furthermore, the photopolymerizable compound according to the invention may become, when polymerized, identical to the (A) resin product having a pendant group containing a nitrogen-containing heterocyclic ring and an ethylenic unsaturated double bond in the main chain skeleton, or may be different from the resin product. Moreover, the photopolymerizable compound according to the invention may be used individually, or in combination of two or more species.

The content of the (E) photopolymerizable compound is preferably 1 to 90% by mass, more preferably 5 to 80% by mass, and even more preferably 10% to 70% by mass, based on the total solids fraction of the curable composition of the invention. Particularly in the case of using the curable composition of the invention in the formation of the colored pattern of a color filter, the content of the (E) photopolymerizable compound is preferably 5 to 50% by mass, more preferably 7 to 40% by mass, and even more preferably 10 to 35% by mass, based on the total solids fraction of the curable composition of the invention, from the viewpoints of further improving photosensitivity, adhesiveness to support, and the degree of curing.

In the case of using the (A) resin having a pendant group containing a nitrogen-containing heterocyclic ring in combination with an ethylenic unsaturated double bond in the main chain skeleton (specific resin according to the invention) and (E) a photopolymerizabe compound other than the (A) specific resin according to the invention, the content ratio ((A)/(E); mass ratio) is preferably 100/1 to 1/100, more preferably 50/1 to 1/50, and even more preferably 10/1 to 1/10, from the viewpoints of sensitivity and storage stability.

Next, other components that may be further used in the curable composition of the invention will be described.

(F) Sensitizer

The curable composition of the invention may contain (F) a sensitizer, for the purpose of enhancing the efficiency of generating radicals from the (D) photopolymerization initiator and lengthening the sensitizing wavelength. The sensitizer that may be used in the invention is preferably one which sensitizes the above-described (D) photopolymerization initiator by the mechanism of electron transfer or the mechanism of energy transfer.

As the sensitizer that may be used in the invention, a compound which belongs to the compound families listed below, and has an absorption wavelength in the wavelength region of 300 nm to 450 nm, may be mentioned.

Preferred examples of the sensitizer include those which belong to the following compound families, and have an absorption wavelength in the region of 330 nm to 450 nm.

For example, polynuclear aromatics (for example, phenanthrene, anthracene, pyrene, perylene, triphenylene, 9,10-dialkoxyanthracene), xanthenes (for example, fluorescein, eosin, erythrosin, rhodamine B, rose bengal), thioxantones (isopropylthioxantone, diethylthioxantone, chlorothioxantone), cyanines (for example, thiacarbocyanin, oxacarbocyanin), merocyanines (for example, merocyanine, carbomerocyanine), phthalocyanines, thiazines (for examples, thionin, methylene blue, toluidine blue), acridines (for examples, acridine orange, chloroflavin, acriflavin), anthraquinones (for example, anthraquinone), squaryliums (for example, squarylium), acridine orange, coumarins (for example, 7-diethylamino-4-methylcoumarin), ketocoumarin, phenothiazines, phenazines, styrylbenzens, azo compounds, dimethylmethane, triphenylmethane, distyrylbenzens, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxantone and Michler's ketone, heterocyclic compounds such as N-aryloxazolidinone, and the like may be mentioned.

Furthermore, the compounds described in EP No. 568,993, U.S. Pat. Nos. 4,508,811 and 5,227,227, JP-A No. 2001-125255 and 11-271969, and the like are also used.

More preferred examples of the sensitizer include compounds represented by the following formulas (i) to (iv).

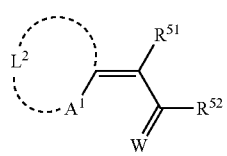

(i)

In the formula (1), $A^1$ represents a sulfur atom or $NR^{50}$, wherein $R^{50}$ represents an alkyl group or an aryl group; $L^2$ represents a non-metal atomic group which forms a basic nucleus of the dye together with adjacent $A^1$ and the adjacent carbon atom; and $R^{51}$ and $R^{52}$ each independently represent a hydrogen atom or a monovalent non-metal atomic group, or $R^{51}$ and $R^{52}$ may also be bound to each other to form an acidic nucleus of the dye. W represents an oxygen atom or a sulfur atom.

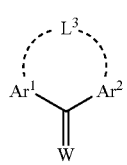

(ii)

In the formula (ii), $Ar^1$ and $Ar^2$ each independently represent an aryl group, and are linked to each other through the bonding of -$L^3$-. Here, $L^3$ represents —O— or —S—. W has the same meaning as defined for the formula (1).

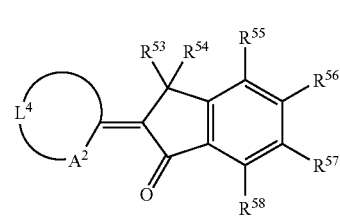

(iii)

In the formula (iii), $A^2$ represents a sulfur atom or $NR^{59}$; $L^4$ represents a non-metal atomic group which forms a basic nucleus of the colorant together with adjacent $A^2$ and the adjacent carbon atoms; $R^{53}$, $R^{54}$, $R^{55}$, $R^{56}$, $R^{57}$ and $R^{58}$ each independently represent a monovalent non-metal atomic group; and $R^{59}$ represents an alkyl group or an aryl group.

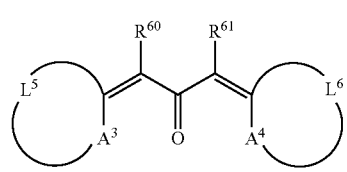

(iv)

In the formula (iv), $A^3$ and $A^4$ each independently represent —S— or —$NR^{62}$— or —$NR^{63}$—, wherein $R^{62}$ and $R^{63}$ each independently represent a substituted or unsubstituted alkyl group, or a substituted or unsubstituted aryl group; $L^5$ and $L^6$ each independently represent a non-metal atomic group which forms a basic nucleus of the dye together with adjacent $A^3$ or $A^4$ and the adjacent carbon atom; and $R^{60}$ and $R^{61}$ are each independently a monovalent non-metal atomic group, or are bound to each other and may form an aliphatic or aromatic ring.

As a preferable sensitizer that may be contained in the curable composition of the invention, there may be mentioned, in addition to the above-described compounds, at least one selected from the compounds represented by the following formulas (IV) to (VI).

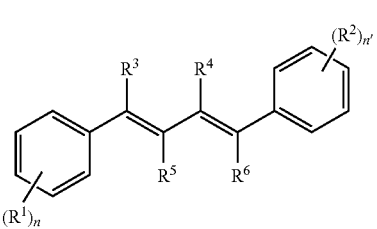

(IV)

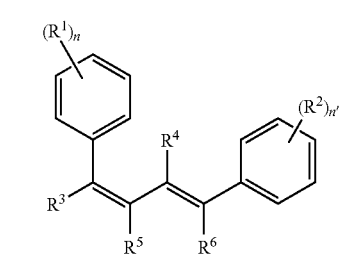

(V)

In the formula (IV) or formula (V), $R^1$ and $R^2$ each independently represent a monovalent substituent; $R^3$, $R^4$, $R^5$ and $R^6$ each independently represent a hydrogen atom or a monovalent substituent. n represents an integer from 0 to 5, and n' represents an integer from 0 to 5, however n and n' cannot be zero at the same time. If n is 2 or greater, $R^1$ which exists in plurality, may be identical with or different from each other. If n' is 2 or greater, $R^2$ which exists in plurality, may be identical with or different from each other.

The compound represented by the formula (IV) is preferably a compound represented by the following formula (IV-1), from the viewpoints of sensitivity, and of tinctorial properties in the case of containing a pigment.

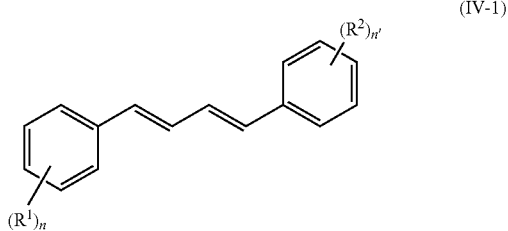

(IV-1)

In the formula (IV-1), $R^1$ and $R^2$ each independently represent a monovalent substituent. n represents an integer from 0 to 5, and n' represents an integer from 1 to 5. If n is 2 or greater, $R^1$ which exists in plurality, may be identical with or different from each other. If n' is 2 or greater, $R^2$ which exists in plurality, may be identical with or different from each other.

In the formula (IV-1), the monovalent substituent represented by $R^1$ and $R^2$ has the same meaning as defined for the monovalent substituent represented by $R^1$ and $R^2$ in the above-described formula (IV), and the preferred scope is also the same.

The compound represented by formula (IV) or formula (V) is preferably a compound having a molar extinction coefficients at a wavelength of 365 nm of 500 $mol^{-1} \cdot L \cdot cm^{-1}$ or greater, more preferably a compound having an ε at a wavelength of 365 nm of 3000 $mol^{-1} \cdot L \cdot cm^{-1}$ or greater, and most preferably a compound having an ε at a wavelength of 365 nm of 20000 $mol^{-1} \cdot L \cdot cm^{-1}$ or greater. When the value of the molar extinction coefficient ε at each wavelength is within the above-described range, the sensitivity enhancing effect is high and preferable from the viewpoint of the efficiency of light absorption.

Here, the molar extinction coefficient ε is obtained by preparing a sample from a dye solution in 1-methoxy-2-propanol adjusted to a concentration of 0.01 g/l, measuring the transmission spectrum of the sample at 365 nm, and determining the absorbance of the sample from the UV-visible absorption spectrum. For the measuring apparatus, a spectrophotometer of UV-Vis-MR Spectrophotometer Cary 5G type manufactured by Varian, Inc. was used.

Specific preferred examples of the compound represented by formula (IV) or formula (V) will be illustrated in the following, however the invention is not intended to be limited to these.

In addition, according to the invention, the chemical formulas may also be described by means of simplified structural formulas, and in particular, a solid line without any specified element or substituent means a hydrocarbon group. Also, in the following specific examples, Me represents a methyl group, Et represents an ethyl group, Bu represents a butyl group, n-Bu represents an n-butyl group, and Ph represents a phenyl group.

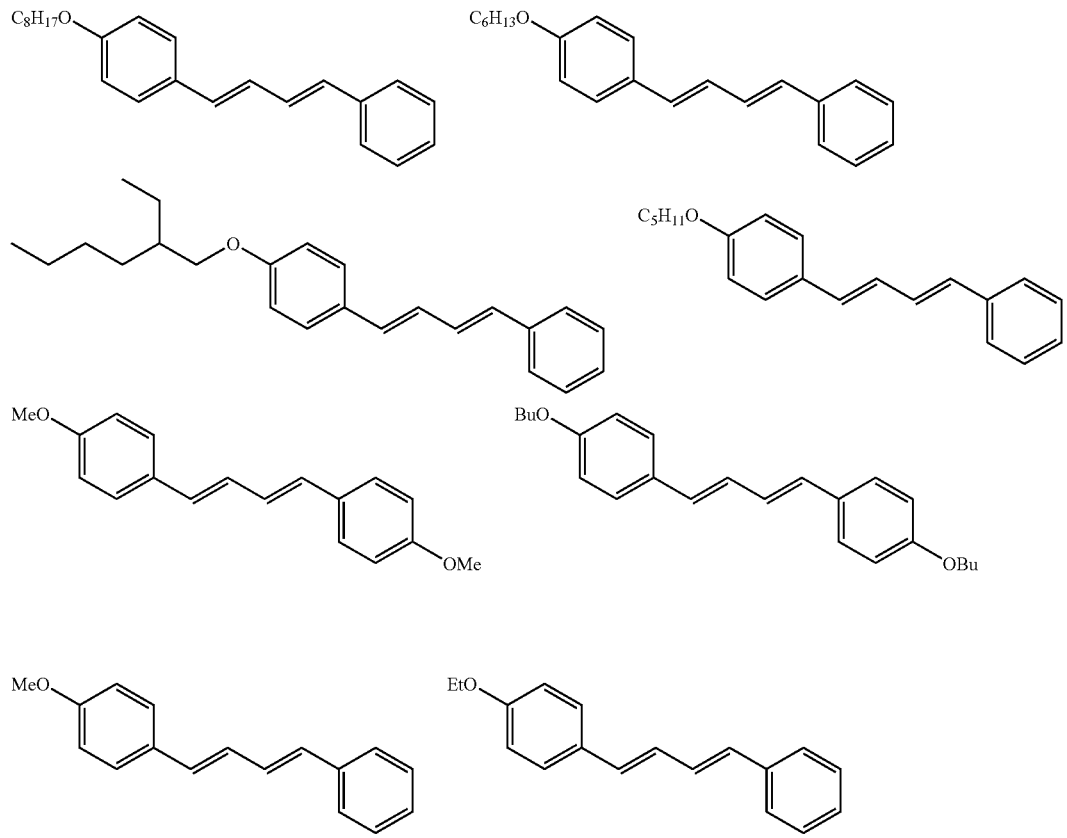

61
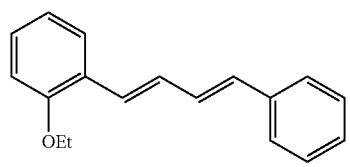 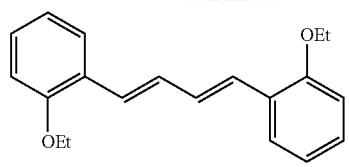 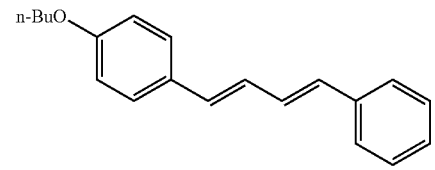
62
-continued
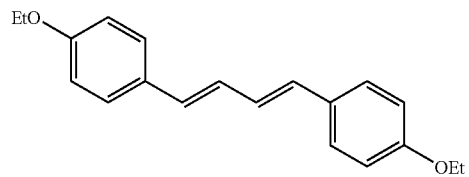
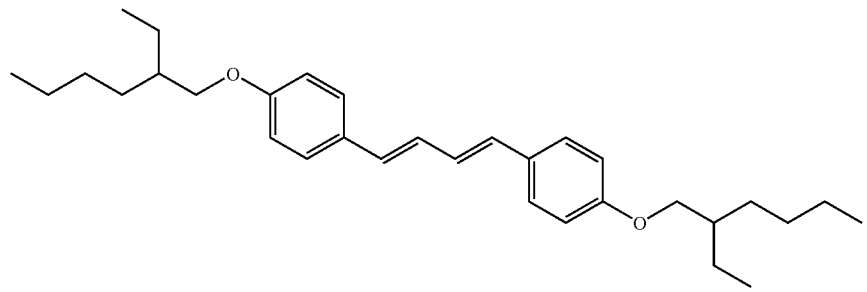
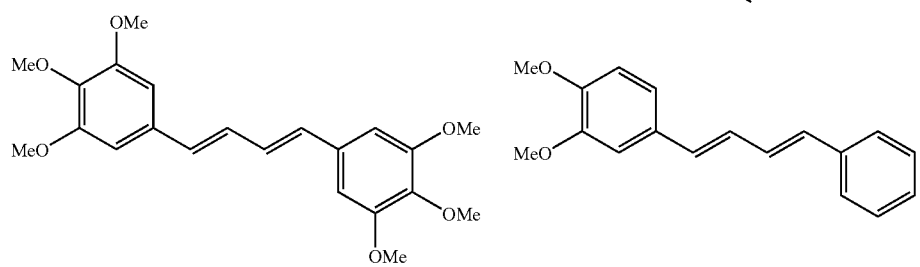
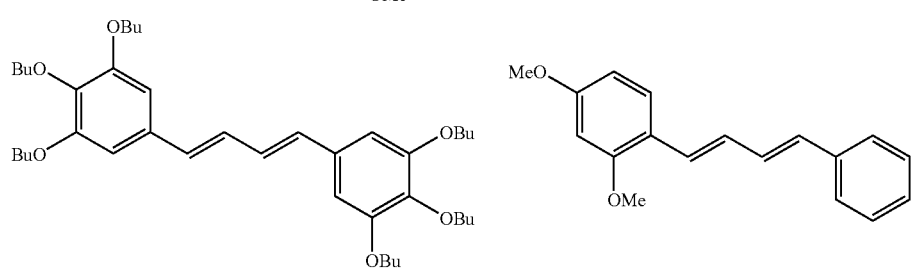
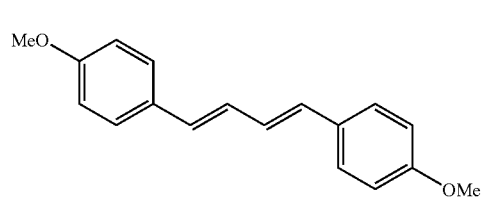 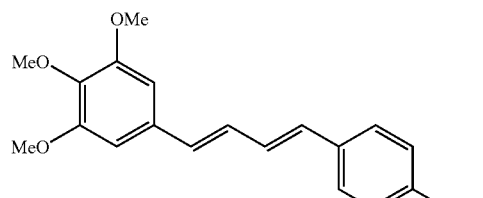
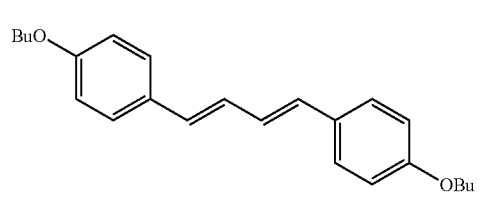 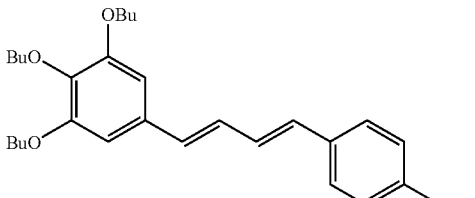

-continued
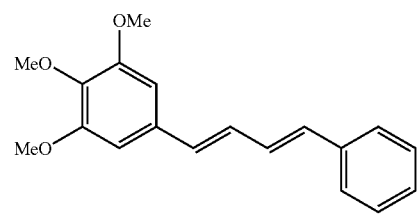
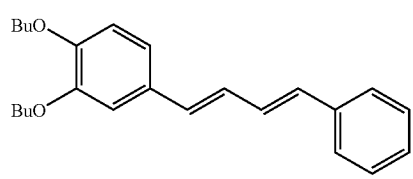
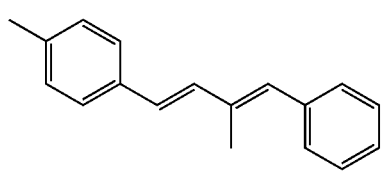
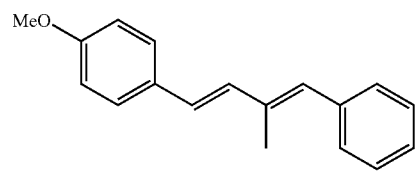
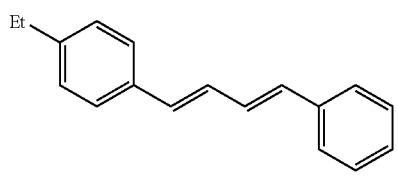
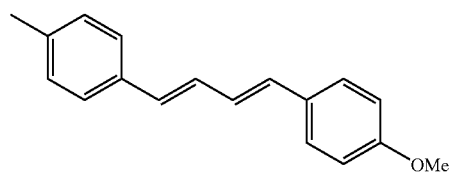
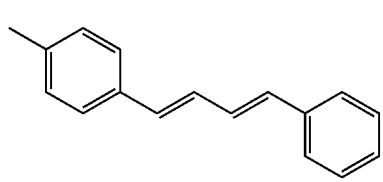
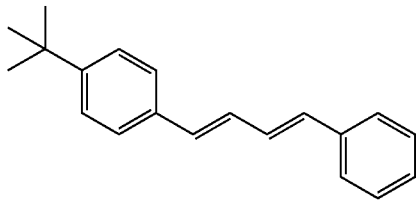
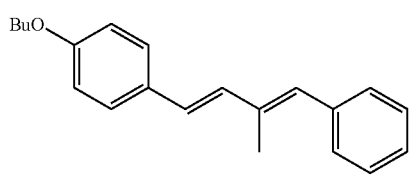
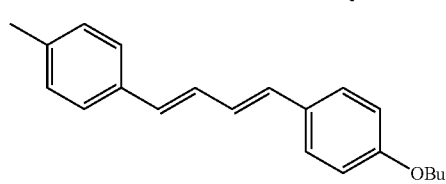
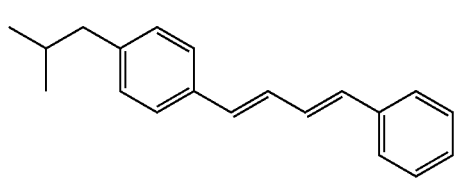
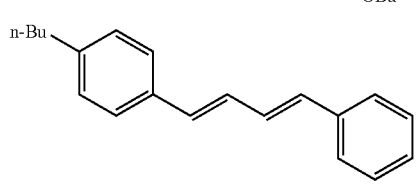
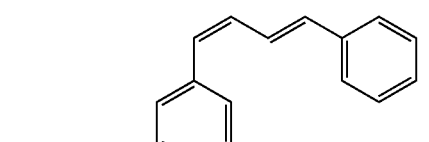
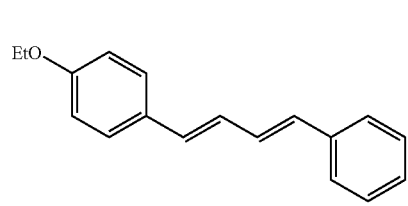
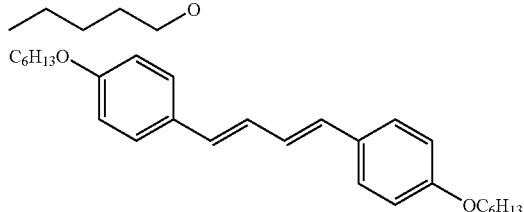
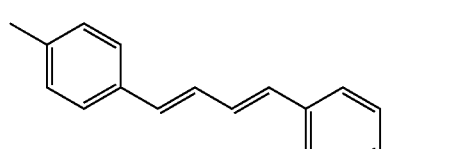
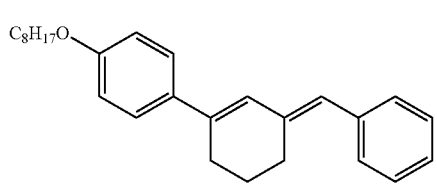
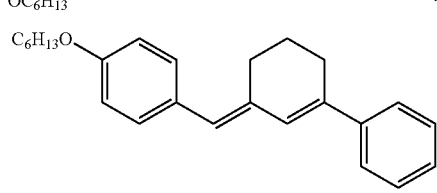

-continued
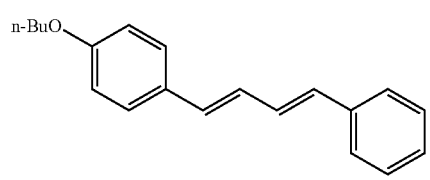
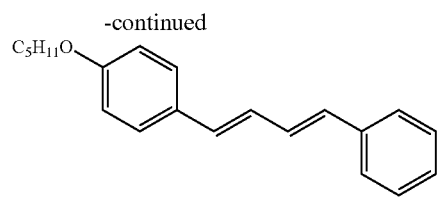
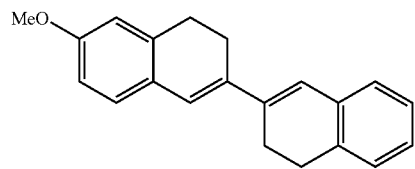
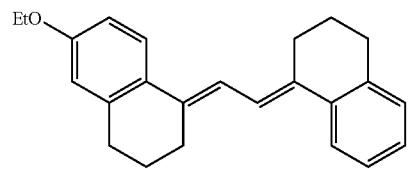
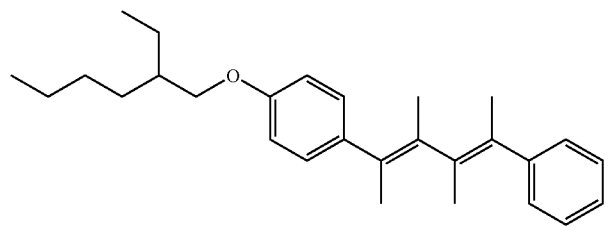
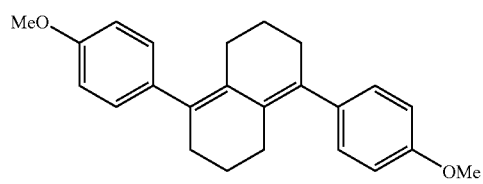
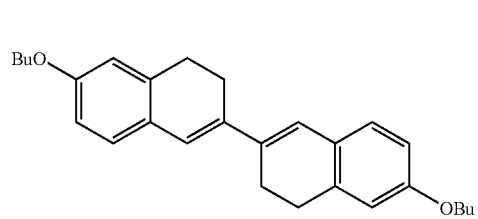
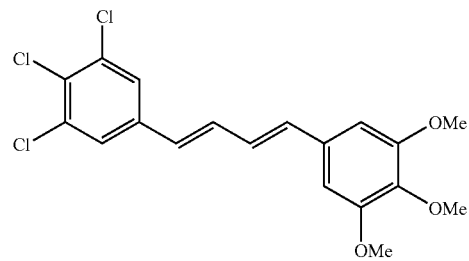
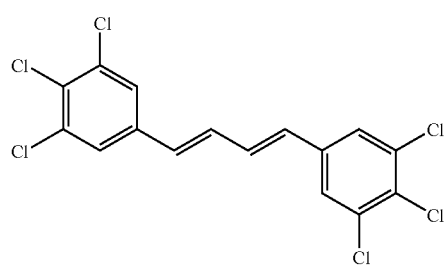
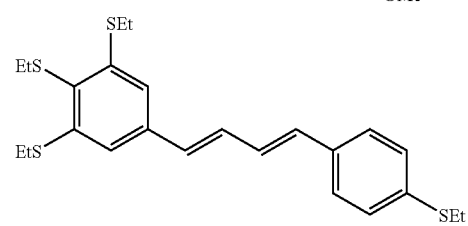
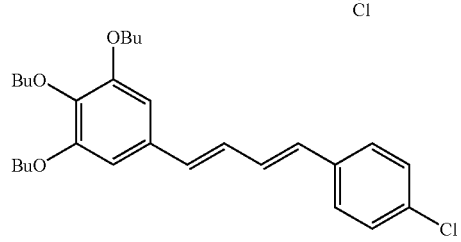
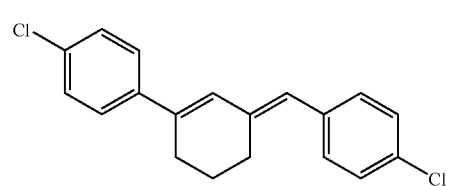
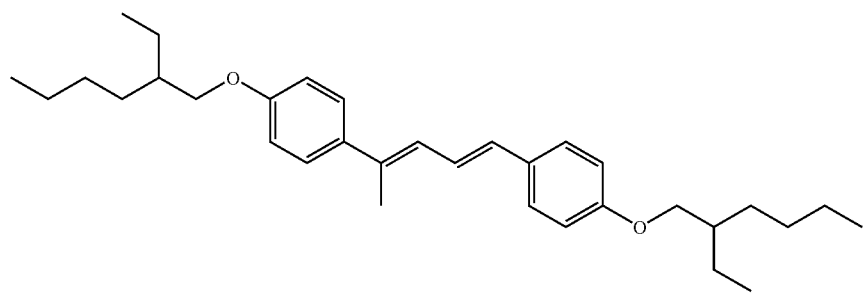

-continued
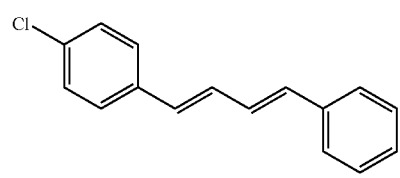
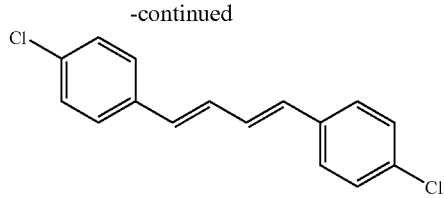
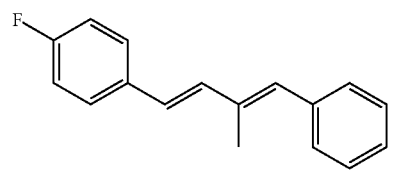
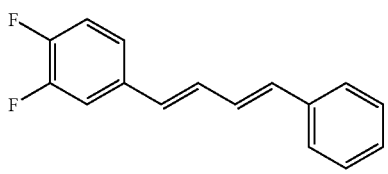
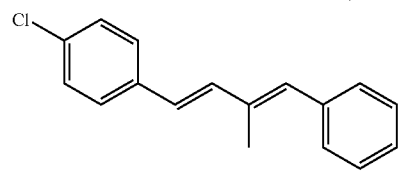
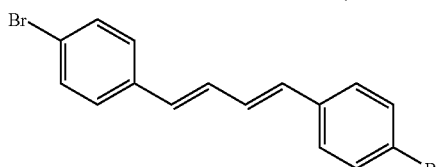
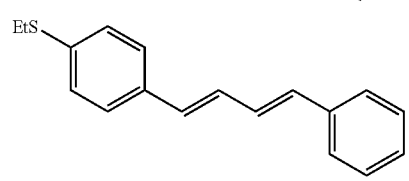
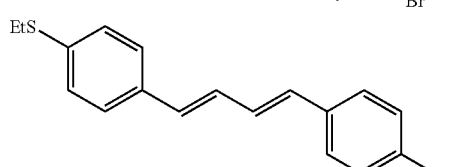
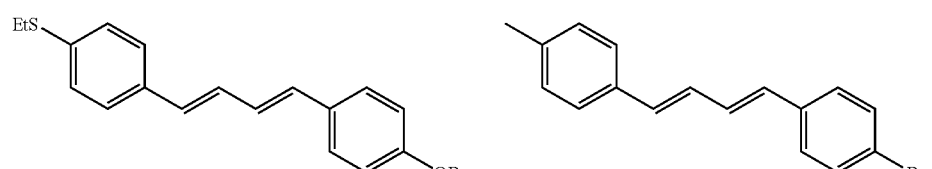
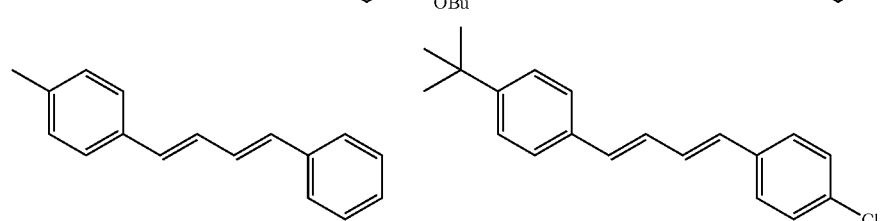
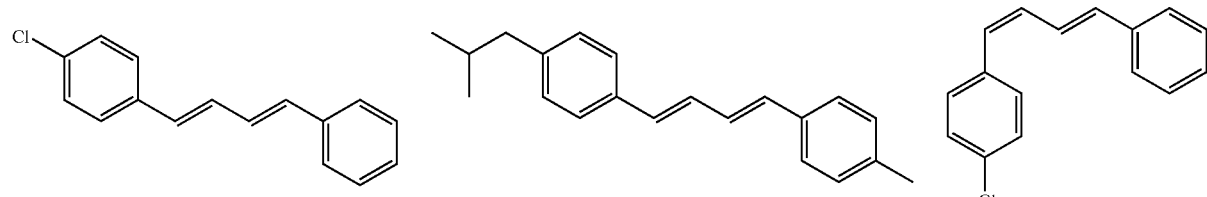
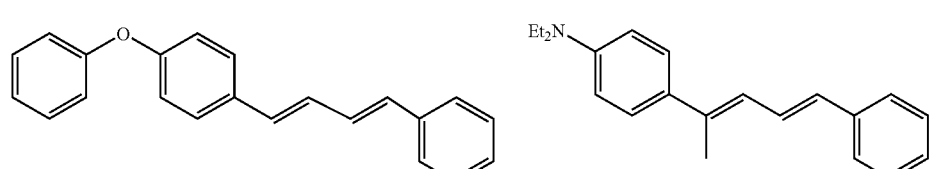
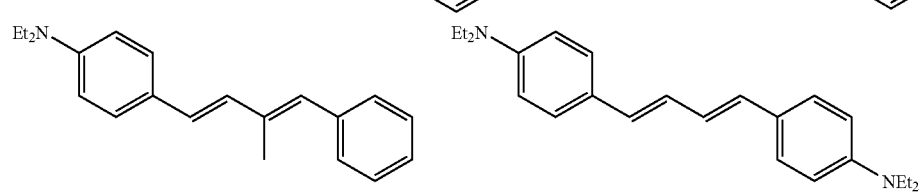

-continued
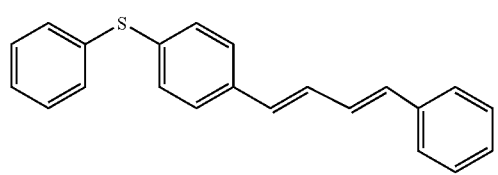
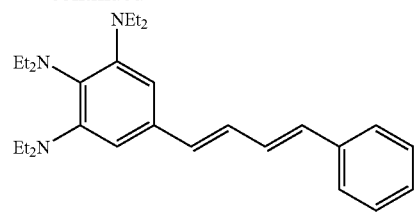
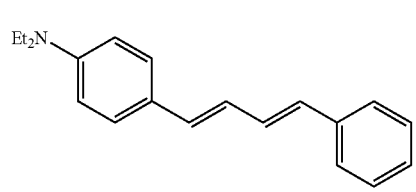
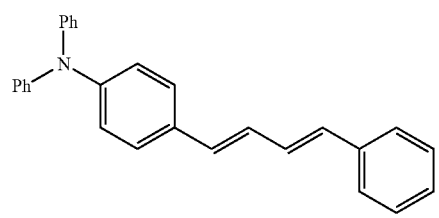
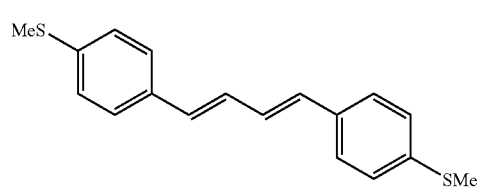
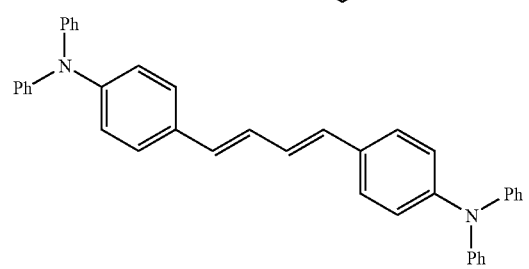
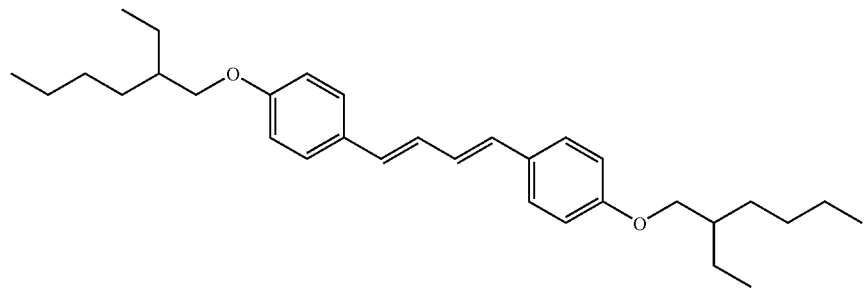
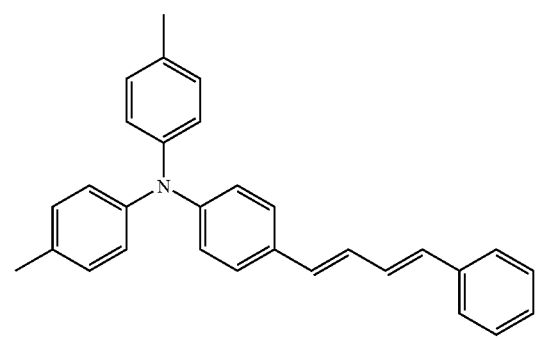
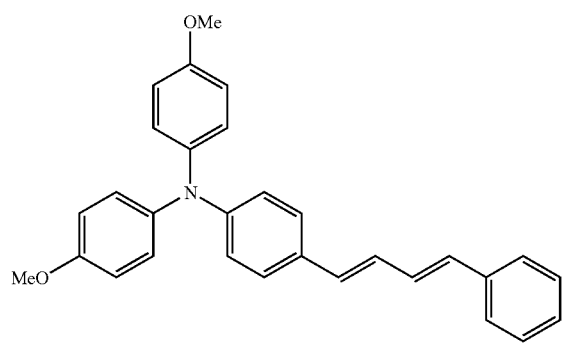
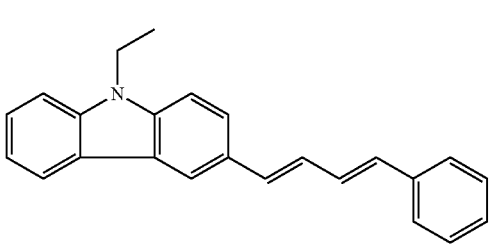

71
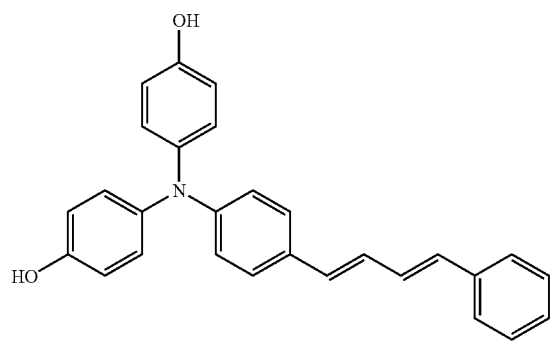
72
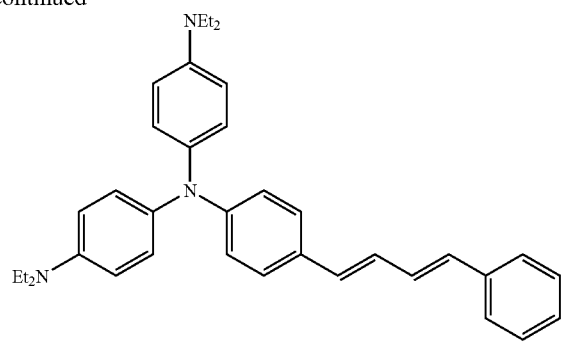
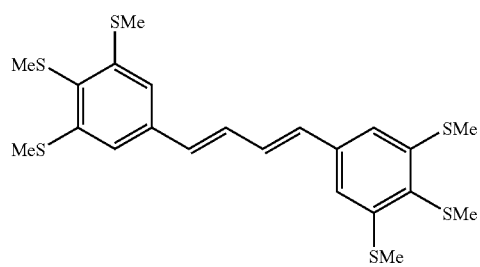
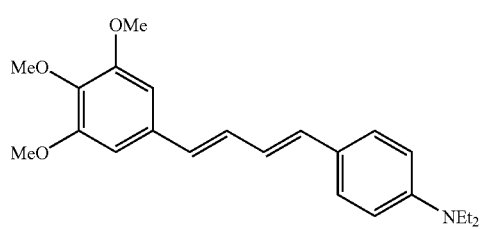
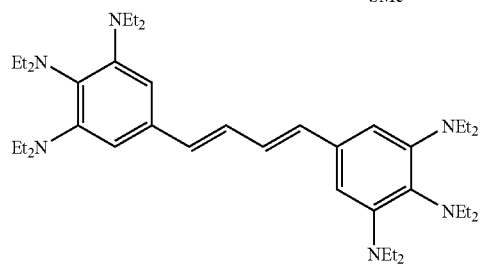
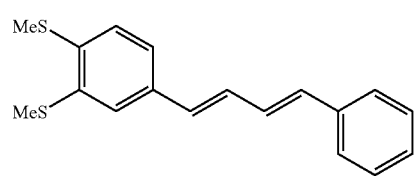
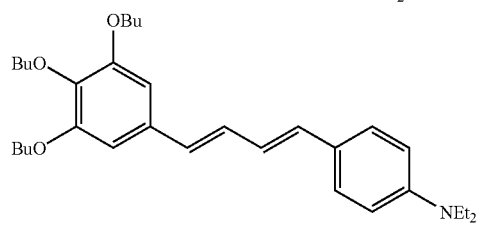
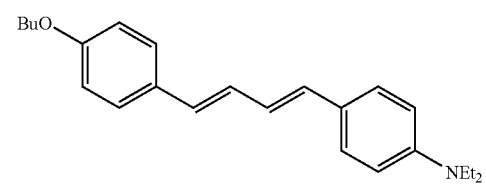
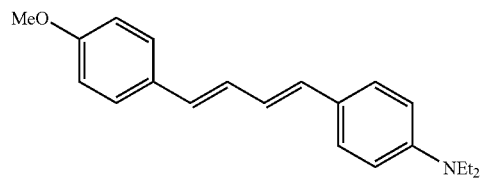
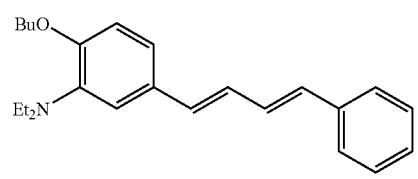
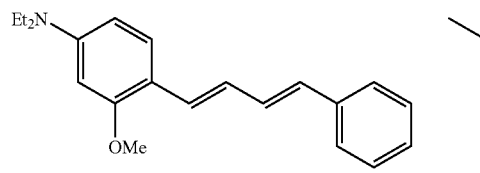
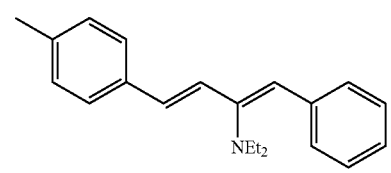
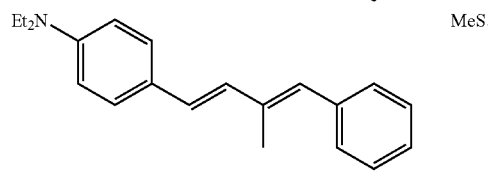
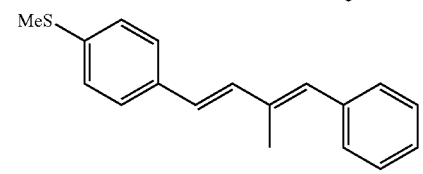

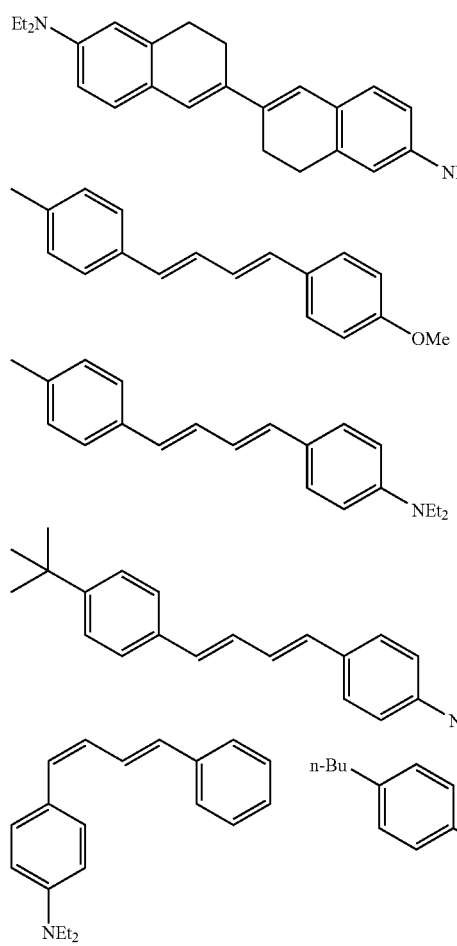

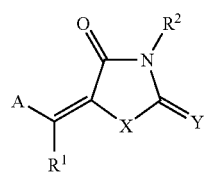

(VI)

In the formula (VI), A represents an aromatic ring or heterocyclic ring which may be substituted; X represents an oxygen atom, a sulfur atom, or —N(R³)—; and Y represents an oxygen atom, a sulfur atom, or —N(R³)—. R¹, R² and R³ each independently represent a hydrogen atom or a monovalent non-metal atomic group, and A, R¹, R² and R³ may be bound to each other to form an aliphatic or aromatic ring.

In the formula (VI), R¹, R² and R³ each independently represent a hydrogen atom or a monovalent non-metal atomic group. When R¹, R² and R³ represent monovalent non-metallic atomic groups, the non-metallic atomic group is preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or unsubstituted alkylthio group, a hydroxyl group or a halogen atom.

In the compound represented by the formula (VI), Y is preferably an oxygen atom or —N(R³)—, from the viewpoint of enhancing the efficiency of decomposition of the photopolymerization initiator. R³ each independently represents a hydrogen atom or a monovalent non-metal atomic group. Further, Y is most preferably —N(R³)—.

Hereinafter, specific preferred examples of the compound represented by formula (VI), (VII) to (VI124) will be presented, however the invention is not intended to be limited to these. Also, it has not been clarified about the isomers generated by the double bond linking the acidic nucleus and the basic nucleus, and the invention is not to be limited to any of the isomers.

shedlfkf

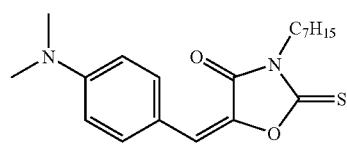

(VI1)

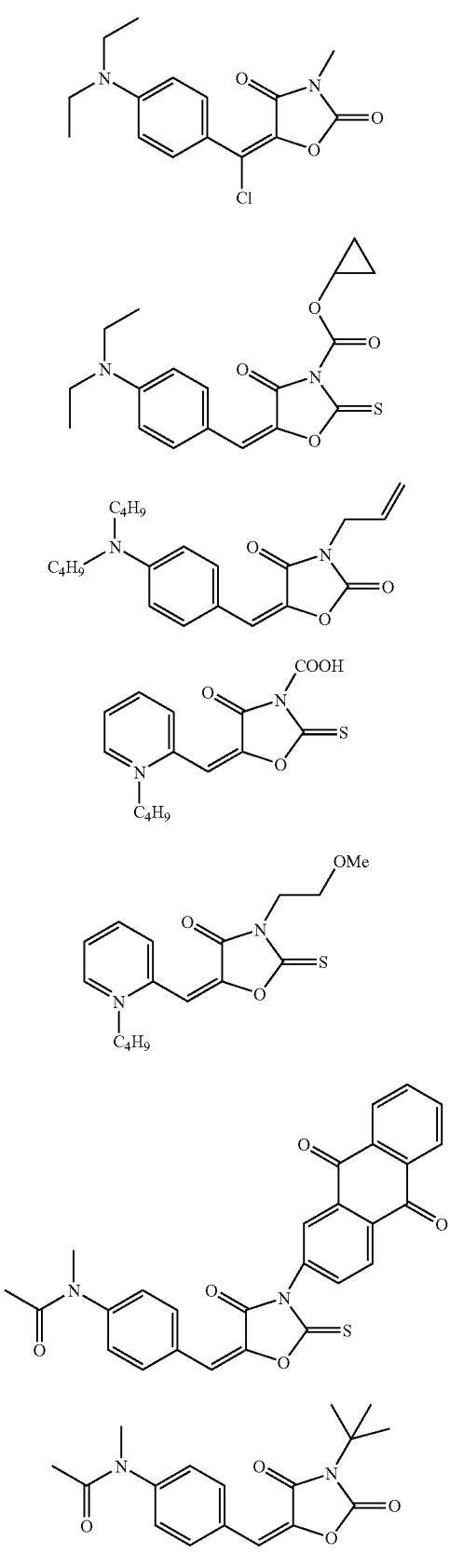
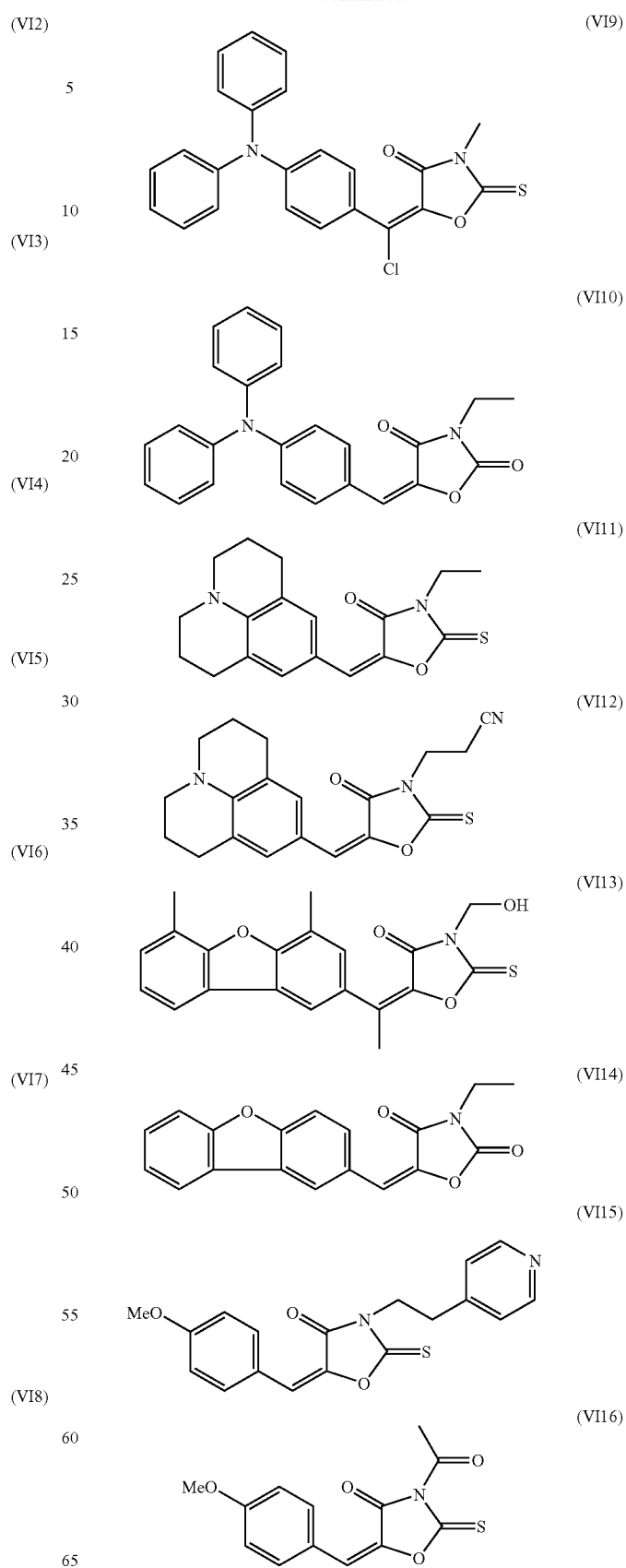

(VI17) 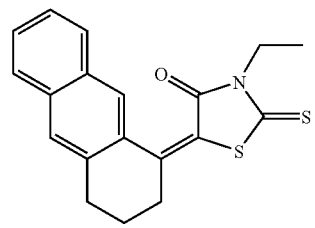
(VI18) 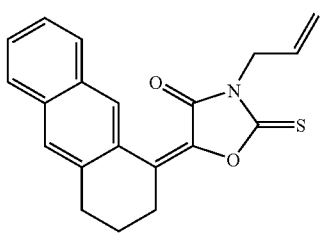
(VI19) 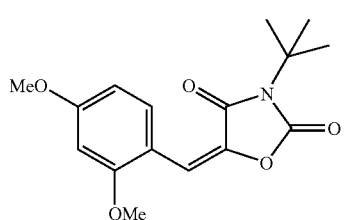
(VI20) 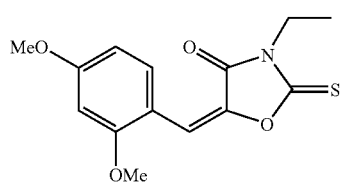
(VI21) 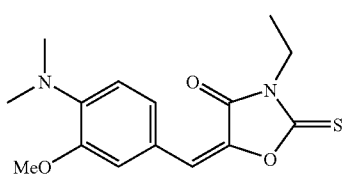
(VI22) 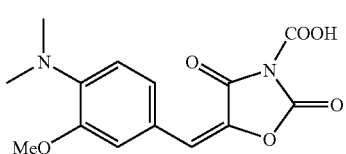
(VI23) 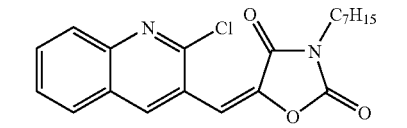
(VI24) 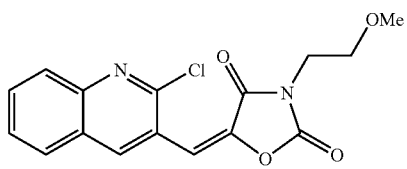
(VI25) 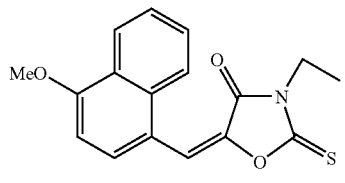
(VI26) 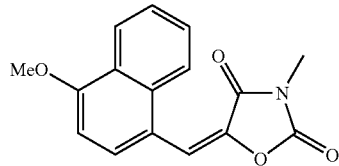
(VI27) 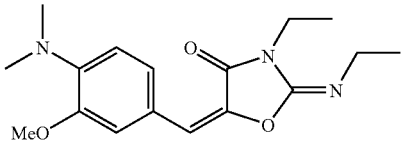
(VI28) 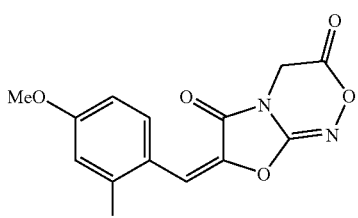
(VI29) 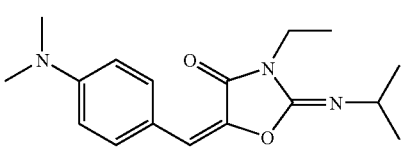
(VI30) 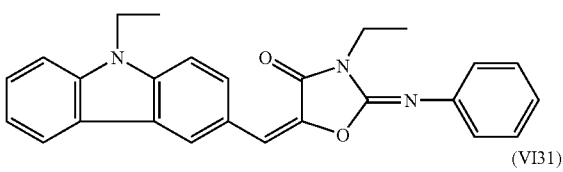
(VI31) 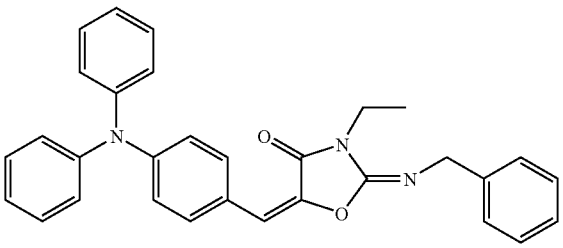
(VI32) 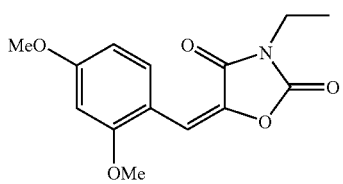
(VI33) 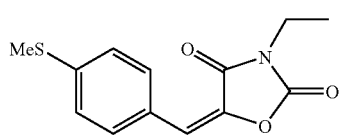

(VI34) 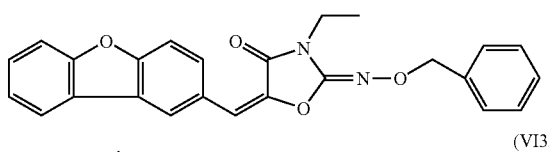
(VI35) 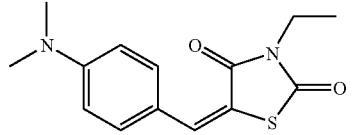
(VI36) 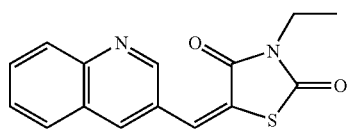
(VI37) 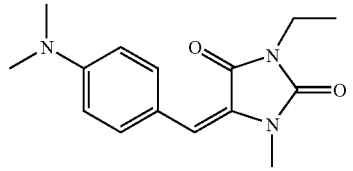
(VI38) 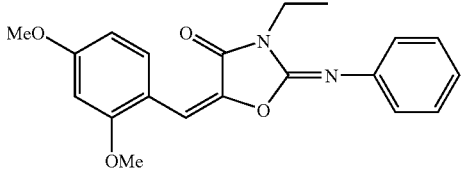
(VI39) 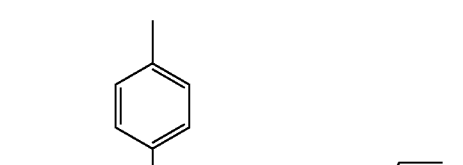
(VI40) 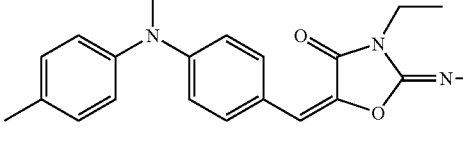
(VI41) 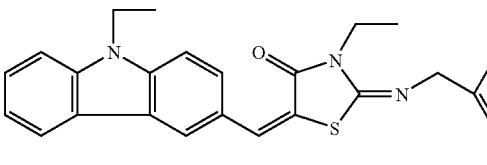
(VI42) 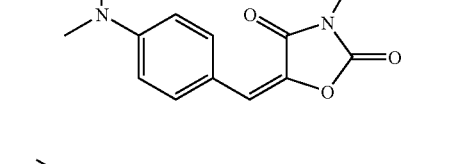
(VI43) 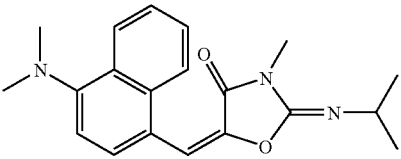
(VI44) 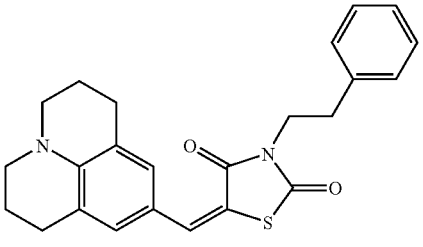
(VI45) 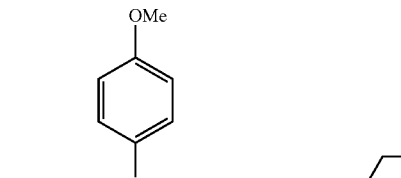
(VI46) 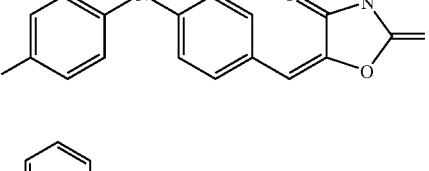
(VI47) 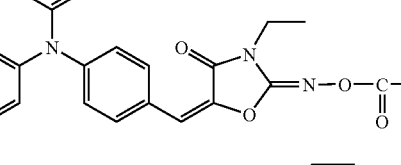
(VI48) 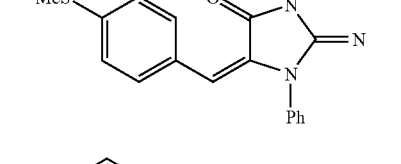
(VI49) 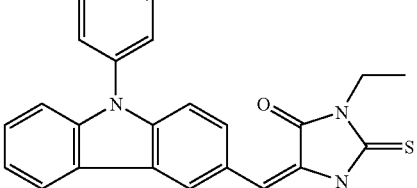

-continued
(VI50)
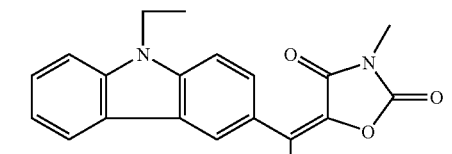
(VI51)
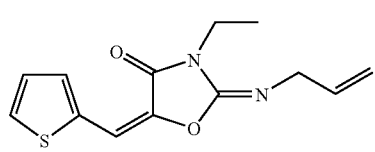
(VI52)
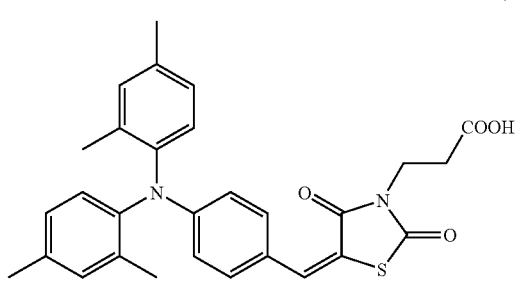
(VI53)
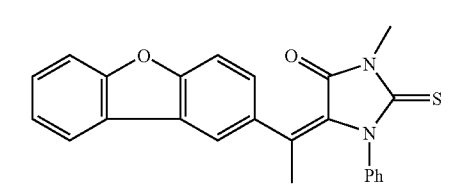
(VI54)
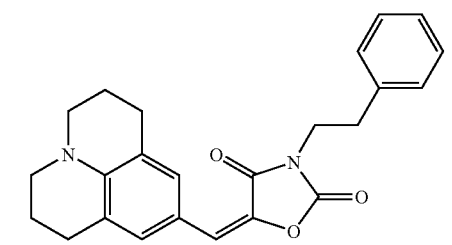
(VI55)
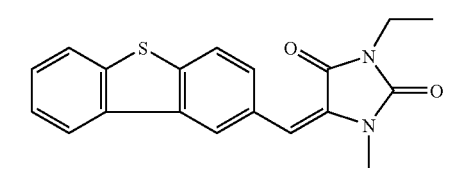
(VI56)
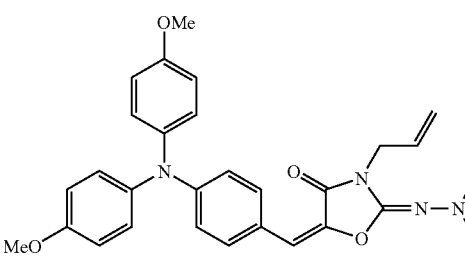
-continued
(VI57)
(VI58)
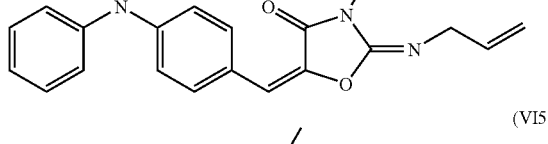
(VI59)
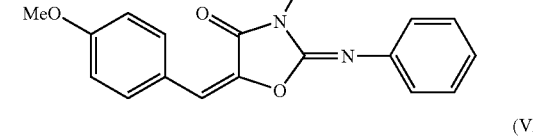
(VI60)
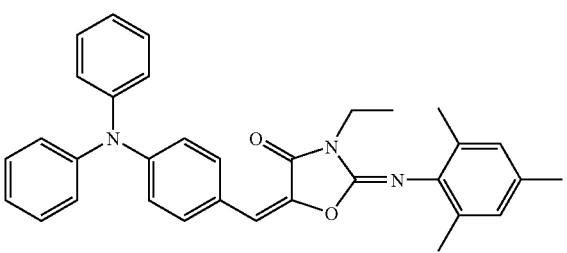
(VI61)
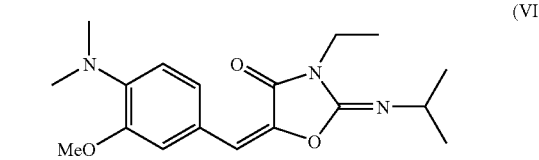
(VI62)
(VI63)
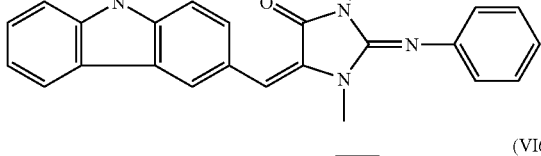

(VI64) 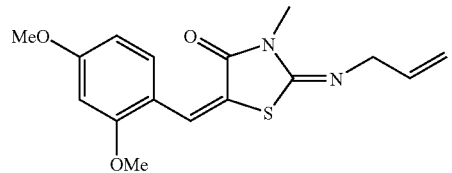
(VI65) 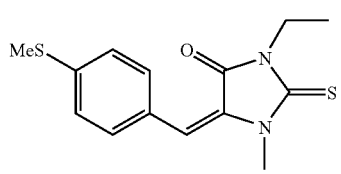
(VI66) 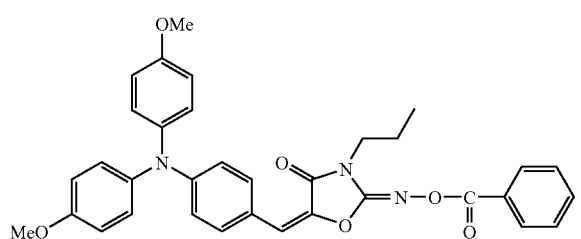
(VI67) 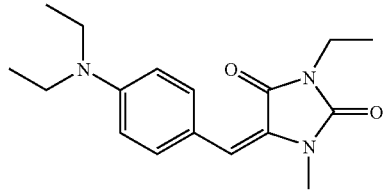
(VI68) 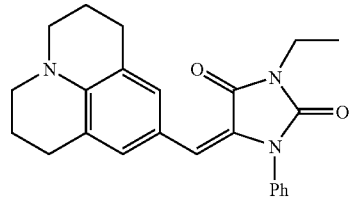
(VI69) 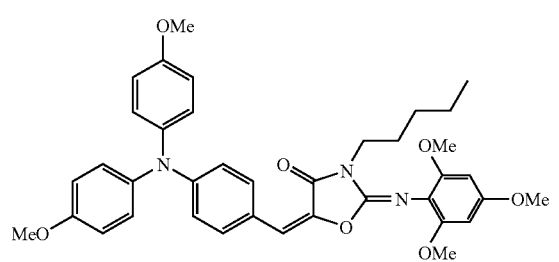
(VI70) 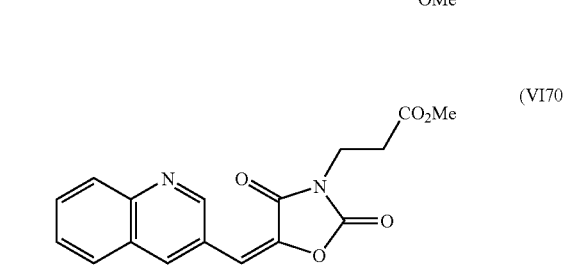
(VI71) 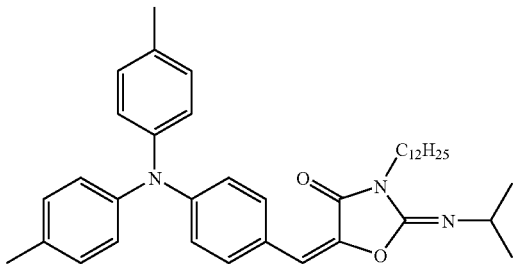
(VI72) 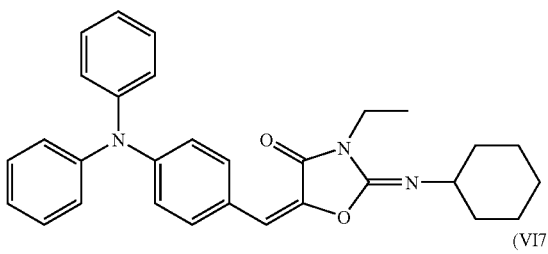
(VI73) 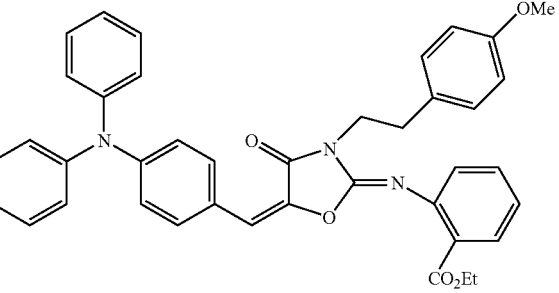
(VI74) 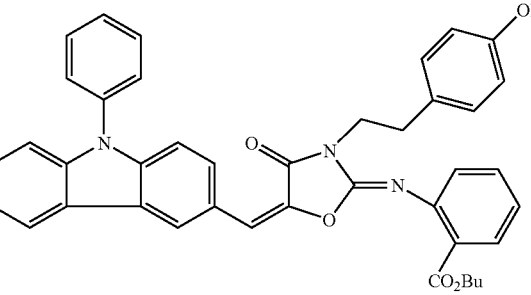
(VI75) 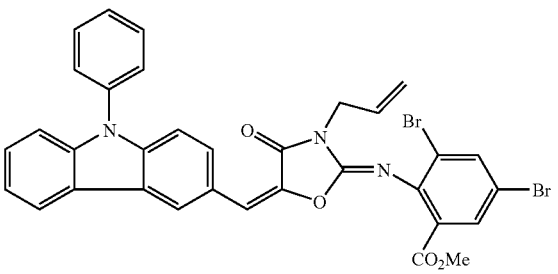

(VI76)
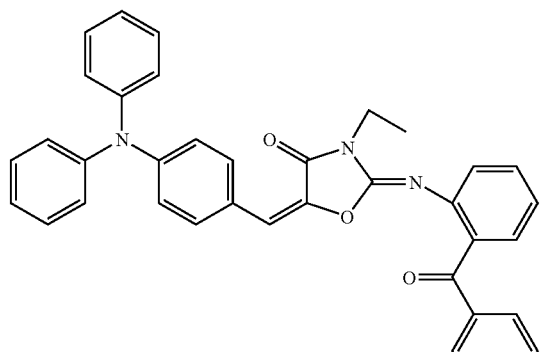
(VI77)
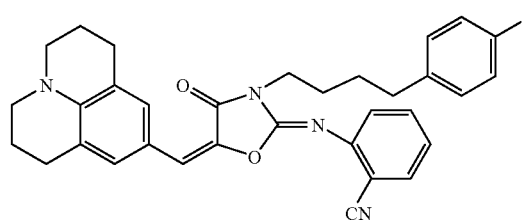
(VI78)
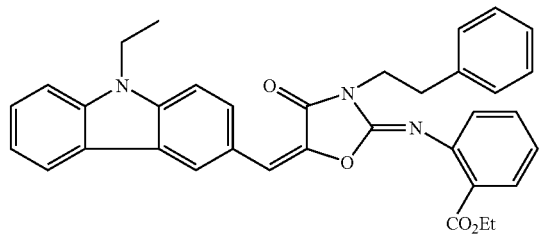
(VI79)
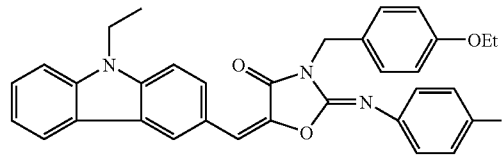
(VI80)
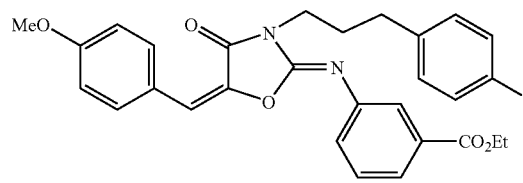
(VI81)
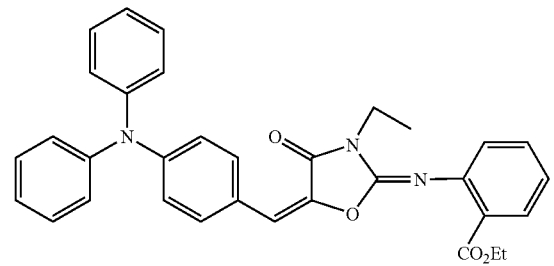
(VI82)
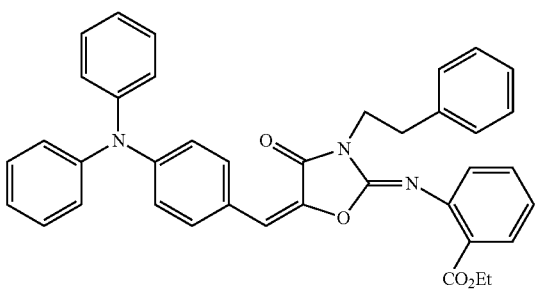
(VI83)
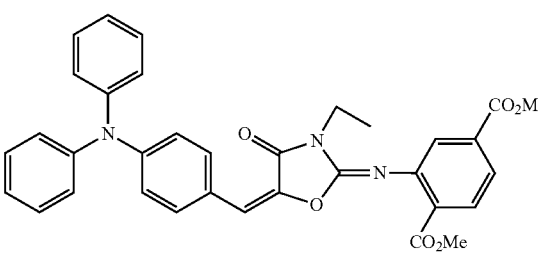
(VI84)
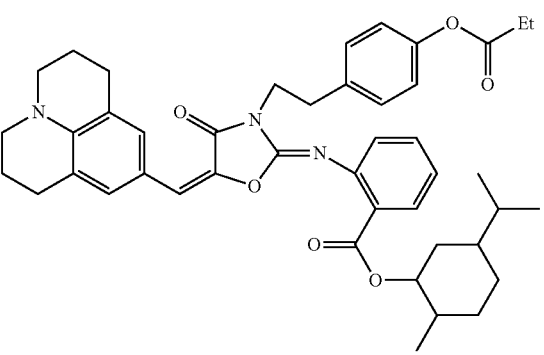
(VI85)
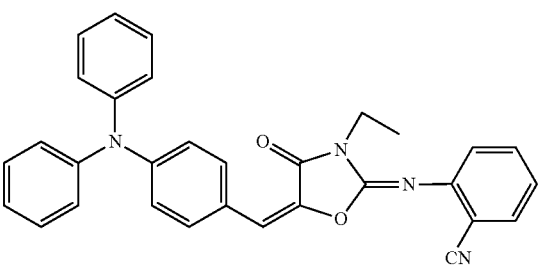
(VI86)
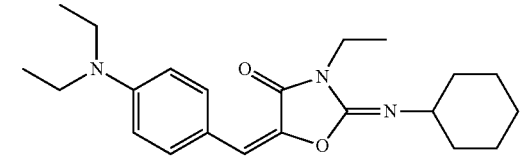
(VI87)
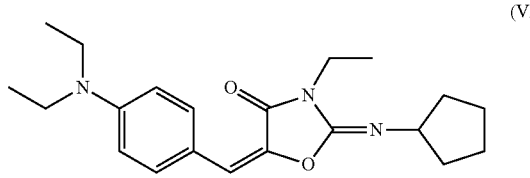

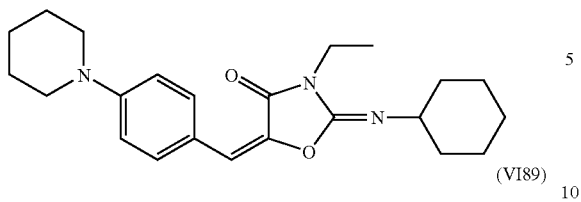
(VI88)
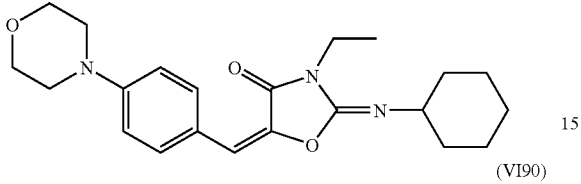
(VI89)
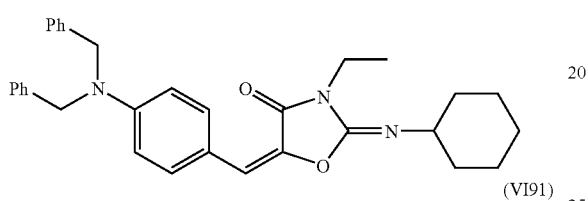
(VI90)
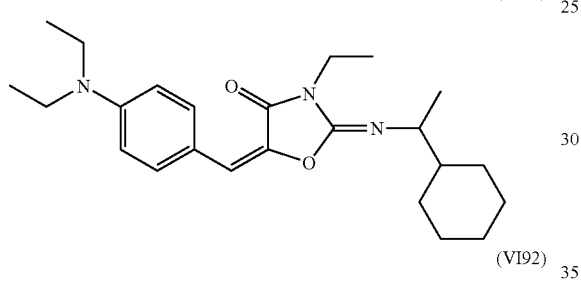
(VI91)
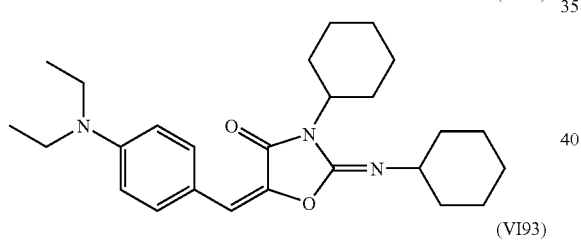
(VI92)
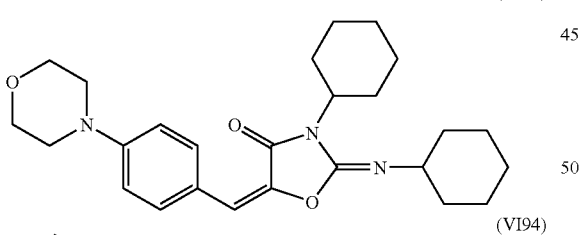
(VI93)
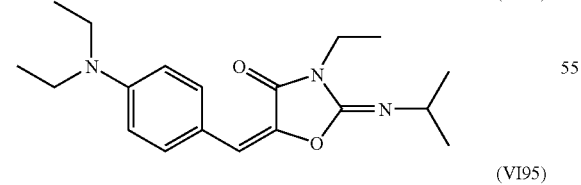
(VI94)
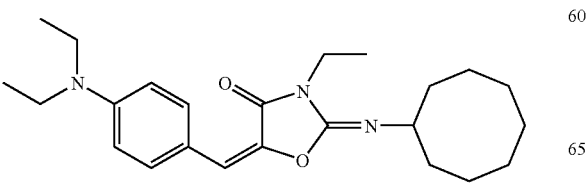
(VI95)
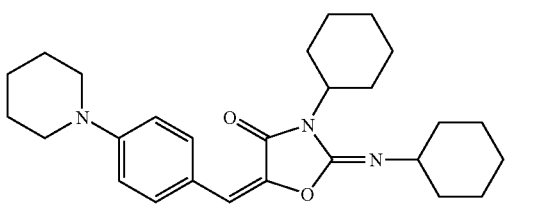
(VI96)
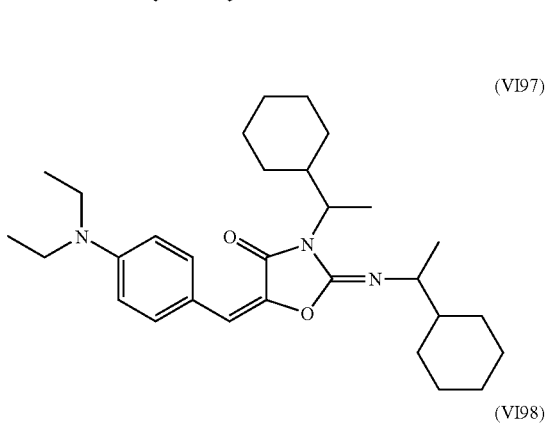
(VI97)
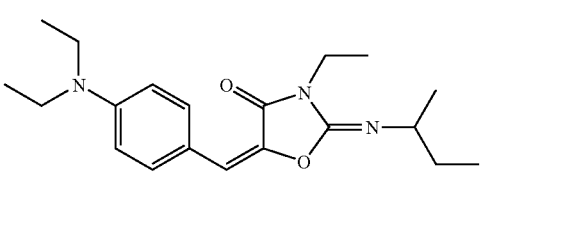
(VI98)
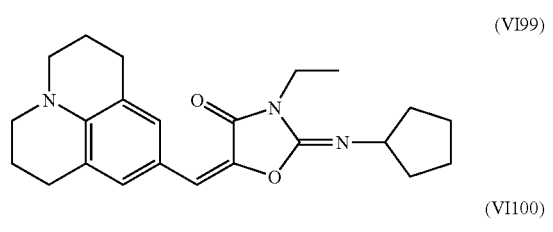
(VI99)
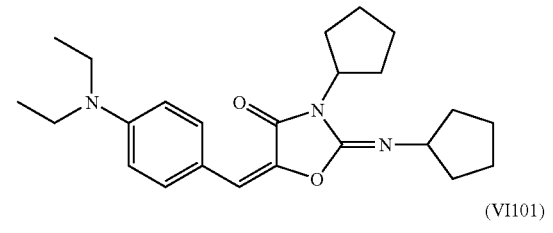
(VI100)
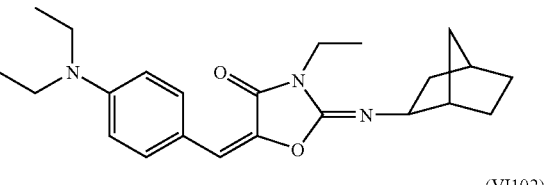
(VI101)
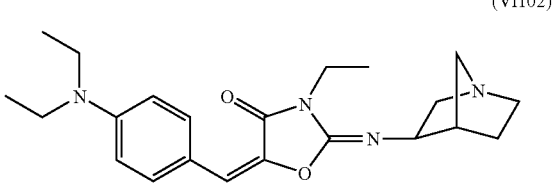
(VI102)

-continued
(VI103)
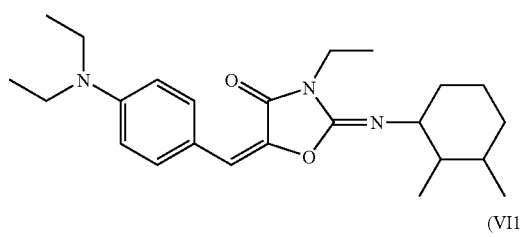
(VI104)
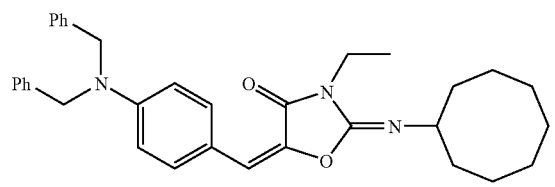
(VI105)
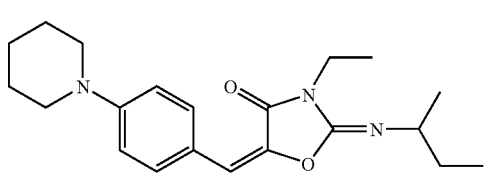
(VI106)
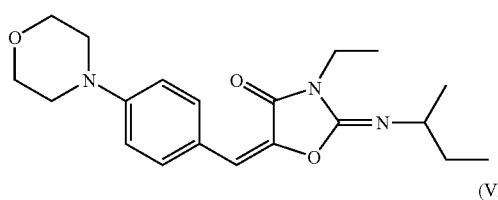
(VI107)
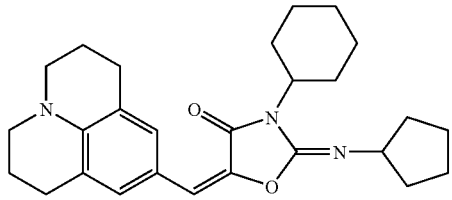
(VI108)
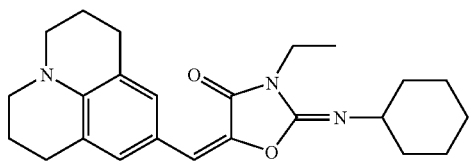
(VI109)
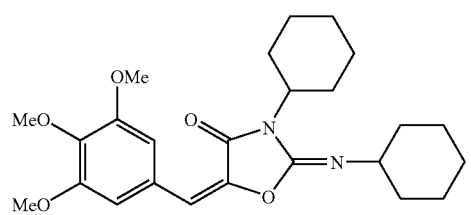
(VI110)
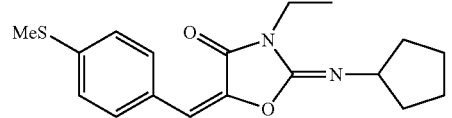
-continued
(VI111)
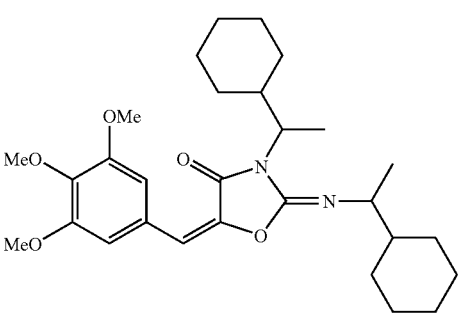
(VI112)
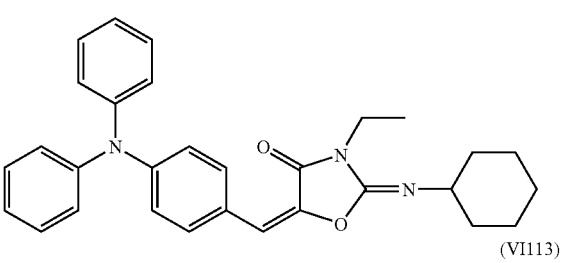
(VI113)
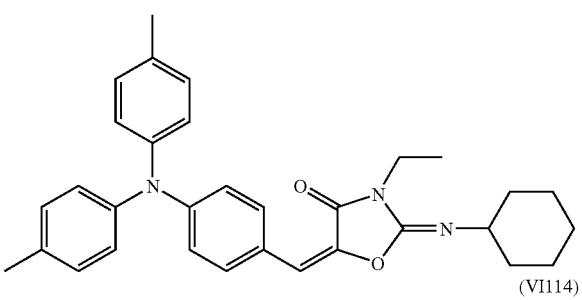
(VI114)
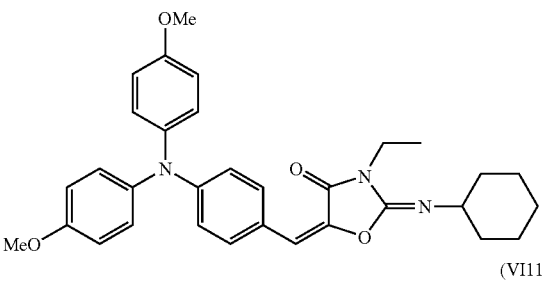
(VI115)
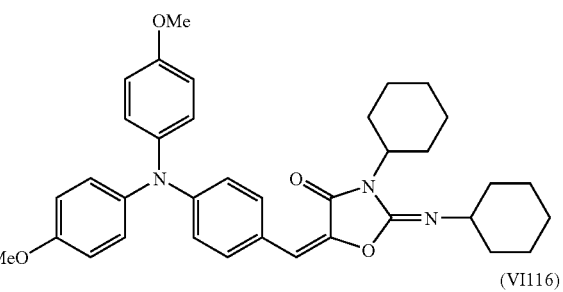
(VI116)
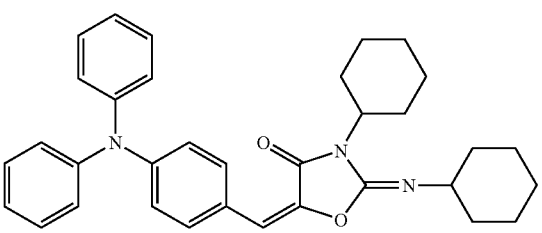

(VI117)

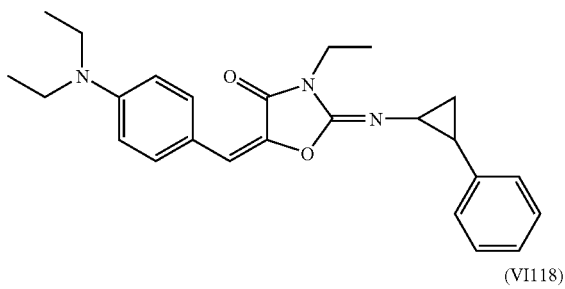

(VI118)

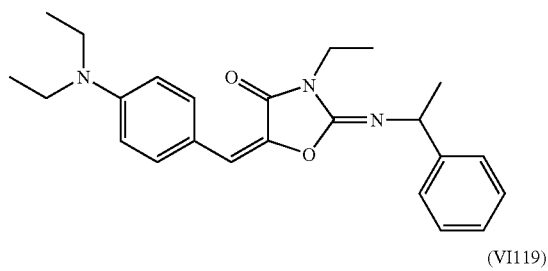

(VI119)

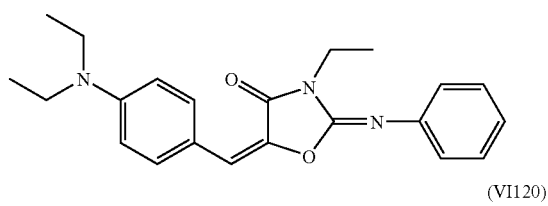

(VI120)

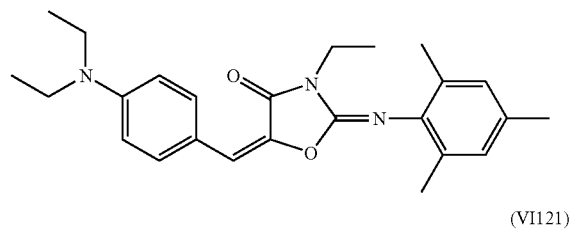

(VI121)

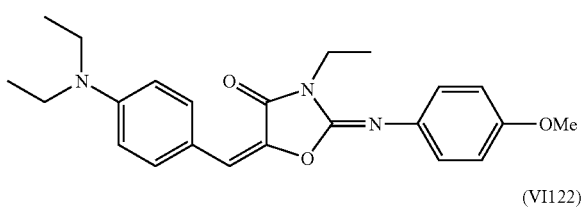

(VI122)

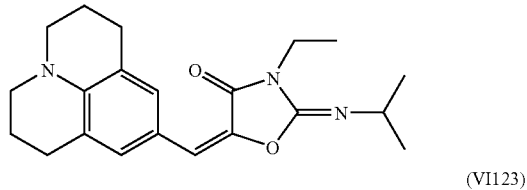

(VI123)

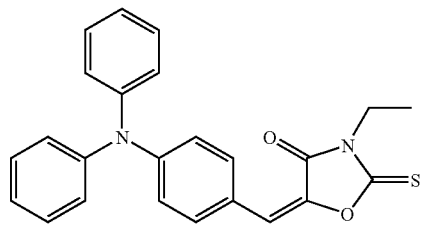

(VI124)

As for the sensitizing dye according to the invention, it is also possible to further performing various chemical modifications for improving the properties of the curable composition.

For example, when a sensitizing dye and an addition polymerizable compound structure (for example, acryloyl group or methacryloyl group) are bound by a means such as covalent bonding, ionic bonding or hydrogen bonding, increase in the strength of the exposed film, or suppression of any unnecessary precipitation of the sensitizing dye from the film after exposure may be performed.

Also, through the binding of the sensitizing dye and the partial structure having an ability to generate radicals from the above-described photopolymerization initiator (for example, the reductively degradable site of alkyl halide, onium, peroxide, biimidazole or the like, or the oxidatively degradable site of borate, amine, trimethylsilylmethyl, carboxymethyl, carbonyl, imine or the like), the photosensitivity, particularly in the state of low concentration of the initiator system, may be significantly increased.

The compounds represented by above-described formulas (IV) to (VI) remarkably exhibit their effects when added to the curable composition, in the case where the concentration of the pigment in the curable composition is very high, and the light transmittance of the formed colored pattern (photosensitive layer) is extremely low, for example, in the case where the light transmittance at 365 nm of the photosensitive layer becomes 10% or less when the curable composition of the invention is used for forming the colored pattern of a color filter, more specifically, when the colored pattern is formed without adding any sensitizing dye. Particularly, among the above-described formulas (IV) to (VI), the compound represented by the formula (VI) is most preferred, and specifically, the compounds of (VI56) to (VI122) are most preferred.

The sensitizer may be used individually, or in combination of two or more species.

The content of the (F) sensitizer in the curable composition of the invention is preferably 0.1 to 20% by mass, and more preferably 0.5 to 15% by mass, based on the total solids fraction of the curable composition, from the viewpoints of the efficiency of light absorption into deep parts and the efficiency of initiative degradation, including the case of using the curable composition in the formation of the colored pattern of a color filter.

(G) Binder Polymer

The curable composition of the invention may contain (G) a binder polymer, for the purpose of improving the film properties, and the like.

As for the binder polymer, it is preferable to use a linear organic polymer. As for such "linear organic polymer," any known polymer may be used. In addition, for example, when the curable composition of the invention is applied to the use of forming a pattern, after the pattern exposure and curing of the exposed parts, by removing the unexposed parts through development with water or alkali, preferably in order to enable development with water or development with a weak alkaline aqueous solution, a linear organic polymer which is soluble or swellable in water or a weak alkaline aqueous solution, is selected. The linear organic polymer is selected as a film forming agent, and is also selected and used in accordance with whether the developer is water, a weak alkaline aqueous solution or an organic solvent. For example, if a water-soluble organic polymer is used, development with water becomes possible. Such linear organic polymer may be a radical polymer having a carboxylic acid group in the side chain, and examples thereof include the polymers described in JP-A No. 59-44615, JP-B Nos. 54-34327, 58-12577 and 54-25957, JP-A Nos. 54-92723, 59-53836 and 59-71048. That is, a resin prepared by homopolymerizing or copolymerizing a monomer having a carboxyl group; a resin prepared by homopolymerizing or copolymerizing a monomer having acid anhydride, and subjecting the acid anhydride unit to hydrolysis, half-esterification or half-amidation; epoxy acrylate prepared by modifying an epoxy resin with unsaturated monocarboxylic acid and acid anhydride; and the like may be mentioned. Examples of the monomer having a carboxyl group include acrylic acid, methacrylic acid, itaconic acid, crotonic acid, maleic acid, fumaric acid, 4-carboxystyrene, and the like, while examples of the monomer having acid anhydride include maleic anhydride and the like.

Also, acidic cellulose derivatives having a carboxylic acid group in the side chain may also be used similarly. In addition to them, a product prepared by adding a cyclic acid anhydride to a polymer having a hydroxyl group, or the like is useful.

As described above, if the radical polymer having a carboxylic acid group in the side chain is a copolymer, other monomers different from the monomers described previously also may be used as the compound to be copolymerized. Examples of the other monomers include the compounds of the following (1) to (12).

(1) Acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 3-hydroxyethyl methacrylate, 2-hydroxypropyl methacrylate, 3-hydroxypropyl methacrylate and 4-hydroxybutyl methacrylate;

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate and propargyl acrylate;

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate and propargyl methacrylate;

(4) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide and allyl methacrylamide;

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) Vinyl esters such as vinyl acetate, vinyl chloroacetate, vinyl butyrate and vinyl benzoate;

(7) Styrenes such as styrene, α-methylstyrene, methylstyrene, chloromethylstyrene and p-acetoxystyrene;

(8) Vinyl ketones such as methyl vinyl ketone, ethyl vinyl ketone, propyl vinyl ketone and phenyl vinyl ketone.

(9) Olefins such as ethylene, propylene, isobutylene, butadiene and isoprene;

(10) N-vinylpyrrolidone, acrylonitrile, methacrylonitrile, and the like;

(11) Unsaturated imides such as maleimide, N-acryloyl acrylamide, N-acetyl methacrylamide, N-propionyl methacrylamide and N-(p-chlorobenzoyl) methacrylamide; and

(12) Methacrylic acid monomers having a heteroatom bound at the α-position. For example, the compounds described in Japanese Patent Application Nos. 2001-115595, 2001-115598, and the like, may be mentioned.

Among these, (meth)acrylic resins having an allyl group or a vinyl ester group and a carboxyl group in the side chain, and the alkali-soluble resins having a double bond in the side chain, described in JP-A Nos. 2000-187322 and 2002-62698, or the alkali-soluble resins having an amide group in the side chain, described in JP-A No. 2001-242612, are suitable because they are excellently balanced between the film strength, sensitivity and developability.

Furthermore, the urethane-based binder polymers having an acid group, described in JP-B Nos. 7-12004, 7-120041, 7-120042 and 8-12424, JP-A Nos. 63-287944, 63-287947 and 1-271741, Japanese Patent Application No. 10-116232, and the like, or the urethane-based binder polymers having an acid group and a double bond in the side chain, described in JP-A No. 2002-107918, are advantageous from the viewpoint of suitability for low exposure, because the polymers have highly excellent strength.

Furthermore, the acetal-modified polyvinyl alcohol-based binder polymers having an acid group, described in EP Nos. 993966 and 1204000, JP-A No. 2001-318463, and the like, are excellently balanced between the film strength and developability, and thus are suitable.

In addition to these, polyvinyl pyrrolidone or polyethylene oxide is useful as the water-soluble linear organic polymer. Also, alcohol-soluble nylon or a polyether of 2,2-bis-(4-hydroxyphenyl)-propane and epichlorohydrin is also useful for increasing the strength of the cured coating film.

The weight average molecular weight of the (G) binder polymer is preferably in range of 5,000 or larger, and more preferably 10,000 to 300,000, while the number average molecular weight is preferably 1,000 or larger, and more preferably in the range of 2,000 to 250,000. The polydispersity (weight average molecular weight/number average molecular weight) is preferably 1 or greater, and more preferably in the range of 1.1 to 10.

These resins may be any of a random polymer, a block polymer and a graft polymer.

The (G) binder polymer may be synthesized by a conventionally known method. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, 1-methyl-2-pyrrolidone, water, and the like. These solvents may be used individually or in combination of two or more species.

As the radical polymerization initiator used in the synthesis of a binder polymer which may be used for the invention, there may be mentioned known compounds such as azo-based initiators or peroxide initiators.

The content of the (G) binder polymer in the curable composition in the case of using the curable composition of the invention in the formation of a colored pattern of a color filter, is preferably 5 to 60% by mass, more preferably 7 to 50% by mass, and most preferably 10 to 40% by mass, based on the total solids fraction of the curable composition, from the viewpoint of the balance between the pigment dispersion stability over time and developability.

(H) Dispersant

The curable composition of the invention preferably contains a dispersant in addition to the above-described components, from the viewpoint of further improving dispersibility of the (B) pigment.

As the dispersant (pigment dispersant), polymeric dispersants [for example, polyamidoamine and salts thereof, polycarboxylic acid and salts thereof, high molecular weight unsaturated acid esters, modified polyurethane, modified polyesters, modified poly(meth)acrylate, (meth)acrylic copolymers, naphthalenesulfonic acid-formalin condensate], polyoxyethylene alkyl phosphoric acid esters, polyoxyethylene alkylamine, alkanolamine, pigment derivatives, and the like may be mentioned.

The polymeric dispersants may be further classified on the basis of the structure, into a linear polymer, a terminal modified polymer, a graft type polymer and a block type polymer.

A polymeric dispersant operates by adsorbing onto the surface of the pigment and preventing re-aggregation. Thus, a terminal modified polymer having an anchor site to the pigment surface, a graft type polymer and a block type polymer may be mentioned as preferred structures. On the other hand, pigment derivatives have an effect of promoting the adsorption of the polymeric dispersants, by modifying the pigment surface.

Specific examples of the pigment dispersant that may be used in the invention include "Disperbyk-101 (polyamidoamine phosphoric acid salt), 107 (carboxylic acid ester), 110 (copolymer containing an acid group), 130 (polyamide), 161, 162, 163, 164, 165, 166, 170 (high molecular weight copolymers)," "BYK-P104, P105 (high molecular weight unsaturated polycarboxylic acid)", "BYK2001" manufactured by BYK Chemie Corp.; "EFKA4047, 4050, 4010, 4165 (polyurethanes), EFKA 4330, 4340 (block copolymers), 4400, 4402 (modified polyacrylate), 5010 (polyester amide), 5765 (high molecular weight polycarboxylic acid salt), 6220 (fatty acid polyester), 6745 (phthalocyanine derivative), 6750 (azo pigment derivative)," manufactured by EFKA Additives, Inc., "Ajisper-PB821, PB822" manufactured by Ajinomoto Fine Techno Co., Inc., "Flowlen TG-710 (urethane oligomer)," "Polyflow No. 50E, No. 300 (acrylic copolymers)" manufactured by Kyoeisha Chemical Co., Ltd., "Disperon KS-860, 873SN, 874, #2150 (aliphatic polyvalent carboxylic acids), #7004 (polyether ester), DA-703-50, DA-705, DA-725" manufactured by Kusumoto Chemicals, Ltd., "Demol RN, N (naphthalenesulfonic acid-formalin polycondensates), MS, C, SN-B (aromatic sulfonic acid-formalin polycondensates)," "Homogenol L-18 (high molecular weight polycarboxylic acid)," "Emargen 920, 930, 935, 985 (polyoxyethylene nonylphenyl ether)," "Acetamine 86 (stearylamine acetate)" manufactured by Kao Corp., "Solsperse 5000 (phthalocyanine derivative), 22000 (azo pigment derivative), 13240 (polyesteramine), 3000, 17000, 27000 (polymer having a functional moiety at the end part), 24000, 28000, 32000, 38500 (graft type polymers)" manufactured by Lubrizol Corp., "Nikkol T106 (polyoxyethylene sorbitan monooleate), MYS-IEX (polyoxyethylene monostearate)" manufactured by Nikko Chemical Co., Ltd., and the like.

These dispersants may be used individually, or in combination of two or more species. According to the invention, it is preferable to use, in particular, a pigment derivative and a polymeric dispersant in combination.

The content of the (H) dispersant according to the invention is preferably 1 to 100% by mass, more preferably 3 to 100% by mass, and even more preferably 5 to 80% by mass, based on the pigment.

Specifically, if a polymeric dispersant is to be used, the amount of use is preferably in the range of 5 to 100% by mass, and more preferably in the range of 10 to 80% by mass, based on the pigment. Also, if a pigment derivative is to be used, the amount of use is preferably in the range of 1 to 30% by mass, more preferably in the range of 3 to 20% by mass, and particularly preferably in the range of 5 to 15% by mass, based on the pigment.

According to the invention, in the case of using a pigment and a dispersant, the sum of the contents of the pigment and the dispersant is preferably 35 to 90% by mass, more preferably 45 to 85% by mass, and even more preferably 50 to 80% by mass, based on the total solids fraction constituting the curable composition, from the viewpoints of curing sensitivity and color density.

(I) Co-sensitizer

It is also preferable for the curable composition of the invention to contain (I) a co-sensitizer. According to the invention, the co-sensitizer has an effect of further enhancing the sensitivity of the (F) sensitizer (sensitizing dye) or the (D) photopolymerization initiator to an actinic radiation, or suppressing the inhibition of polymerization of polymerizable compounds by oxygen.

Examples of such co-sensitizer include amines, for example, the compounds described in M. R. Sander et al., "Journal of Polymer Society" Vol. 10, p. 3173 (1972), JP-B No. 44-20189, JP-A Nos. 51-82102, 52-134692, 59-138205, 60-84305, 62-18537 and 64-33104, and Research Disclosure No. 33825. Specifically, triethanolamine, p-dimethylaminobenzoic acid ethyl ester, p-formyldimethylaniline, p-methylthiodimethylaniline and the like may be mentioned.

Other examples of the co-sensitizer include thiols and sulfides, for example, the thiol compounds described in JP-A No. 53-702, JP-B No. 55-500806 and JP-A No. 5-142772, disulfide compounds described in JP-A No. 56-75643, and the like. Specifically, 2-mercaptobenzothiazole, 2-mercaptobenzoxazole, 2-mercaptobenzimidazole, 2-mercapto-4(3H)-quinazoline, β-mercaptonaphthalene and the like may be mentioned.

Still other examples of the co-sensitizer include amino acid compounds (for example, N-phenylglycine, etc.), the organometallic compounds described in JP-B No. 48-42965 (for example, tributyltin acetate, etc.), the hydrogen donors described in JP-B No. 55-34414, the sulfur compounds described in JP-A No. 6-308727 (for example, trithiane, etc.), and the like.

The content of the (I) co-sensitizer is preferably in the range of 0.1 to 30% by mass, more preferably in the range of 0.5 to 25% by mass, and even more preferably in the range of 1.0 to 20% by mass, based on the mass of the total solids fraction of the curable composition, from the viewpoint of enhancing the curing speed by means of the balance between the polymer growth rate and the chain transfer.

(J) Polymerization Inhibitor

According to the invention, it is preferable to add a small amount of thermal polymerization preventive agent as (J) a polymerization inhibitor, during the preparation or storage of the curable composition, in order to prevent unnecessary thermal polymerization of a compound having an ethylenic unsaturated double bond within the molecule, such as the (A) resin having a pendant group containing a nitrogen-containing heterocyclic ring and an ethylenic unsaturated double bond in the main chain skeleton, or the (E) photopolymerizable compound.

Examples of the thermal polymerization preventive agent include hydroquinone, p-methoxyphenol, di-t-butyl-p-cresol, pyrogalol, t-butylcatechol, benzoquinone, 4,4'-thiobis (3-methyl-6-t-butylphenol), 2,2'-methylenebis(4-methyl-6-t-butylphenol), N-nitrosophenylhydroxyamine cerium(I) salt, and the like.

The amount of addition of the (J) polymerization inhibitor is about 0.01 to about 5% by mass based on the mass of the curable composition.

Also, if necessary, a higher fatty acid derivative such as behenic acid or behenic acid amide, or the like may be added and localized at the surface during the process until the drying of the curable composition of the invention, so as to prevent the inhibition of polymerization by oxygen. The amount of addition of the higher fatty acid derivative is preferably about 0.5 to about 10% by mass based on the mass of the curable composition.

[Other Components]

Furthermore, the curable composition of the invention may also be added with a filler, a plasticizer, a polymer compound other than those described above, a surfactant, an antioxidant, an ultraviolet absorbent, an antiflocculant or the like for ameliorating the properties of the cured film.

More specifically, a filler such as glass or alumina; a plasticizer such as dioctyl phthalate, didodecyl phthalate, triethylene glycol dicaprylate, dimethyl glycol phthalate, tricresyl phosphate, dioctyl adipate, dibutyl sebacate or triacetyl glycerin; a polymer compound such as polyvinyl alcohol, polyacrylic acid, polyethylene glycol monoalkyl ether or polyfluoroalkyl acrylate; a nonionic, cationic or anionic surfactant; an antioxiant such as 2,2-thiobis(4-methyl-6-t-butylphenol) or 2,6-di-t-butylphenol; an ultraviolet absorbent such as 2-(3-t-butyl-5-methyl-2-hydroxyphenyl)-5-chlorobenzotriazole or alkoxybenzophenon; and an antiflocculant such as sodium polyacrylate may be mentioned.

Also, in the case of applying the curable composition of the invention on the surface of a hard material such as a substrate, an additive for improving the adhesiveness to the surface of the hard material (hereinafter, referred to as "substrate adhesive") may also be added.

As the substrate adhesive, any known material may be used, however it is preferable to use, in particular, a silane-based coupling agent, a titanate-based coupling agent or an aluminum-based coupling agent.

Examples of the silane-based coupling agent include γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatopropyltrimethoxysilane, γ-isocyanatopropyltriethoxysilane, N-β-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, allyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, (acryloxymethyl)methyldimethoxysilane, and the like.

Among them, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane and phenyltrimethoxysilane are preferred, and γ-methacryloxypropyltrimethoxysilane is most preferred.

Examples of the titanate-based coupling agent include isopropyltriisostearoyl titanate, isopropyltridecylbenzenesulfonyl titanate, isopropyltris(dioctylpyrophosphate) titanate, tetraisopropylbis(dioctylphosphite) titanate, tetraoctylbis(ditridecylphosphite)titanate, tetra(2,2-diallyloxymethyl) bis(di-tridecyl)phosphite titanate, bis(dioctylpyrophosphate)oxyacetate titanate, bis(dioctylpyrophosphate) ethylene titanate, isopropyltrioctanoyl titanate, isopropyldimethacrylisostearoyl titanate, isopropylisostearoyldiacryl titanate, triisopropyltri(dioctylphosphate) titanate, isopropyltricumylphenyl titanate, isopropyltri(N-amidoethyl•aminoethyl) titanate, dicumylphenyloxyacetate titanate, diisostearoylethylene titanate, and the like.

Examples of the aluminum-based coupling agent include acetoalkoxyaluminum diisopropylate and the like.

The content of the substrate adhesive is preferably 0.1 to 30% by mass, more preferably 0.5 to 20% by mass, and particularly preferably 1 to 10% by mass, based on the total solids fraction of the curable composition of the invention, from the viewpoint of preventing any residue of the curable composition from remaining behind in the uncured areas.

Furthermore, in the case of applying the curable composition of the invention to the use of forming a pattern, after the pattern exposure and curing of the exposed parts, by removing the unexposed parts through development with water or alkali, in order to promote the solubility in alkali and attempting further enhancement of development, the curable composition may be added with an organic carboxylic acid, preferably a low molecular weight organic carboxylic acid having a molecular weight of 1000 or less.

Specific examples thereof include aliphatic monocarboxylic acids such as formic acid, acetic acid, propionic acid, butyric acid, valeric acid, pivalic acid, caproic acid, diethylacetic acid, enanthic acid and capyrlic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acid such as benzoic acid, toluic acid, cuminic acid, hemellitic acid and mesitylenic acid; aromatic polycarboxylic acids such as phthalic acid, isophthalic acid, terephthalic acid, trimellitic acid, trimesitylenic acid, mellophanic acid and pyromellitic acid; and other carboxylic acids such as phenyl acetate, hydroatropic acid, hydrocinnamic acid, mandelic acid, phenylsuccinic acid, atropic acid, cinnamic acid, cinnamylideneacetic acid, coumaric acid and umbellic acid.

The curable composition of the invention is preferably prepared by mixing the (A) resin having a pendant group containing a nitrogen-containing heterocyclic ring and an ethylenic unsaturated double bond in the main chain skeleton, the (B) pigment, and if necessary, other components such as the (H) dispersant, with the (C) solvent, and subjecting the mixture to a mixing/dispersion process of mixing and dispersing the mixture using various mixers and dispersing machines. That is, it is preferable to prepare the curable composition of the invention by having a pigment dispersion (pigment-dispersed composition of the invention) prepared in advance by performing the mixing/dispersion process, and then mixing this pigment dispersion with the remaining components.

In addition, the mixing/dispersion process preferably includes kneading/dispersion and a subsequently conducted microdispersion treatment, however it is also possible to omit the kneading/dispersion.

<Color Filter and Production Method Thereof>

Next, the color filter of the invention and a production method thereof will be described.

The color filter of the invention is characterized in having a colored pattern formed from the curable composition of the invention, on a support.

Hereinafter, the color filter of the invention will be described in detail by way of its production method (method of producing the color filter of the invention).

The method of producing the color filter of the invention is characterized in including a colored layer formation process of applying the curable composition of the invention on a support to form a colored layer formed form the curable composition, an exposure process of patternwise exposing the colored layer through a mask, and a development process of developing the colored layer after exposure to form a colored pattern.

Hereinafter, the respective processes in the production method of the invention will be discussed.

[Colored Layer Formation Process]

In the colored layer formation process, the curable composition of the invention is applied on a support to form a colored layer formed from the curable composition.

Examples of the support that may be used in the present process include soda glass, borosilicate glass, quartz glass and products obtained by attaching transparent conductive films thereon, which are used in liquid crystal display elements; photoelectric conversion element substrates, for example, silicon substrate and the like, which are used in image pick-up elements; complementary metal oxide semiconductors (CMOS); and the like may be mentioned. These supports may have black stripes formed thereon, which separate individual pixels.

Furthermore, these supports may also be provided with, if necessary, undercoat layers to improve the adhesion to the colored layer, to prevent material diffusion, or to render the surface smooth and flat.

As for the method of applying the curable composition of the invention on the support, various methods such as slit coating, ink-jetting, spin coating, flow casting, roll coating and screen printing, may be applied.

The film thickness measured immediately after the application of the curable composition is preferably from 0.1 to 10 µm, more preferably from 0.2 to 5 µm, and even more preferably from 0.2 to 3 µm, from the viewpoints of the uniformity of film thickness and the ease of drying of the applied solvent.

Drying (prebake) of the colored layer (curable composition layer) applied on the support, may be performed using a hot plate, an oven or the like, at a temperature of 50° C. to 140° C. for 10 to 300 seconds.

The film thickness obtained after drying of the curable composition (hereinafter, appropriately referred to as "dried film thickness"), for the use as a color filter for LCD, is preferably 0.1 µm or more and less than 2.0 µm, more preferably 0.2 µm or more and 1.8 µm or less, and particularly preferably 0.3 µm or more and 1.75 µm or less, in view of coping with the thickness reduction of LCDs and securing the color density.

For the use as a color filter for IS, the dried film thickness is preferably 0.05 µm or more and less than 1.0 µm, more preferably 0.1 µm or more and 0.8 µm or less, and particularly preferably 0.2 µm or more and 0.7 µm or less, in view of securing the color density, and in view of alleviating the inconvenience caused by that the light coming from oblique directions does not reach the photoreceiver and makes a significant difference in the light collecting efficiency between the corners and the central area of a device.

[Exposure Process]

In the exposure process, the colored layer (curable composition layer) formed in the above-described colored layer formation process is exposed patternwise through a mask having a predetermined mask pattern.

As for the radiation that may be used upon the exposure, particularly ultraviolet radiation such as g-ray or i-ray is preferably used. The irradiation dose is preferably from 5 to 1500 mJ/cm$^2$, more preferably from 10 to 1000 mJ/cm$^2$, and most preferably from 10 to 500 m/cm$^2$.

When the color filter of the invention is intended for the use in liquid crystal display elements, the irradiation dose is, within the above-described range, preferably from 5 to 200 mJ/cm$^2$, more preferably from 10 to 150 m/cm$^2$, and most preferably from 10 to 100 mJ/cm$^2$. Also, when the color filter of the invention is intended for the use in solid state image pick-up elements, the irradiation dose is, within the above-described range, preferably from 30 to 1500 mJ/cm$^2$, more preferably from 50 to 1000 mJ/cm$^2$, and most preferably from 80 to 500 mJ/cm$^2$.

[Development Process]

Next, when an alkali development treatment (developing process) is carried out, the unexposed parts from the above-described exposure process are eluted with a developer solution, so that only the photocured parts are left behind.

The developing temperature is usually 20° C. to 30° C., and the developing time is 20 to 90 seconds.

Examples of the alkali agent used in the developer solution include organic alkaline compounds such as aqueous ammonia, ethylamine, diethylamine, dimethylethanolamine, tetramethylammonium hydroxide, tetraethylammonium hydroxide, choline, pyrrole, piperidine and 1,8-diazabicyclo-[5.4.0]-7-undecene; inorganic alkaline compounds such as sodium hydroxide, potassium hydroxide, sodium hydrogen carbonate and potassium hydrogen carbonate; and the like. An alkaline aqueous solution prepared by diluting one of these alkali agents with purified water to a concentration of 0.001% to 10% by mass, and preferably 0.01% to 1% by mass, is preferably used as the developer solution. In addition, when a developer solution formed from such an alkaline aqueous solution is used, the color filter is generally washed (rinsed) with purified water after development.

Subsequently, excess developer solution is removed by washing, and thereby the color filter is dried.

In addition, the production method of the invention may also include, after carrying out the above-described colored layer formation process, exposure process and development process, if necessary, a curing process for curing the formed colored pattern by heating (postbake) and/or exposure.

The postbake is a heat treatment after development intended to complete the curing, and is usually performed by a thermal curing treatment at 100° C. to 240° C. If the substrate is a glass substrate or a silicon substrate, the temperature is, even within the above-described temperature range, preferably 200° C. to 240° C.

This postbake treatment may be performed continuously or batchwise, using a heating means such as a hot plate, a convection oven (hot air circulating drier) or a high frequency heater to provide conditions as described above.

A color filter having a desired color is produced by repeating the above-described colored layer formation process, exposure process and developing process (and the curing process, if necessary), for a number identical to the number of desired colors (three colors or four colors).

As described above, the use of the curable composition of the invention has been mainly described in terms of the use in the pixels of a color filter, however it is needless to say that the curable composition may also be applied to the black matrix that is disposed between the pixels of the color filter. The black matrix may be formed in the same manner as in the method of producing pixels, by performing pattern exposure, alkali development and then postbake to accelerate the curing of the film, except that a black pigment such as carbon black or titanium black is added as the colorant to the curable composition of the invention.

Since the color filter of the invention uses the curable composition of the invention, the formed colored pattern is highly adhesive to the support, and since the uncured areas to be removed easily by a developer solution, the color filter attains a colored pattern of high resolution, which has good adhesiveness to the support and has a desired shape of cross-section. Therefore, the color filter may be suitably used in liquid crystal display elements or solid state image pick-up elements such as CCD. In particular, the color filter is suitable for CCD elements or CMOS of very high resolution, which may contain more than one million pixels.

The color filter of the invention may be used as, for example, a color filter which is disposed between the photo-receiver of each pixel and a microlens for collecting light, in a CCD.

EXAMPLES

Hereinafter, the present invention will be described in more detail by the Examples, however the invention is not intended to be limited to the following examples unless they are beyond the spirit of the invention. In addition, "parts" indicates "parts by mass," unless otherwise stated.

Synthesis Example 1

1. Synthesis of Monomer 1

9.51 g of 2-aminopyrimidine was dissolved in 30 g of pyridine, and the solution was heated to 45° C. To this, 17.1 g of 2-methacryloyloxyethyl isocyanate was added dropwise, and the mixture was heated and stirred at 50° C. for 5 hours. This reaction liquid was poured onto 200 g of distilled water while the system was stirred, and the precipitate thus obtained was separated by filtration and washed, to obtain 23.8 g of monomer 1.

2. Synthesis of Polymer 1

30 g of the monomer 1, 130 g of methacrylic acid and 380 g of 1-methyl-2-pyrrolidinone were introduced into a three-necked flask purged with nitrogen, and the mixture was stirred with a stirrer (Shinto Kagaku Co., Ltd.; Three-One Motor), and heated to elevate the temperature to 78° C., while nitrogen was passed into the flask. To this system, 3 g of dimethyl-2,2'-azobis(2-methylpropionate) (V-601 manufactured by Wako Pure Chemical Industries, Ltd.) was added, and the mixture was heated and stirred at 78° C. for 2 hours. After 2 hours, 3 g of V-601 was further added, and the mixture was heated and stirred for 3 hours. The temperature of the system was elevated to 90° C., and the system was stirred for another 1 hour to complete the reaction. The reaction liquid was stood to cool to room temperature, and was introduced into 5 L of water to precipitate a solid. The solid was collected by filtration and dried, to yield 158 g of a polymer compound. The acid value of this polymer compound was measured by an alkali titration method, and was found to be 528 mg KOH/g (calculated value: 529 mg KOH/g). Thus, it was confirmed that polymerization was performed properly. The weight average molecular weight of the polymer compound was found to be 16700.

50 g of the obtained polymer compound was dissolved in 150 g of 1-methyl-2-pyrrolidinone, and the solution was heated to 90° C. Then, 220 mg of methoxyphenol and 40 g of glycidyl methacrylate were added thereto. 1.0 g of tetrabutylammonium bromide was further added, and the mixture was heated and stirred at 90° C. for 6 hours. The reaction liquid was stood to cool to room temperature, and was introduced into 2 L of water to precipitate a solid. The solid was collected by filtration and dried, to yield 86 g of a polymer compound. The acid value of this polymer compound (polymer 1) was measured by an alkali titration method, and was found to be 117 mg KOH/g (calculated value: 119 mg KOH/g). The weight average molecular weight of the polymer compound was 32600. The structure of the polymer 1 is presented below.

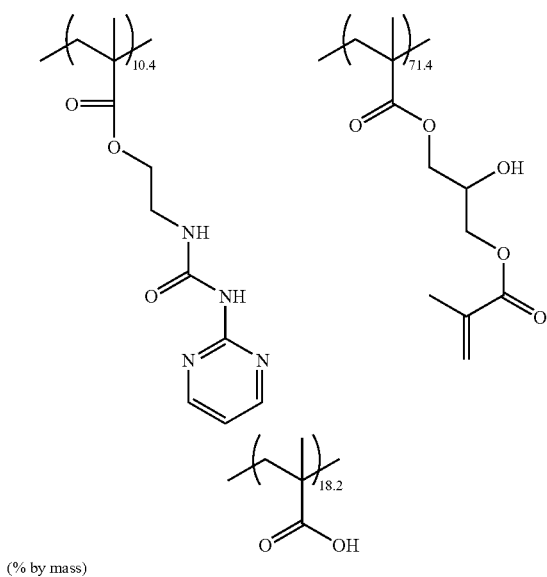

(% by mass)

Synthesis Example 2

Polymer 2 was obtained in the same manner as in Synthesis Example 1, except that "9.51 g of 2-aminopyrimidine" used in the synthesis of monomer 1 in Synthesis Example 1, was changed to "13.3 g of 2-aminobenzimidazole." For the polymer 2 thus obtained, the weight average molecular weight was measured by a gel permeation chromatography (GPC) method using polystyrene as the standard material, and the weight average molecular weight was 34200. Also, the acid value of this polymer compound was determined by titration, and the acid value was 118 mg KOH/g. The structure of the polymer 2 is presented below.

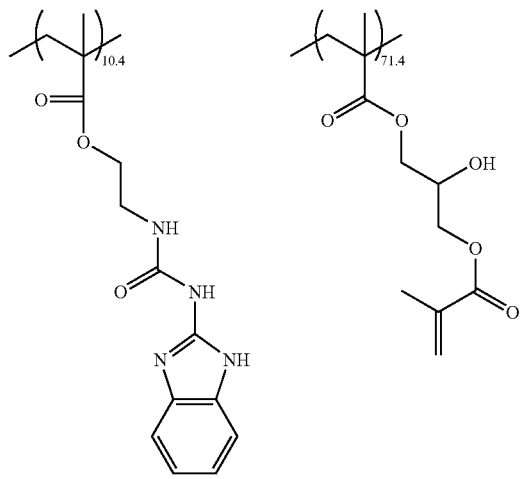

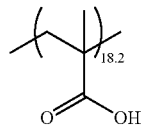

(% by mass)

Synthesis Example 3

1. Synthesis of Monomer 3

13.3 g of 2-aminobenzimidazole and 13.8 g of potassium carbonate were dissolved in 30 g of dimethylsulfoxide, and the solution was heated to 45° C. To this, 22.9 g of chloromethylstyrene was added dropwise, and the mixture was heated and stirred at 50° C. for 5 hours. This reaction liquid was poured onto 200 g of distilled water while the system was stirred, and the precipitate thus obtained was separated by filtration and washed, to obtain 25.6 g of monomer 3.

2. Synthesis of Polymer 3

Polymer 3 was obtained in the same manner as in Synthesis Example 1, except that the monomer 1 of Synthesis Example 1 was changed to monomer 3. For the obtained polymer 3, the weight average molecular weight was measured by a gel permeation chromatography (GPC) method using polystyrene as the standard material, and the weight average molecular weight was 32000. Also, the acid value of this polymer compound was determined by titration, and the acid value was 119 mg KOH/g. The structure of the polymer 3 is presented below.

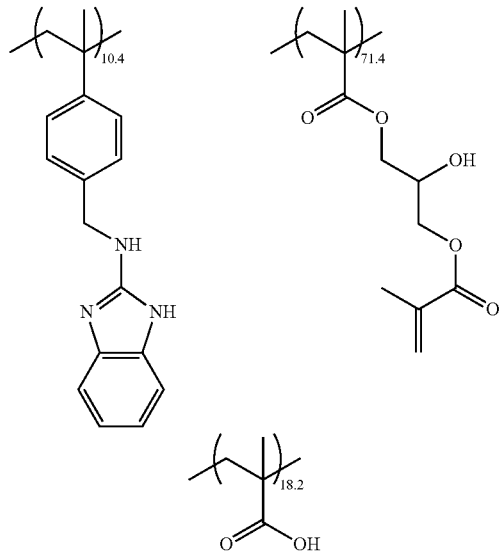

(% by mass)

Synthesis Example 4

1. Synthesis of Monomer 4

9.76 g of 9-(10H)-acridone and 5.94 g of potassium t-butoxide were dissolved in 30 g of dimethylsulfoxide, and the solution was heated to 45° C. To this, 15.26 g of chloromethylstyrene was added dropwise, and the mixture was heated and stirred at 50° C. for 5 hours. This reaction liquid was poured onto 200 g of distilled water while the system was stirred, and the precipitate thus obtained was separated by filtration and washed, to obtain 11.9 g of monomer 4.

2. Synthesis of Polymer 4

10.0 g of the monomer 4, 39.0 g of polymethyl methacrylate having methacryloyl groups at the terminals (AA-6; manufactured by Toagosei Co., Ltd.), 12.0 g of methacrylic acid, 54.92 g of the following compound (j-1), and 120 g of 1-methyl-2-pyrrolidinone were introduced into a three-necked flask purged with nitrogen, and the mixture was stirred with a stirrer (Shinto Kagaku Co., Ltd.; Three-One Motor), and heated to elevate the temperature to 78° C., while nitrogen was passed into the flask. To this system, 3 g of V-601 (polymerization initiator; manufactured by Wako Pure Chemical Industries, Ltd.) was added, and the mixture was heated and stirred at 78° C. for 2 hours. After 2 hours, 3 g of V-601 was further added, and the mixture was heated and stirred for 3 hours. Then, the reaction solution was cooled to room temperature, and was introduced into 3 L of water to precipitate a polymer compound. The precipitated polymer compound was collected by filtration, washed with water and dried, to yield 113 g of a polymer compound.

For the obtained polymer compound, the acid value was measured by titration, and was found to be 67.0 mg KOH/g (calculated value: 67.5 mg KOH/g). Thus, it was confirmed that polymerization was performed properly. The weight average molecular weight of the polymer compound was measured by a gel permeation chromatography (GPC) method using polystyrene as the standard material, and the weight average molecular weight was found to be 16100.

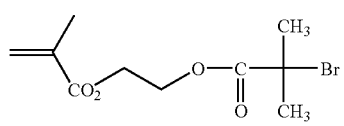

Subsequently, 113 g of the obtained polymer compound and 1.0 g of p-methoxyphenol were introduced into a 1000-ml three-necked flask, and 540 g of 1-methyl-2-pyrrolidone was added to dissolve the mixture. Then, the solution was cooled in an ice bath charged with ice water. After the temperature of this mixture liquid reached 5° C. or below, 100 g of 1,8-diazabicyclo[5.4.0]-7-undecene (DBU) was further added dropwise over 1 hour using a dropping funnel. After the dropwise addition was completed, the ice bath was taken out, and the system was stirred for another 8 hours. The obtained reaction liquid was adjusted to pH 7 by adding concentrated hydrochloric acid, and then 7 L of water was introduced, to precipitate a polymer compound. The precipitated polymer compound was collected by filtration, washed with water and dried, to yield 99 g of a resin compound (polymer 4).

The obtained resin compound was subjected to the measurement of $^1$H-NMR, and it was confirmed that 100% of the side chain groups derived from the compound (j-1) was converted to ethylene methacrylate groups. Further, the weight average molecular weight was measured by a gel permeation chromatography (GPC) method using polystyrene as the standard material, and the weight average molecular weight was found to be 14800. The acid value of this resin compound was also determined by titration, and the acid value was 78.1 mg KOH/g (calculated value: 78.2 mg KOH/g). The structure of the polymer 4 is presented below.

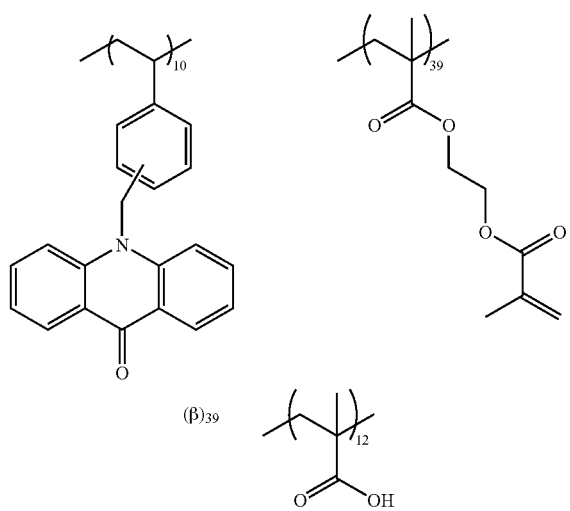

(% by mass)
β: Repeating structure of polymethyl methacrylate oligomer having a methacryloyl group at one end, AA-6
(Mn = 6000, manufactured by Toagosei Co., Ltd.)

Synthesis Example 5

Polymer 5 was obtained in the same manner as in Synthesis Example 4, except that 9.76 g of 9-(10H)-acridone used in the synthesis of the monomer 4 in Synthesis Example 4, was changed to 7.8 g of phthalimide. For the polymer 5, the weight average molecular weight was measured by a gel permeation chromatography (GPC) method using polystyrene as the standard material, and the weight average molecular weight was found to be 13900. The acid value of this polymer compound was also determined by titration, and the acid value was 78.0 mg KOH/g. The structure of the polymer 5 is presented below.

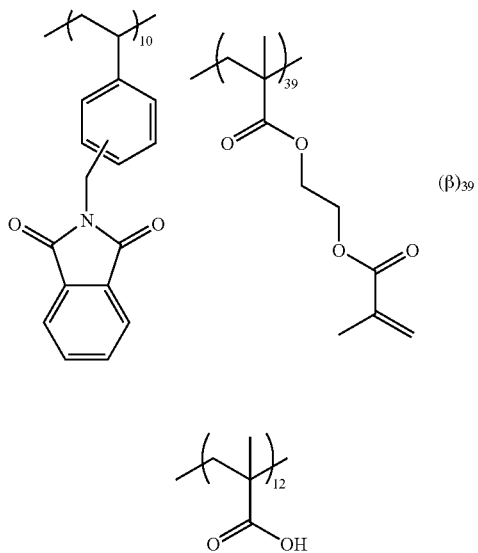

(% by mass)
β: Repeating structure of polymethyl methacrylate oligomer having a methacryloyl group at one end, AA-6
(Mn = 6000, manufactured by Toagosei Co., Ltd.)

Synthesis Example 6

Polymer 6 was obtained in the same manner as in Synthesis Example 4, except that 9.76 g of 9-(10H)-acridone used in the synthesis of the monomer 4 in Synthesis Example 4, was changed to 9.52 g of 1,8-naphthalimide. For the obtained polymer 6, the weight average molecular weight was measured by a gel permeation chromatography (GPC) method using polystyrene as the standard material, and the weight average molecular weight was found to be 15200. The acid value of this polymer compound was also determined by titration, and the acid value was 78.2 mg KOH/g. The structure of the polymer 6 is presented below.

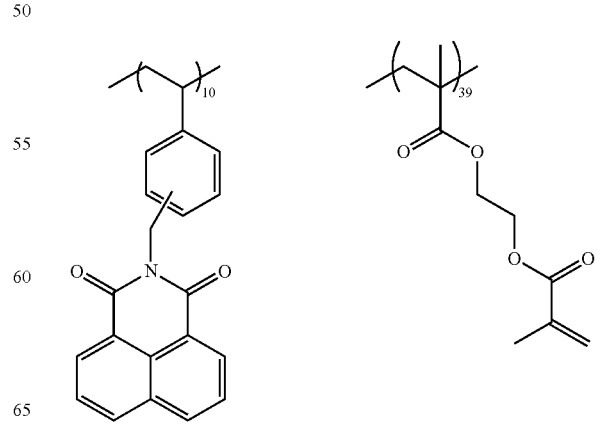

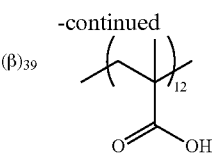

(% by mass)
β: Repeating structure of polymethyl methacrylate oligomer having a methacryloyl group at one end, AA-6
(Mn = 6000, manufactured by Toagosei Co., Ltd.)

Synthesis Example 7

Synthesis of Polymer for Comparison 120 g of propylene glycol monomethyl ether was introduced into a 1000-ml three-necked flask, and under a nitrogen gas stream, the system was heated to 90° C. To this, 74 g of benzyl methacrylate, 84 g of methacrylic acid, and 120 g of a propylene glycol monomethyl ether solution containing 9.7 g of V-601 (manufactured by Wako Pure Chemical Industries, Ltd.) were added dropwise over 2 hours. After the dropwise addition was completed, the system was stirred for another 2 hours. Thereafter, the reaction solution was cooled to room temperature, and then 8 L (liter; hereinafter, the same) of water was introduced to precipitate a polymer compound. The precipitated polymer compound was collected by filtration, washed with water and dried, to yield 150 g of a polymer compound.

For the obtained polymer compound, the weight average molecular weight was measured by a gel permeation chromatography (GPC) method using polystyrene as the standard material, and the weight average molecular weight was found to be 12000. The acid value of this polymer compound was also determined by titration, and the acid value was 202 mg KOH/g (calculated value: 204 mg KOH/g). Thus, it was confirmed that polymerization was conducted properly.

Thereafter, 40 g of the obtained polymer compound was added to a 1000-ml three-necked flask, and 110 mg of p-methoxyphenol was introduced thereto. 60 g of propylene glycol monomethyl ether was further added to dissolve the mixture. To this, 820 mg of tetrabutylammonium bromide was also added, and the mixture was heated to 80° C. Then, 10 g of glycidyl methacrylate was added, and the system was stirred for 6 hours. Then, it was confirmed by gas chromatography that the peak originating from glycidyl methacrylate disappeared. This reaction liquid was introduced into 7 L of water to precipitate a polymer compound (polymer for comparison (X)). The precipitated polymer compound was collected by filtration, washed with water and dried, to yield 54 g of a polymer for comparison (X).

For the obtained polymer compound (polymer for comparison (X)), the weight average molecular weight was measured by a gel permeation chromatography (GPC) method using polystyrene as the standard material, and the weight average molecular weight was found to be 17800. The acid value of this polymer compound was also determined by titration, and the acid value was 120 mg KOH/g.

The structure of the polymer for comparison (X) is presented below.

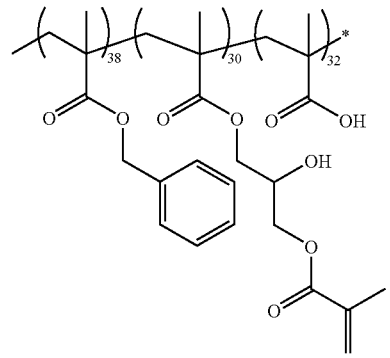

(% by mass)
(* represents repetitions)

Example 1

A1-1. Preparation of Pigment-Dispersed Composition (Composition Liquid)

Components of the following composition (1) were mixed by stirring of the mixture for 3 hours using a homogenizer at a rotation speed of 3,000 rpm, to prepare a mixed solution containing a pigment.

| [Composition (1)] | |
|---|---|
| C.I. Pigment Red 254 | 90 parts |
| C.I. Pigment Red 139 | 10 parts |
| 30% solution of the polymer 1 in propylene glycol monomethyl ether acetate | 150 parts |
| 1-methoxy-2-propyl acetate | 750 parts |

Subsequently, the mixed solution obtained in the above was further subjected to a dispersion treatment for 6 hours with a bead dispersing machine, Dispermat (manufactured by GETZMANN GmbH), using 0.3-mmφ zirconia beads. Thereafter, the mixed solution was further subjected to a dispersion treatment with a high pressure dispersing machine equipped with a pressure reducing instrument, NANO-3000-10 (manufacture by Nippon BEE Chemical Co., Ltd.), at a flow rate of 500 g/min under a pressure of 2000 kg/cm³. This latter dispersion treatment was repeated 10 times to obtain a red pigment-dispersed composition (P1).

A1-2. Preparation of Curable Composition (Coating Solution)

The pigment dispersion (P1) obtained in the above was used, and components of the following composition were mixed and stirred, to prepare a solution of curable composition.

| <Composition> | |
|---|---|
| Pigment dispersion described above (P1) | 1000 parts |
| 2,2'-Bis(2-chlorophenyl)-4,4',5,5'-tetraphenyl-1,2'-biimidazole [photopolymerization initiator] | 12 parts |
| Dipentaerythritol hexaacrylate [DPHA; photopolymerizable compound] | 30 parts |
| TO-756 (manufactured by Toagosei Co., Ltd.; photopolymerizable compound) | 30 parts |

-continued

| <Composition> | |
|---|---|
| Compound α in the below [sensitizer] | 4 parts |
| 2-mercaptobenzimidazole [co-sensitizer] | 4 parts |
| Solution of benzyl methacrylate/methacrylic acid (= 70/30 [molar ratio]) copolymer (weight average molecular weight: 10,000) in propylene glycol monomethyl ether acetate (solids fraction 40%) (alkali-soluble resin) | 50 parts |
| 1-methoxy-2-propyl acetate (solvent) [Kagaku 71] | 20 parts |

Compound α

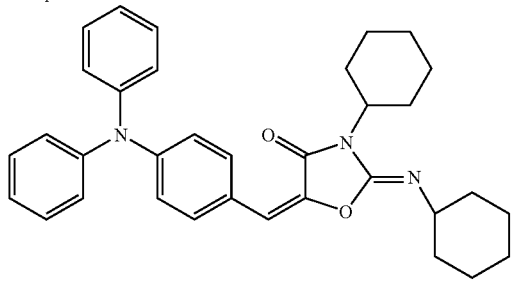

A2. Production of Color Filter

[A2-1. Formation of Curable Composition Layer]

The pigment-containing curable composition prepared as described above was used as a resist solution to perform slit coating on a glass substrate having a size of 550 mm×650 mm under the following conditions, and then the coating was left to stand in that state for 10 minutes. Vacuum drying and prebake (for 80 seconds at 100° C.) were performed to form a curable composition layer (colored layer).

| * Slit coating conditions | |
|---|---|
| Gap between openings at the front end of coating head: | 50 μm |
| Coating speed: | 100 mm/sec |
| Clearance between substrate and coating head: | 150 μm |
| Dried film thickness: | 1.75 μm |
| Coating temperature: | 23° C. |

[A2-2. Exposure and Development]

Thereafter, this curable composition layer was subjected to patternwise exposure using a 2.5-kW ultrahigh pressure mercury lamp and a testing photomask having a line width of 20 μm. After the exposure, the entire layer surface was coated with a 10% aqueous solution of an organic developer solution (trade name: CD, manufactured by Fuji Film Electronic Materials, Inc.), and was left to stand for 60 seconds to perform a development treatment.

[A2-3. Heat Treatment]

After the standing, purified water was sprayed in shower form to wash off the developer solution, and the curable composition layer which had undergone prebake and development treatments was heated in an oven at 220° C. for 1 hour (postbake). Thus, a color filter in which a colored pattern was formed by curing the curable composition layer on a glass substrate, was obtained.

A3. Performance Evaluation

The storage stability and microdispersibility of the pigment dispersion (P1) prepared in the above, the storage stability of the solution of the curable composition prepared in the above (coating solution), and the exposure sensitivity, adhesiveness to support, developability and the cross-section shape of pattern of the curable composition layer formed on a glass substrate using the curable composition, were evaluated as follows. The evaluation results are presented in Table 1.

—Performance Evaluation of Pigment Dispersion—

[A3-1. Storage Stability Over Time of Pigment Dispersion]

The pigment dispersion (P1) prepared in the above was stored at room temperature for one week, and then the viscosity of the liquid was measured with an E-type viscometer (manufactured by Tokyo Keiki Co., Ltd.), to perform an evaluation according the following evaluation criteria. The results are presented in Table 1.

—Evaluation Criteria—

A: The increment in viscosity relative to the viscosity prior to storage was less than 5%.

B: An increment in viscosity of 5% or more and less than 10% relative to the viscosity prior to storage, was recognized.

C: An increment in viscosity of 10% or more relative to the viscosity prior to storage was recognized.

[A3-2. Microdispersibility of Pigment Dispersion]

For the pigment dispersion (P1), the average particle size of the pigment was measured by a dynamic light scattering method (measured using a Microtrac Nanotrac UPA-EX150 manufactured by Nikkiso Co., Ltd., without further diluting the pigment dispersion (P1)). A smaller average particle size of the pigment means higher microdispersibility.

—Evaluation Criteria—

A: The average particle size was less than 70 nm.

B: The average particle size was 70 nm or greater and less than 150 nm.

C: The average particle size was 150 nm or greater.

—Performance Evaluation of Curable Composition—

[A3-3. Storage Stability Over Time of Curable Composition]

The curable composition (coating solution) prepared in the above was stored at room temperature for 1 month, and then the viscosity of the liquid was measured with an E-type viscometer (manufactured by Tokyo Keiki Co., Ltd.), to perform an evaluation according the following evaluation criteria.

—Evaluation Criteria—

A: No increase in viscosity was recognized.

B: An increment in viscosity of 5% or greater and less than 10% relative to the viscosity prior to storage was recognized.

C: An increment in viscosity of 10% or greater relative to the viscosity prior to storage was recognized.

[A3-4. Exposure Sensitivity of Curable Composition Layer]

The curable composition layer after coating was exposed by varying the exposure amount to various amounts of exposure in the range of 10 to 100 mJ/cm$^2$, and the exposure amount giving a pattern line width of 20 μm after the postbake was evaluated as the exposure sensitivity. The exposure sensitivity implies that a smaller value corresponds to higher sensitivity.

[A3-5. Developability, Adhesiveness to Support, and Cross-Section Shape of Pattern]

The substrate surface and the shape of the cross-section pattern after the postbake were confirmed by the observation with an optical microscope and SEM photographs, and the developability, cross-section shape of pattern and adhesiveness to support were evaluated as respectively presented below. Details of the evaluation methods and evaluation criteria are as follows.

<Developability>

In the exposure and development of the above section (A2-2), the presence or absence of any residues in the region where light was not irradiated (unexposured parts) was observed, and developability was evaluated according to the following evaluation criteria.

—Evaluation Criteria—

A: No residues were recognized at the unexposed parts.

B: Slight residues were recognized at the unexposed parts, however the extent was practically negligible.

C: Residues were recognized at the unexposed parts.

<Adhesiveness to Support>

The evaluation of the adhesiveness to support was performed according to the following evaluation criteria, by observing whether there were generated any pattern defects or not.

—Evaluation Criteria—

A: No pattern defects were observed.

B: Pattern defects were mostly not observed, however some defects were observed.

C: Significant pattern defects were observed.

(Cross-Section Shape of Pattern)

The shape of cross-section of the formed colored pattern was observed and evaluated. The most preferable cross-section shape of the pattern is a forward tapered shape, and the next preferable shape is a rectangular shape. An inversely tapered shape is not preferred.

Examples 2 to 6

Red pigment-dispersed compositions and curable compositions were prepared in the same manner as in Example 1, except that the pigment dispersant (polymer 1) of Example 1 was replaced by the polymer compounds (pigment dispersant) obtained in the Synthesis Examples 2 to 6, respectively (polymer 2-polymer 6). Color filters were further produced, and the same evaluation as in Example 1 was performed. The results are presented in Table 1.

Example 7

A green pigment-dispersed composition was prepared in the same manner as in Example 1, except that the red pigment-dispersed composition (P1) of Example 1 was replaced with a pigment-dispersed composition (P2) obtained using a mixed solution containing green pigments of the following composition (2). A color filter was also produced, and the same evaluation as in Example 1 was performed. The results are presented in the following Table 1.

| [Composition (2)] | |
|---|---|
| C.I. Pigment Green 36 | 60 parts |
| C.I. Pigment Yellow 150 | 40 parts |
| 30% solution of polymer 1 in propylene glycol monomethyl ether acetate | 150 parts |
| 1-methoxy-2-propyl acetate | 750 parts |

Examples 8 to 12

Green pigment-dispersed compositions and curable compositions were prepared in the same manner as in Example 7, except that the pigment dispersant (polymer 1) of Example 7 was replaced respectively with the polymer compounds (pigment dispersants) obtained in Synthesis Examples 2 to 6 (polymer 2 to polymer 6). Color filters were also produced, and the same evaluation as in Example 7 was performed. The results are presented in Table 1.

Example 13

A blue pigment-dispersed composition and a curable composition were prepared in the same manner as in Example 1, except that the red pigment-dispersed composition (P1) of Example 1 was replaced with a blue pigment-dispersed composition (P3) obtained using a mixed solution containing blue pigments of the following composition (3). A color filter was also produced, and the same evaluation as in Example 1 was performed. The results are presented in Table 1.

| [Composition (3)] | |
|---|---|
| C.I. Pigment Blue 15:6 | 85 parts |
| C.I. Pigment Violet 23 | 15 parts |
| 30% solution of polymer 1 in propylene glycol monomethyl ether acetate | 150 parts |
| 1-Methoxy-2-propyl acetate | 750 parts |

Examples 14 to 18

Red pigment-dispersed compositions and curable compositions were prepared in the same manner as in Example 13, except that the pigment dispersion (polymer 1) of Example 13 was replaced respectively with the polymer compounds (pigment dispersant) obtained in Synthesis Examples 2 to 6, respectively (polymer 2 to polymer 6). Color filters were also produced, and the same evaluation as in Example 13 was performed. The results are presented in Table 1.

Comparative Example 1

A red pigment-dispersed composition and a curable composition were prepared in the same manner as in Example 1, except that the polymer 1 (pigment dispersant) of Example 1 was replaced with a copolymer of methyl methacrylate and methacrylic acid, D-1 (=85/15 [mass ratio], weight average molecular weight: 15000). A color filter was also produced, and the same evaluation as in Example 1 was performed. The results are presented in Table 1.

Comparative Example 2

A red pigment-dispersed composition and a curable composition were prepared in the same manner as in Example 1, except that the polymer 1 (pigment dispersant) of Example 1 was replaced with a copolymer of methacrylic acid and polymethyl methacrylate having methacryloyl groups at the ends, D-2 (=15/85 [mass ratio], weight average molecular weight: 30000). A color filter was also produced, and the same evaluation as in Example 1 was performed. The results are presented in Table 1.

Comparative Example 3

A red pigment-dispersed composition and a curable composition were prepared in the same manner as in Example 1, except that the polymer 1 (pigment dispersant) of Example 1 was replaced with the polymer for comparison (X). A color filter was also produced, and the same evaluation as in Example 1 was performed. The results are presented in Table 1.

Comparative Examples 4 to 6

Green pigment-dispersed compositions and curable compositions were prepared in the same manner as in Example 7, except that the polymer 1 (pigment dispersant) of Example 7 was replaced with the above-described D-1, D-2 and the polymer for comparison (X), respectively. Color filters were also produced, and the same evaluation as in Example 7 was performed. The results are presented in Table 1.

Comparative Examples 7 to 9

Blue pigment-dispersed compositions and curable compositions were prepared in the same manner as in Example 13, except that the polymer 1 (pigment dispersant) of Example 13 was replaced with the above-described D-1, D-2 and the polymer for comparison (X), respectively. Color filters were also produced, and the same evaluation as in Example 13 was performed. The results are presented in Table 1.

From the results of Table 1, it may be seen that the curable composition of each Example, which was prepared using a pigment dispersion containing a resin having a pendant group containing a nitrogen-containing heterocyclic ring and an ethylenic unsaturated double bond in the main chain skeleton, had excellent storage stability in the solution state. It may also be seen that in the case of forming a colored pattern on a support using this curable composition, a color filter having a high exposure sensitivity and excellent developability, and also being excellent in both adhesiveness to support and the cross-section shape of pattern may be obtained, as compared to the respective Comparative Examples not using these specific compounds.

Example 19

B1. Preparation of Resist Solution

The components of the following composition were mixed and dissolved, to prepare a resist solution.

TABLE 1

| | Evaluation results | | | | | | |
|---|---|---|---|---|---|---|---|
| | Pigment-dispersed composition | | Curable composition | Curable composition layer | | | |
| | Storage stability of dispersion | Microdispersibility | Storage stability | Exposure sensitivity | Developability | Adhesion to support | Cross-section shape of pattern |
| Example 1 | A | A | A | 65 | A | A | Forward tapered |
| Example 2 | A | A | A | 50 | A | A | Forward tapered |
| Example 3 | A | A | A | 60 | A | A | Forward tapered |
| Example 4 | A | A | A | 50 | A | A | Forward tapered |
| Example 5 | A | A | A | 55 | A | A | Forward tapered |
| Example 6 | A | A | A | 45 | A | A | Forward tapered |
| Example 7 | A | A | A | 70 | A | A | Forward tapered |
| Example 8 | A | A | A | 55 | A | A | Forward tapered |
| Example 9 | A | A | A | 65 | B | A | Forward tapered |
| Example 10 | A | A | A | 55 | A | A | Forward tapered |
| Example 11 | A | A | A | 65 | A | B | Forward tapered |
| Example 12 | A | A | A | 50 | A | A | Forward tapered |
| Example 13 | A | A | A | 65 | A | B | Forward tapered |
| Example 14 | A | A | A | 50 | A | B | Forward tapered |
| Example 15 | A | A | A | 60 | A | A | Forward tapered |
| Example 16 | A | A | A | 50 | A | A | Forward tapered |
| Example 17 | A | A | A | 55 | A | A | Forward tapered |
| Example 18 | A | A | A | 45 | A | A | Forward tapered |
| Comparative Example 1 | C | C | C | 220 | C | B | Inversely tapered |
| Comparative Example 2 | C | C | C | 150 | B | B | Inversely tapered |
| Comparative Example 3 | B | B | B | 75 | B | B | Rectangular-shaped |
| Comparative Example 4 | C | C | C | 250 | C | C | Inversely tapered |
| Comparative Example 5 | C | C | C | 180 | B | B | Inversely tapered |
| Comparative Example 6 | B | B | B | 80 | B | B | Rectangular-shaped |
| Comparative Example 7 | C | C | C | 230 | C | B | Inversely tapered |
| Comparative Example 8 | C | C | C | 140 | B | B | Rectangular-shaped |
| Comparative Example 9 | B | B | B | 75 | B | B | Rectangular-shaped |

<Composition of resist solution>

| | |
|---|---|
| Propylene glycol monomethyl ether acetate (PGMEA: (D) solvent) | 19.20 parts |
| Ethyl lactate [(D) Solvent] | 36.67 parts |
| 40% solution of benzyl methacrylate/methacrylic acid/ 2-hydroxyethyl methacrylate (molar ratio = 60/22/18) copolymer in propylene glycol monomethyl ether acetate (PGMEA) [(H) binder polymer] | 30.51 parts |
| Dipentaerythrytol hexaacrylate [(F) photopolymerizable compound containing ethylenic unsaturated double bond] | 12.20 parts |
| Polymerization inhibitor (p-methoxyphenol) | 0.0061 parts |
| Fluorine-based surfactant (F-475, manufactured by Dainippon Ink and Chemicals, Inc.) | 0.83 parts |
| TAZ-107 (manufactured by Midori Chemical Co., Ltd.; trihalomethyltriazine-based (E) photopolymerization initiator) | 0.586 parts |

B2. Production of Silicon Wafer with Undercoat Layer

A 6-inch silicon wafer was heat treated in an oven at 200° C. for 30 minutes. Subsequently, the resist solution was applied on this silicon wafer to obtain a dried film thickness of 1.5 μm, and the silicon wafer was further heated to dry in an oven at 220° C. for 1 hour to form an undercoat layer. Thus, a silicon wafer substrate with an undercoat layer was obtained.

B3. Preparation of Curable Composition (Coating Solution)

The pigment dispersion (P1) obtained in Example 1 was used, and the components of the following composition were mixed and stirred to prepare a solution of curable composition.

<Composition>

| | |
|---|---|
| Pigment dispersion (P1) described above | 1000 parts |
| CGI-124 (manufactured by Ciba Specialty Chemicals, Inc.; oxime-based photopolymerization initiator) | 20 parts |
| Dipentaerythritol hexaacrylate [photopolymerizable compound] | 20 parts |
| TO-756 (manufactured by Toagosei Co., Ltd., photopolymerizable compound) | 35 parts |
| Propylene glycol monomethyl ether acetate (PGMEA; solvent) | 20 parts |

B4. Production and Evaluation of Color Filter Formed from Curable Composition

[B4-1. Formation of Pattern]

The curable composition prepared as described above was applied on the undercoat layer of the silicon wafer with undercoat layer obtained in the above B2., to form a colored layer (coating film). Then, the silicon wafer was heat treated (prebake) for 120 seconds using a hot plate at 100° C., so that the dried film thickness of this coating film became 0.7 μm.

Subsequently, the assembly was exposed at a wavelength of 365 nm with various exposure amounts in the range of 50 to 1200 mJ/cm$^2$, through a patterned mask having an island pattern with each side of 1.5 μm, using an i-ray stepper exposure apparatus FPA-3000i5+ (manufactured by Canon, Inc.).

Thereafter, the silicon wafer substrate on which a coating film had been formed after the exposure, was placed on a horizontal rotary table of a spin-shower developing machine (DW-30 type; manufactured by Chemitronics Co., Ltd.), and subjected to a paddle development at 23° C. for 60 seconds using a CD-2000 (manufactured by Fuji Film Electronics Materials Co., Ltd.), to form a colored pattern on the silicon wafer.

The silicon wafer on which a colored pattern had been formed was fixed to the horizontal rotary table by a vacuum chuck method. While the silicon wafer was rotated by a rotating apparatus at a speed of rotation of 50 rpm, a rinsing treatment was conducted by supplying purified water in shower form from above the rotational center of the silicon wafer from an ejection nozzle, and then the silicon wafer was spray-dried.

[B4-2. Evaluation of Sensitivity]

Thereafter, the size of the colored pattern was measured using a length measuring SEM "S-9260A" (manufactured by Hitachi High-Technologies Corporation). The exposure amount to obtain a pattern line width of 1.5 μm was evaluated as the exposure sensitivity. The exposure sensitivity is construed such that a smaller value indicates higher sensitivity. The measurement results are presented in Table 2.

B5. Performance Evaluation

[B5-1. Evaluation of Adhesiveness to Support, Developability and Cross-Section Shape of Pattern]

For the evaluation of properties other than sensitivity, the storage stability and microdispersibility of the pigment dispersion prepared in the above, the storage stability of the solution of curable composition (coating solution), and the adhesiveness to support, developability and the cross-section shape of pattern of the curable composition layer formed on a glass substrate using the curable composition, were evaluated in the same manner as in A3. Performance Evaluation (A3-1 to A3-5) in Example 1 described above. The following color irregularities were also evaluated. The evaluation results are presented in Table 2.

Additionally, the cross-section shape of pattern is preferably rectangular in shape, and an inversely tapered shape is not desirable.

[B5-2. Evaluation of Color Irregularities]

The brightness distribution was interpreted by the following method, and the color irregularities were evaluated on the basis of the proportion occupied by the pixels having a deviation from the average of within ±5%, in the entire number of pixels. The evaluation criteria are as follows.

First, the curable composition was coated on the undercoat layer of the glass substrate with undercoat layer which was obtained by the same method as in B2. above, to form a colored layer (coating film). The assembly was subjected to a heat treatment (prebake) using a hot plate at 100° C. for 120 seconds, so that the dried film thickness of this coating film became 0.7 μm. The brightness distribution of the glass substrate which had been completed with the coating, was interpreted from the images taken with a microscope MX-50 (manufactured by Olympus Corporation).

—Evaluation Criteria—

A: The number of pixels having a deviation from the average of within ±5% is 99% or more of the entire number of pixels.

B: The number of pixels having a deviation from the average of within ±5% is 95% or more and less than 99% of the entire number of pixels.

C: The number of pixels having a deviation from the average of within ±5% is less than 95% of the entire number of pixels.

Examples 20 to 24

Red curable compositions were prepared in the same manner as in Example 19, except that the pigment dispersant (polymer 1) of Example 19 was replaced respectively with the polymer compounds (pigment dispersant) obtained in the Synthesis Examples 2 to 6 (polymer 2 to polymer 6). Color filters were also produced, and the same evaluation as in Example 19 was performed. The results are presented in Table 2.

Example 25

A red curable composition was prepared in the same manner as in Example 19, except that the red pigment-dispersed composition (P1) of Example 19 was replaced with a green pigment-dispersed composition (P2). A color filter was also produced, and the same evaluation as in Example 19 was performed. The results are presented in Table 2.

Examples 26 to 30

Green curable compositions were prepared in the same manner as in Example 25, except that the pigment dispersant (polymer 1) of Example 25 was replaced respectively with the polymer 2 to polymer 6 (pigment dispersant). A color filter was also produced, and the same evaluation as in Example 25 was performed. The results are presented in Table 2.

Example 31

A blue curable composition was prepared in the same manner as in Example 19, except that the red pigment-dispersed composition (P1) of Example 19 was replaced with a blue pigment-dispersed composition (P3). A color filter was also produced, and the same evaluation as in Example 19 was performed. The results are presented in the following Table 2.

Examples 32 to 36

Blue curable compositions were prepared in the same manner as in Example 31, except that the pigment dispersant (polymer 1) of Example 31 was replaced respectively with the polymer 2 to polymer 6 (pigment dispersant). Color filters were also produced, and the same evaluation as in Example 31 was performed. The results are presented in Table 2.

Comparative Example 10

A red pigment-dispersed composition and a curable composition were prepared in the same manner as in Example 19, except that the polymer 1 (pigment dispersant) of Example 19 was replaced with the following copolymer of methyl methacrylate and methacrylic acid, D-1 (=85/15 [mass ratio], weight average molecular weight: 15000). A color filter was also produced, and the same evaluation as in Example 19 was performed. The results are presented in the following Table 2.

Comparative Example 11

A red pigment-dispersed composition and a curable composition were prepared in the same manner as in Example 19, except that the polymer 19 (pigment dispersant) of Example 19 was replaced with a copolymer of methacrylic acid and polymethyl methacrylate having terminal methacryloyl groups, D-2 (=15/85 [mass ratio], weight average molecular weight: 30000). A color filter was also produced, and the same evaluation as in Example 19 was performed. The results are presented in the following Table 2.

Comparative Example 12

A red pigment-dispersed composition and a curable composition were prepared in the same manner as in Example 19, except that the polymer 1 (pigment dispersant) of Example 19 was replaced with the polymer for comparison (X). A color filter was also produced, and the same evaluation as in Example 19 was performed. The results are presented in the following Table 2.

Comparative Examples 13 to 15

Green pigment-dispersed compositions and curable compositions were prepared in the same manner as in Example 25, except that the polymer 1 (pigment dispersant) of Example 25 was replaced respectively with the above-described D-1, D-2 and polymer for comparison (X). Color filters were also produced, and the same evaluation as in Example 25 was performed. The results are presented in Table 2.

Comparative Examples 16 to 18

Green pigment-dispersed compositions and curable compositions were prepared in the same manner as in Example 31, except that the polymer 1 (pigment dispersant) of Example 31 was replaced respectively with the above-described D-1, D-2 and polymer for comparison (X). Color filters were also produced, and the same evaluation as in Example 31 was performed. The results are presented in Table 2.

TABLE 2

| | Evaluation results | | | | | | | |
|---|---|---|---|---|---|---|---|---|
| | Pigment-dispersed composition | | Curable composition | Curable composition layer | | | | |
| | Storage stability of dispersion | Microdispersibility | Storage stability | Exposure sensitivity | Developability | Adhesion to support | Cross-section shape of pattern | Color irregularities |
| Example 19 | A | A | A | 350 | A | A | Rectangular-shaped | A |
| Example 20 | A | A | A | 250 | A | A | Rectangular-shaped | A |
| Example 21 | A | A | A | 300 | A | B | Rectangular-shaped | A |
| Example 22 | A | A | A | 260 | A | A | Rectangular-shaped | A |
| Example 23 | A | A | A | 280 | A | A | Rectangular-shaped | A |
| Example 24 | A | A | A | 200 | A | A | Rectangular-shaped | A |
| Example 25 | A | A | A | 400 | A | A | Rectangular-shaped | A |
| Example 26 | A | A | A | 300 | A | A | Rectangular-shaped | A |

TABLE 2-continued

| | Pigment-dispersed composition | | Curable composition | Curable composition layer | | | | |
|---|---|---|---|---|---|---|---|---|
| | Storage stability of dispersion | Microdispersibility | Storage stability | Exposure sensitivity | Developability | Adhesion to support | Cross-section shape of pattern | Color irregularities |
| Example 27 | A | A | A | 380 | B | A | Rectangular-shaped | A |
| Example 28 | A | A | A | 340 | B | B | Rectangular-shaped | A |
| Example 29 | A | A | A | 360 | A | B | Rectangular-shaped | A |
| Example 30 | A | A | A | 250 | A | A | Rectangular-shaped | A |
| Example 31 | A | A | A | 350 | A | A | Rectangular-shaped | A |
| Example 32 | A | A | A | 250 | A | A | Rectangular-shaped | A |
| Example 33 | A | A | A | 300 | A | A | Rectangular-shaped | A |
| Example 34 | A | A | A | 250 | A | A | Rectangular-shaped | A |
| Example 35 | A | A | A | 270 | A | A | Rectangular-shaped | A |
| Example 36 | A | A | A | 250 | A | A | Rectangular-shaped | A |
| Comparative Example 10 | C | C | C | 850 | C | B | Inversely tapered | C |
| Comparative Example 11 | C | C | C | 650 | B | B | Inversely tapered | C |
| Comparative Example 12 | B | B | B | 450 | B | B | Inversely tapered | B |
| Comparative Example 13 | C | C | C | 1000 | C | C | Inversely tapered | C |
| Comparative Example 14 | C | C | C | 750 | B | B | Inversely tapered | C |
| Comparative Example 15 | B | B | B | 500 | B | B | Inversely tapered | B |
| Comparative Example 16 | C | C | C | 900 | C | B | Inversely tapered | C |
| Comparative Example 17 | C | C | C | 800 | B | B | Inversely tapered | C |
| Comparative Example 18 | B | B | B | 450 | B | B | Rectangular-shaped | B |

From the results of Table 2, it may be seen that the curable composition (pigment-based) of each Example which was prepared using a pigment dispersion which contains a resin having a pendant group containing a nitrogen-containing heterocyclic ring and an ethylenic unsaturated double bond in the main chain skeleton, and which is used in the formation of color filter for the application of solid state image pick-up elements, has excellent storage stability in its solution state. Also, it may be seen that in the case of forming a colored pattern on a support using this curable composition, a color filter having high exposure sensitivity and excellent developability, and also being excellent in both adhesiveness to substrate and the cross-section shape of pattern, may be obtained, as compared to the respective Comparative Examples not using specific compounds.

It is known from these results that the curable compositions of Examples may realize excellent pattern forming properties even in the case of producing a color filter for the application of solid state image pick-up elements, in the same manner as in the case of producing a color filter for the application of liquid crystal display elements.

The entirety of the disclosure of Japanese Patent Application No. 2007-092042 is incorporated herein by reference. All of literatures, patent applications and technical standards described herein have been incorporated herein by reference, to the same extent as in the case of the individual literatures, patent applications and technical standards have been described specifically and individually.

The invention claimed is:
1. A pigment-dispersed composition comprising at least a resin including, as copolymer components, a structural unit having a pendant group containing a nitrogen-containing heterocyclic ring, and a structural unit represented by Formula (6) having a pendant group containing an ethylenic unsaturated double bond; a pigment; and a solvent:

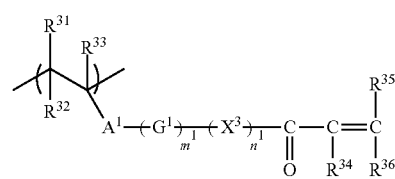

Formula (6)

wherein, in Formula (6), $A^1$ represents —CO—, —C(=O)O—, —CONH—, —OC(=O)— or a phenylene group; $G^1$ represents a divalent organic group; $X^3$ represents an oxygen atom, a sulfur atom or —N($R^{52}$)—; $R^{52}$ represents an alkyl group which may be substituted; $m^1$ and $n^1$ each independently represents 0 or 1; and $R^{31}$ to $R^{36}$ each independently represents a hydrogen atom or a monovalent substituent;
wherein the resin includes a structural unit represented by the following Formula (1) as a structural unit having a pendant group containing a nitrogen-containing heterocyclic ring:

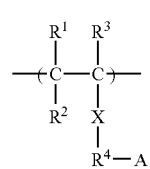

Formula (1)

wherein, in Formula (1), $R^1$ and $R^2$ each independently represents a hydrogen atom or a monovalent organic group; $R^3$ represents a hydrogen atom, a hydrocarbon group having 1 to 6 carbon atoms, —COOH, —CN, —CF$_3$, —CH$_2$OH, —CH$_2$COOH, —CH$_2$COOR$^a$ or —COOR$^b$, wherein R$^a$ and R$^b$ each independently represents a hydrocarbon group having 1 to 6 carbon atoms; X represents —O—, —CO—, —COO—, OCO—, —CONH—, —NHCO— or phenylene; $R^4$ represents a divalent organic group or a single bond; and A represents a nitrogen-containing heterocyclic ring.

2. A curable composition comprising the pigment-dispersed composition of claim 1, and a photopolymerization initiator.

3. The curable composition of claim 2, further comprising a photopolymerizable compound.

4. A color filter having a colored pattern formed from the curable composition of claim 3 on a support.

5. A color filter having a colored pattern formed from the curable composition of claim 2 on a support.

6. The pigment-dispersed composition of claim 1, wherein X represents —O—, —CO—, —COO—, OCO—, —CONH—, or —NHCO—.

7. The pigment-dispersed composition of claim 1, wherein the structural unit represented by Formula (1) is a structural unit represented by the following Formula (2) or a structural unit represented by the following Formula (3):

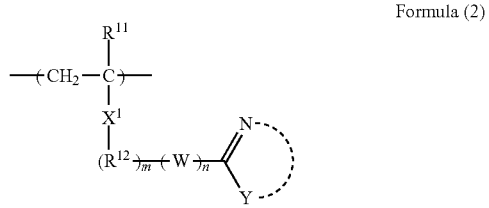

Formula (2)

wherein, in formula (2), $R^{11}$ represents a hydrogen atom, or a substituted or unsubstituted alkyl group; $R^{12}$ represents a substituted or unsubstituted alkylene group; $X^1$ represents —CO—, —C(=O)O—, —CONH—, —OC(=O)—, or a phenylene group; W represents —O—, —S—, —C(=O)O—, —CONH—, —C(=O)S—, —NHCONH—, —NHC(=O)O—, —NHC(=O)S—, —OC(=O)—, —OCONH— or —NHCO—; Y represents —NR$^{13}$—, —O—, —S— or —N=, and Y is connected to an N atom through an atomic group adjacent thereto to form a cyclic structure; $R^{13}$ represents a hydrogen atom, an alkyl group, or an aryl group; and m and n each independently represents 0 or 1,

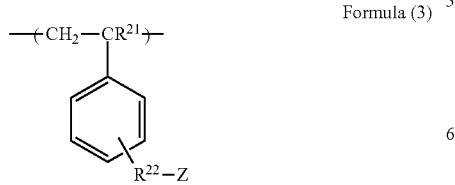

Formula (3)

wherein, in formula (3), $R^{21}$ represents a hydrogen atom or a methyl group; $R^{22}$ represents a substituted or unsubstituted alkylene group; and Z represents a structure represented by the following formula (4) or (5):

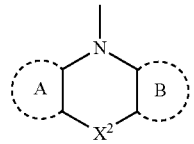

Formula (4)

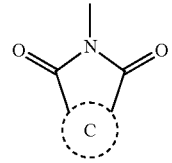

Formula (5)

wherein, in Formula (4), $X^2$ is any one selected from the group consisting of a single bond, an alkylene group, —O—, —S—, —NR—, and —C(=O)—; R represents a hydrogen atom or an alkyl group, ring A and ring B each independently represents an aromatic ring, and wherein, in Formula (5), ring C represents an aromatic ring.

8. A method of producing a color filter, the method comprising:

preparing a curable composition using a pigment-dispersed composition containing at least (i) a resin including, as copolymer components, a structural unit having a pendant group containing a nitrogen-containing heterocyclic ring, and a structural unit represented by Formula (6) having a pendant group containing an ethylenic unsaturated double bond, (ii) a pigment, and (iii) a solvent;

applying the curable composition on a support to form a colored layer formed from the curable composition;

patternwise exposing the colored layer through a mask; and developing the colored layer after exposure to form a colored pattern, wherein Formula (6) is as follows:

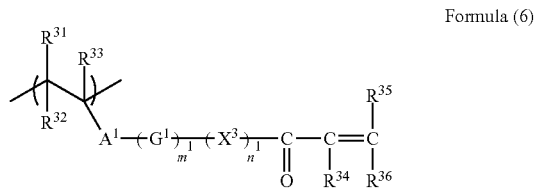

Formula (6)

wherein, in Formula (6), $A^1$ represents —CO—, —C(=O)O—, —CONH—, —OC(=O)— or a phenylene group; $G^1$ represents a divalent organic group; $X^3$ represents an oxygen atom, a sulfur atom or —N(R$^{52}$)—; $R^{52}$ represents an alkyl group which may be substituted; $m^1$ and $n^1$ each independently represents 0 or 1; and $R^{31}$ to $R^{36}$ each independently represents a hydrogen atom or a monovalent substituent;

wherein the resin includes a structural unit represented by the following Formula (1) as a structural unit having a pendant group containing a nitrogen-containing heterocyclic ring:

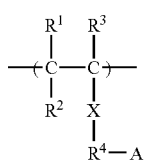

Formula (1)

wherein, in Formula (1), $R^1$ and $R^2$ each independently represents a hydrogen atom or a monovalent organic group; $R^3$ represents a hydrogen atom, a hydrocarbon group having 1 to 6 carbon atoms, —COOH, —CN, —CF$_3$—CH$_2$OH, —CH$_2$COOH, —CH$_2$COOR$^a$ or —COOR$^b$, wherein R$^a$ and R$^b$ each independently represents a hydrocarbon group having 1 to 6 carbon atoms; X represents —O—, —CO—, —COO—, OCO—, —CONH—, —NHCO— or phenylene; $R^4$ represents a divalent organic group or a single bond; and A represents a nitrogen-containing heterocyclic ring.

9. The method of producing a color filter of claim 8, wherein X represents —O—, —CO—, —COO—, OCO—, —CONH—, or —NHCO—.

10. The method of producing a color filter according to claim 8, wherein the structural unit represented by Formula (1) is a structural unit represented by the following Formula (2) or a structural unit represented by the following Formula (3):

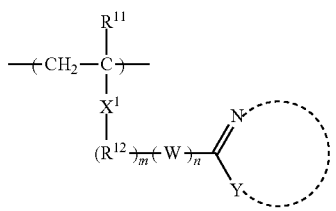

Formula (2)

wherein, in formula (2), $R^{11}$ represents a hydrogen atom, or a substituted or unsubstituted alkyl group; $R^{12}$ represents a substituted or unsubstituted alkylene group; $X^1$ represents —CO—, —C(=O)O—, —CONH—, —OC(=O)—, or a phenylene group; W represents —O—, —S—, —C(=O)O—, —CONH—, —C(=O)S—, —NHCONH—, —NHC(=O)O—, —NHC(=O)S—, —OC(=O)—, —OCONH— or —NHCO—; Y represents —NR$^{13}$—, —O—, —S— or —N=, and Y is connected to an N atom through an atomic group adjacent thereto to form a cyclic structure; $R^{13}$ represents a hydrogen atom, an alkyl group, or an aryl group; and m and n each independently represents 0 or 1,

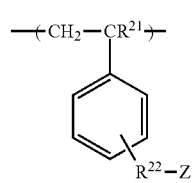

Formula (3)

wherein, in formula (3), $R^{21}$ represents a hydrogen atom or a methyl group; $R^{22}$ represents a substituted or unsubstituted alkylene group; and Z represents a structure represented by the following formula (4) or (5):

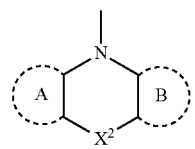

Formula (4)

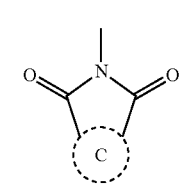

Formula (5)

wherein, in Formula (4), $X^2$ is any one selected from the group consisting of a single bond, an alkylene group, —O—, —S—, —NR—, and —C(=O)—; R represents a hydrogen atom or an alkyl group, ring A and ring B each independently represents an aromatic ring, and wherein, in Formula (5), ring C represents an aromatic ring.

* * * * *